US012745563B2

(12) United States Patent
Shimatani et al.

(10) Patent No.: US 12,745,563 B2
(45) Date of Patent: Sep. 22, 2026

(54) ELECTROMAGNETIC WAVE DETECTOR, ELECTROMAGNETIC WAVE DETECTOR ARRAY, AND IMAGE SENSOR

(71) Applicant: Mitsubishi Electric Corporation, Tokyo (JP)

(72) Inventors: Masaaki Shimatani, Tokyo (JP); Shoichiro Fukushima, Tokyo (JP); Shimpei Ogawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 179 days.

(21) Appl. No.: 18/845,462

(22) PCT Filed: Jan. 12, 2023

(86) PCT No.: PCT/JP2023/000638
§ 371 (c)(1),
(2) Date: Sep. 10, 2024

(87) PCT Pub. No.: WO2023/181593
PCT Pub. Date: Sep. 28, 2023

(65) Prior Publication Data

US 2025/0185515 A1 Jun. 5, 2025

(30) Foreign Application Priority Data

Mar. 25, 2022 (JP) ................................ 2022-049678

(51) Int. Cl.
*H10N 15/10* (2023.01)

(52) U.S. Cl.
CPC .................................. *H10N 15/15* (2023.02)

(58) Field of Classification Search
CPC ........ H10N 15/15; H10N 10/13; H10N 10/17; H10N 15/10
USPC ........................................................ 310/306
See application file for complete search history.

(56) References Cited

U.S. PATENT DOCUMENTS

2019/0214513 A1* 7/2019 Nakamura ........... H10K 30/451
2020/0052146 A1 2/2020 Ogawa et al.
2020/0395499 A1* 12/2020 Ogawa .................... H10F 30/28

FOREIGN PATENT DOCUMENTS

JP 2021168332 A * 10/2021
WO 2018/012076 A1 1/2018
WO WO-2021256016 A1 * 12/2021 ............ H10F 30/28

OTHER PUBLICATIONS

International Search Report and Written Opinion mailed on Feb. 28, 2023, received for PCT Application PCT/JP2023/000638, filed on Jan. 12, 2023, 8 pages including English Translation.

* cited by examiner

*Primary Examiner* — Jose A Gonzalez Quinones
(74) *Attorney, Agent, or Firm* — XSENSUS LLP

(57) ABSTRACT

An electromagnetic wave detector includes a first ferroelectric layer, a two-dimensional material layer, a first electrode pair, and a second electrode pair. The first electrode pair includes a first electrode and a second electrode. The second electrode pair includes a third electrode and a fourth electrode. The first electrode pair and the second electrode pair are electrically connected to the two-dimensional material layer. The third electrode and the fourth electrode are disposed to face each other in a first direction perpendicular to a polarization direction of spontaneous polarization of the first ferroelectric layer. The first electrode and the second electrode are disposed to face each other in a second direction different from the first direction.

33 Claims, 22 Drawing Sheets

40
(42)
33
(34)
$V_{d2}$
$I_{d2}$
113
40
(44)
2b
(25)
1
12
11
XXIII
XXIII
$V_{d1}$
$I_{d1}$
40
(41)
30
(31)
3
y
z
x
2a
(21)
2b
(26)
2a
(22)

ELECTROMAGNETIC WAVE DETECTOR, ELECTROMAGNETIC WAVE DETECTOR ARRAY, AND IMAGE SENSOR

CROSS-REFERENCE TO RELATED APPLICATIONS

This application is a national stage application, pursuant to 35 U.S.C. § 371, of International Patent Application No. PCT/JP2023/000638, filed Jan. 12, 2023, which claims priority from Japanese Patent Application No. 2022-049678, filed Mar. 25, 2022, the entire contents of each are incorporated herein by reference.

TECHNICAL FIELD

The present disclosure relates to an electromagnetic wave detector, an electromagnetic wave detector array, and an image sensor.

BACKGROUND ART

As a material of an electromagnetic wave detection layer used for a next-generation electromagnetic wave detector, graphene, which is an example of a two-dimensional material layer, is known. Graphene has extremely high mobility. Absorptivity of graphene is as low as 2.3%. Therefore, a method for increasing sensitivity in an electromagnetic wave detector using graphene as a two-dimensional material layer has been proposed.

For example, International Publication No. 2018/012076 (PTL 1) discloses an electromagnetic wave detector including a source electrode, a drain electrode, a graphene layer, and a ferroelectric layer. In the electromagnetic wave detector of PTL 1, the ferroelectric layer is disposed below or above the graphene layer connected between the source electrode and the drain electrode. In the electromagnetic wave detector, when an electromagnetic wave enters, in particular, when an electromagnetic wave in an infrared wavelength range enters, the ferroelectric layer exhibits a pyroelectric effect. This pyroelectric effect modulates a gate voltage of the graphene layer. Since the graphene layer has an atomic layer thickness and high charge mobility, a huge current response change can be obtained by a slight gate voltage change. Such an effect is called an optical gate effect. By this optical gate effect, high sensitivity can be realized.

CITATION LIST

Patent Literature

PTL 1: International Publication No. 2018/012076

SUMMARY OF INVENTION

Technical Problem

However, in the electromagnetic wave detector of PTL 1, it is difficult to perform OFF operation on the electromagnetic wave detector. The present disclosure has been made in view of the above problem, and an object thereof is to provide an electromagnetic wave detector, an electromagnetic wave detector array, and an image sensor having higher detection sensitivity and improved OFF operation.

Solution to Problem

An electromagnetic wave detector according to the present disclosure includes a first ferroelectric layer, a two-dimensional material layer, a first electrode pair, and a second electrode pair. The first ferroelectric layer includes a first main surface and has spontaneous polarization. The two-dimensional material layer is disposed on the first main surface of the first ferroelectric layer. The first electrode pair includes a first electrode and a second electrode. The second electrode pair includes a third electrode and a fourth electrode. The first electrode pair is electrically connected to the two-dimensional material layer. The second electrode pair is electrically connected to the two-dimensional material layer. In a plan view of the first main surface, the third electrode and the fourth electrode are disposed to face each other in a first direction perpendicular to a first polarization direction of the spontaneous polarization of the first ferroelectric layer. In the plan view of the first main surface, the first electrode and the second electrode are disposed to face each other in a second direction different from the first direction.

An electromagnetic wave detector array according to the present disclosure includes a plurality of the electromagnetic wave detectors of the present disclosure. The plurality of electromagnetic wave detectors are disposed side by side along at least any of a third direction and a fourth direction different from the third direction. An image sensor according to the present disclosure includes the electromagnetic wave detector array of the present disclosure and a readout circuit connected to the electromagnetic wave detector array of the present disclosure.

Advantageous Effects of Invention

According to an electromagnetic wave detector of the present disclosure, it is possible to provide an electromagnetic wave detector, an electromagnetic wave detector array, and an image sensor having higher detection sensitivity and improved OFF operation.

BRIEF DESCRIPTION OF DRAWINGS

FIG. 1 is a schematic plan view of an electromagnetic wave detector according to a first embodiment.

FIG. 2 is a schematic cross-sectional view of the electromagnetic wave detector according to the first embodiment taken along a sectional line II-II shown in FIG. 1.

FIG. 5 is a schematic cross-sectional view showing an electromagnetic wave detector according to a second modification of the first embodiment.

FIG. 6B is a schematic plan view showing an electromagnetic wave detector according to a fourth modification of the first embodiment.

FIG. 9 is a schematic cross-sectional view of the electromagnetic wave detector according to the third embodiment.

FIG. 10 is a schematic cross-sectional view of an electromagnetic wave detector according to a fourth embodiment.

FIG. 15 is a schematic cross-sectional view of an electromagnetic wave detector according to a seventh embodiment.

FIG. 18 is a schematic cross-sectional view of the electromagnetic wave detector according to the eighth embodiment taken along a sectional line XVIII-XVIII shown in FIG. 16.

DESCRIPTION OF EMBODIMENTS

Figure 3:
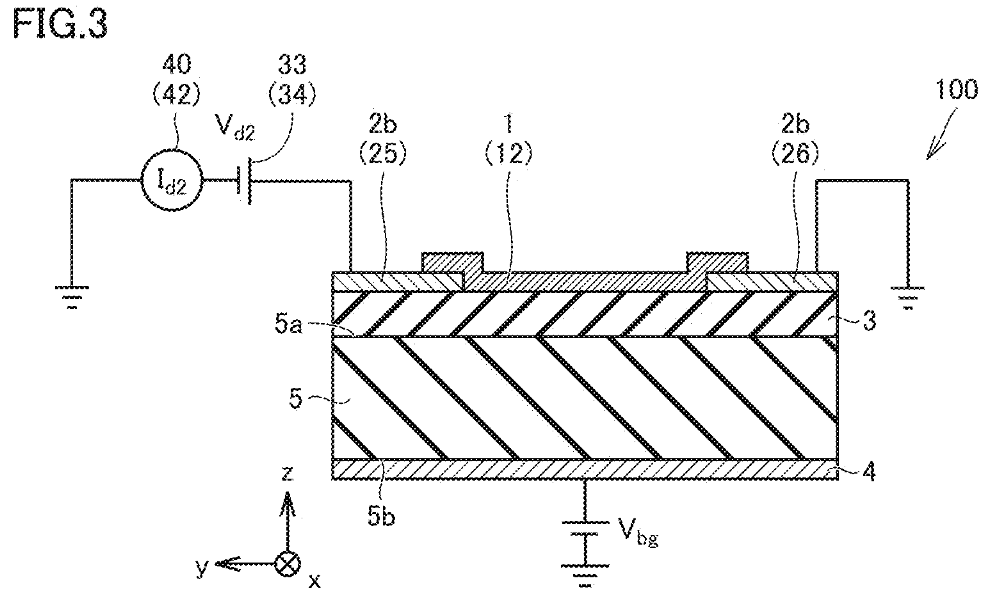
FIG. 3 is a schematic cross-sectional view of the electromagnetic wave detector according to the first embodiment taken along a sectional line III-III shown in FIG. 1.

Hereinafter, embodiments will be described with reference to the drawings. In the following description, the same or corresponding parts are denoted by the same reference numerals, and redundant description will not be repeated.

In the embodiments described below, the drawings are schematic and conceptually describe functions or structures. Further, the present disclosure is not limited by the embodiments described below. Unless otherwise specified, a basic configuration of an electromagnetic wave detector is common to all the embodiments. In addition, those denoted by the same reference numerals are the same or equivalent, as described above. This is common in the entire specification.

In the embodiments described below, a configuration of an electromagnetic wave detector in a case of detecting visible light or infrared light will be described, but light detected by the electromagnetic wave detector of the present disclosure is not limited to visible light and infrared light. The embodiments described below are also effective as a detector that detects radio waves such as X-rays, ultraviolet light, near-infrared light, terahertz (THz) waves, and microwaves, in addition to visible light and infrared light. In the embodiments of the present disclosure, these light and radio waves are collectively referred to as electromagnetic waves.

In the present embodiment, terms p-type graphene and n-type graphene may be used as graphene. In the following embodiments, graphene having more holes than graphene in an intrinsic state is called p-type graphene, and graphene having more electrons than graphene in an intrinsic state is called n-type graphene. That is, an n-type material is a material having an electron-donating property. Further, a p-type material is a material having an electron-withdrawing property.

Further, a material in which electrons are dominant when imbalance in charges is observed in a whole molecule may be referred to as n type. A material in which holes are dominant when imbalance in charges is observed in the whole molecule may be referred to as p type. One of an organic substance and an inorganic substance, or a mixture of the organic substance and the inorganic substance may be used as a material of a member in contact with the graphene, which is an exemplary two-dimensional material layer.

Further, a plasmon resonance phenomenon such as a surface plasmon resonance phenomenon, which is an interaction between a metal surface and light, a phenomenon called pseudo surface plasmon resonance, which means resonance for a metal surface in a range other than a visible light range and a near-infrared light range, and a phenomenon called metamaterial or plasmonic metamaterial, which means manipulation of a wavelength by a structure having a size less than or equal to a wavelength will not be particularly distinguished from one another by the names and will be handled in an equivalent manner in terms of effects exerted by the phenomena. Here, each of these resonances will be referred to as surface plasmon resonance, plasmon resonance, or, simply, resonance.

In each of the embodiments described below, the graphene is mainly described as an exemplary material of the two-dimensional material layer; however, the material of the two-dimensional material layer is not limited to the graphene. For example, as the material of the two-dimensional material layer, each of the following materials can be applied: multilayer graphene, turbostratic multilayer graphene, transition metal dichalcogenide (TMD), black phosphorus, silicene (two-dimensional honeycomb structure by silicon atoms), germanene (two-dimensional honeycomb structure by germanium atoms), and the like. Examples of the transition metal dichalcogenide include transition metal dichalcogenide such as molybdenum disulfide ($MoS_2$), tungsten disulfide ($WS_2$), and tungsten diselenide ($WSe_2$).

More preferably, the two-dimensional material layer contains any material selected from a group consisting of graphene, multilayer graphene, turbostratic multilayer graphene, transition metal dichalcogenide (TMD), black phosphorus, silicene (two-dimensional honeycomb structure with silicon atoms), graphene nanoribbon, and borophene. These materials have a structure similar to that of graphene. In each of these materials, atoms are arranged in a form of a single layer in a two-dimensional plane. Therefore, also when each of these materials is applied to the two-dimensional material layer, the same functions and effects as those when the graphene is applied to the two-dimensional material layer can be obtained.

In addition, in the present embodiment, what is described as an insulating layer is a layer of an insulator having a thickness that does not generate a tunnel current.

First Embodiment

<Configuration of Electromagnetic Wave Detector 100>

Figures 1, 2:
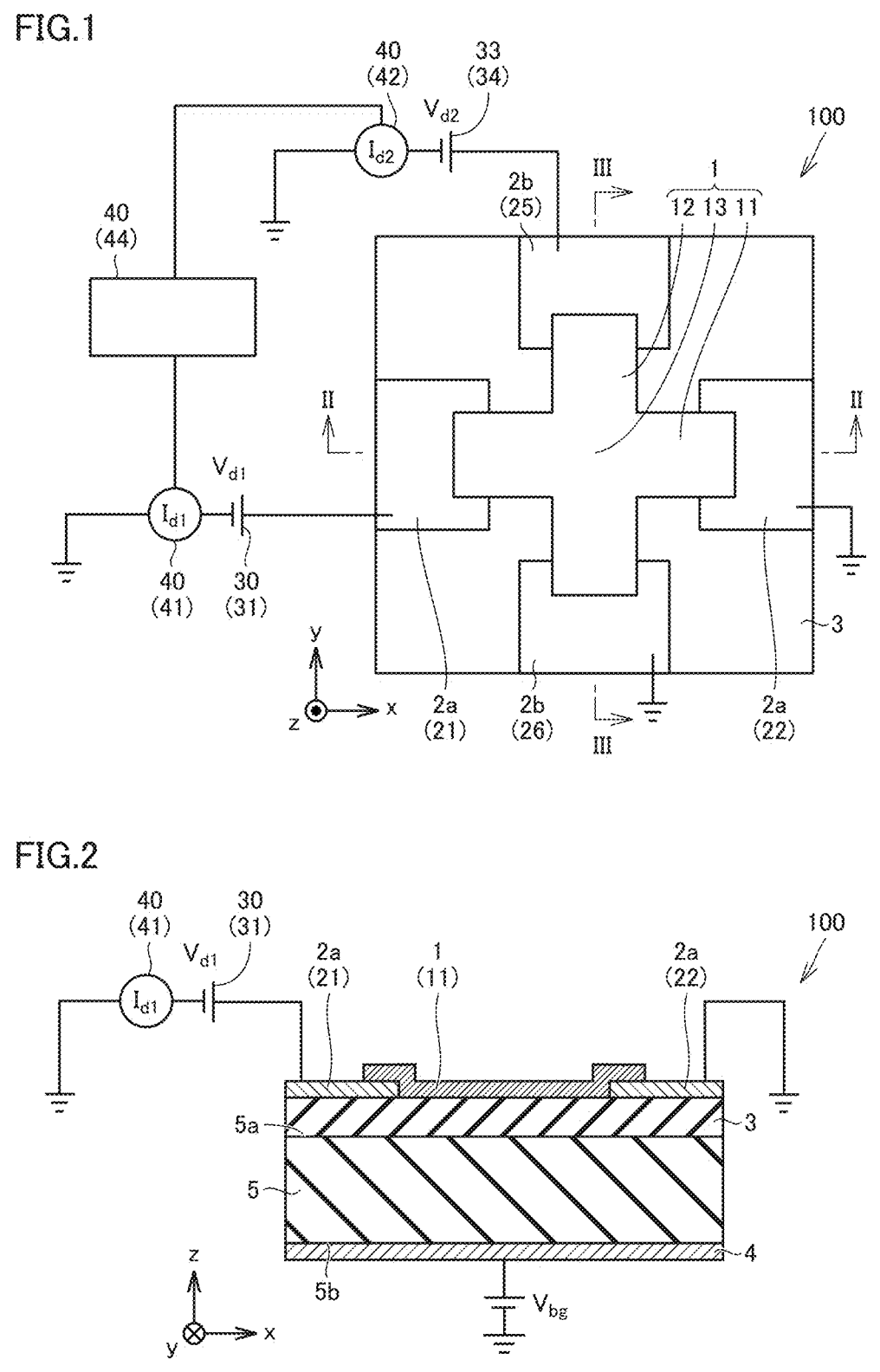

With reference to FIGS. 1 to 3, an electromagnetic wave detector 100 according to a first embodiment will be described. Electromagnetic wave detector 100 includes a first ferroelectric layer 5, a two-dimensional material layer 1, a first electrode pair 2*a*, a second electrode pair 2*b*, a first insulating film 3, a back electrode 4, a first operation circuit 30, a second operation circuit 33, and a signal detection circuit 40.

First ferroelectric layer 5 includes a first main surface 5*a* and a second main surface 5*b* opposite to first main surface 5*a*. Each of first main surface 5*a* and second main surface 5*b* extends in an x direction and a y direction perpendicular to the x direction. A normal direction of first main surface 5*a* and a normal direction of second main surface 5*b* are in a z direction perpendicular to the x direction and the y direction. First ferroelectric layer 5 has the spontaneous polarization. A first polarization direction of the spontaneous polarization of first ferroelectric layer 5 is, for example, the +x direction.

First ferroelectric layer 5 has sensitivity for a wavelength (hereinafter, may be referred to as "detection wavelength") of an electromagnetic wave with which electromagnetic wave detector 100 is irradiated. When first ferroelectric layer 5 is irradiated with an electromagnetic wave having the detection wavelength, first ferroelectric layer 5 absorbs the electromagnetic wave and generates heat. Therefore, the spontaneous polarization of first ferroelectric layer 5 changes. That is, a pyroelectric effect is generated in first ferroelectric layer 5. In the present embodiment, the electromagnetic wave is emitted to electromagnetic wave detector 100 from above in FIGS. 2 and 3. In order to detect the electromagnetic wave by using electromagnetic wave detector 100, first ferroelectric layer 5 is only required to be irradiated with the electromagnetic wave, and an irradiation direction of the electromagnetic wave with respect to electromagnetic wave detector 100 is not particularly limited.

In the present embodiment, first ferroelectric layer 5 is disposed below two-dimensional material layer 1. Specifically, first ferroelectric layer 5 is disposed below first electrode pair 2*a*, second electrode pair 2*b*, and two-dimensional material layer 1. First ferroelectric layer 5 may be disposed on two-dimensional material layer 1, or may be disposed on first electrode pair 2*a* and second electrode pair 2*b*. First main surface 5*a* of first ferroelectric layer 5 is covered with first insulating film 3.

Two-dimensional material layer 1 is disposed on first main surface 5*a* of first ferroelectric layer 5. As shown in FIGS. 2 and 3, in the present embodiment, two-dimensional material layer 1 is disposed on first electrode pair 2*a* and second electrode pair 2*b*. Two-dimensional material layer 1 may be disposed below first electrode pair 2*a* and second electrode pair 2*b*. In a plan view of first main surface 5*a* of first ferroelectric layer 5, two-dimensional material layer 1 is preferably disposed so as to overlap with first ferroelectric layer 5. Therefore, an influence of the change in the spontaneous polarization of first ferroelectric layer 5 on two-dimensional material layer 1 can be increased.

Two-dimensional material layer 1 includes a first elongated portion 11 and a second elongated portion 12. A first longitudinal direction of first elongated portion 11 is different from a second longitudinal direction of second elongated portion 12. The first longitudinal direction of first elongated portion 11 is, for example, a direction (x direction) parallel to the first polarization direction (+x direction) of the spontaneous polarization of first ferroelectric layer 5. The second longitudinal direction of second elongated portion 12 is, for example, a first direction (y direction) perpendicular to the first polarization direction (+x direction) of the spontaneous polarization of first ferroelectric layer 5.

As shown in FIGS. 2 and 3, in the present embodiment, first elongated portion 11 is in the same layer as second elongated portion 12. First elongated portion 11 and second elongated portion 12 share a common portion 13. Common portion 13 is a central portion of first elongated portion 11, and a central portion of second elongated portion 12. As shown in FIG. 1, in the plan view of first main surface 5*a*, a part of first elongated portion 11 overlaps with a part of second elongated portion 12. In the present embodiment, in the plan view of first main surface 5*a*, the central portion of first elongated portion 11 overlaps with the central portion of second elongated portion 12. In the plan view of first main surface 5*a*, first elongated portion 11 intersects second elongated portion 12, and a shape of two-dimensional material layer 1 is a cross. The shape of two-dimensional material layer 1 in the plan view of first main surface 5*a* is not particularly limited, and any shape may be used as long as a difference is generated between a first electric signal generated from first electrode pair 2*a* and a second electric signal generated from second electrode pair 2*b* when electromagnetic wave detector 100 is irradiated with an electromagnetic wave (hereinafter, the state may be referred to as "bright state").

In the present embodiment, in the plan view of first main surface 5*a*, a shape of an end portion of two-dimensional material layer 1 is rectangular. The shape of the end portion of two-dimensional material layer 1 is not particularly limited, and may be a triangle or a comb shape.

In the plan view of first main surface 5*a*, a shape of first elongated portion 11 between a first electrode 21 and a second electrode 22 is preferably the same as a shape of second elongated portion 12 between a third electrode 25 and a fourth electrode 26. In a case where the shape of first elongated portion 11 between first electrode 21 and second electrode 22 is the same as the shape of second elongated portion 12 between third electrode 25 and fourth electrode 26, electrical resistance of first elongated portion 11 between first electrode 21 and second electrode 22 is the same as electrical resistance of second elongated portion 12 between third electrode 25 and fourth electrode 26. Therefore, when electromagnetic wave detector 100 is not irradiated with an electromagnetic wave (hereinafter, the state may be referred to as "dark state"), an output from signal detection circuit 40 can be made zero. Even in a case where the shape of first elongated portion 11 between first electrode 21 and second electrode 22 is different from the shape of second elongated portion 12 between third electrode 25 and fourth electrode 26, the output from signal detection circuit 40 can be made zero in the dark state by adjusting signal detection circuit 40.

Two-dimensional material layer 1 is formed of, for example, any material selected from a group consisting of graphene, multilayer graphene, turbostratic multilayer graphene, transition metal dichalcogenide, black phosphorus, silicene, graphene nanoribbon, and borophene. Two-dimensional material layer 1 may be formed of a two-dimensional material layer of a single monolayer.

First electrode pair **2*a* is electrically connected to two-dimensional material layer 1. Specifically, first electrode pair 2*a* is electrically connected to first elongated portion 11. First electrode pair 2*a* includes first electrode 21 and second electrode 22. In the plan view of first main surface 5*a*, first electrode 21 and second electrode 22 are disposed to face each other in a second direction different from the first direction (y direction) perpendicular to the first polarization direction (+x direction) of the spontaneous polarization of first ferroelectric layer 5. Therefore, when electromagnetic wave detector 100 is irradiated with an electromagnetic wave, electric resistance of two-dimensional material layer 1 between first electrode 21 and second electrode 22 changes due to the change in the spontaneous polarization of first ferroelectric layer 5**.

The second direction is preferably parallel to the first polarization direction (+x direction) of the spontaneous polarization of first ferroelectric layer 5, and first electrode 21 and second electrode 22 are preferably disposed to face each other in the first polarization direction (+x direction) of the spontaneous polarization of first ferroelectric layer 5 in the plan view of first main surface **5*a*. Therefore, the change in the electric resistance of two-dimensional material layer 1 between first electrode 21 and second electrode 22** is maximized.

Second electrode pair **2*b* is electrically connected to two-dimensional material layer 1. Specifically, second electrode pair 2*b* is electrically connected to second elongated portion 12. Second electrode pair 2*b* includes third electrode 25 and fourth electrode 26. In the plan view of first main surface 5*a*, third electrode 25 and fourth electrode 26 are disposed to face each other in the first direction (y direction) perpendicular to the first polarization direction of the spontaneous polarization of first ferroelectric layer 5. Therefore, the second electric signal output from second electrode pair 2*b* is not affected by the change in the spontaneous polarization of first ferroelectric layer 5 generated in the bright state. The electrical resistance of two-dimensional material layer 1 between third electrode 25 and fourth electrode 26 in the bright state does not change from the electrical resistance of two-dimensional material layer 1 between third electrode 25 and fourth electrode 26 in the dark state. The second electric signal output from second electrode pair 2*b*** does not change between the dark state and the bright state.

On the other hand, as described above, first electrode 21 and second electrode 22 are disposed to face each other in a second direction different from the first direction (y direction) perpendicular to the first polarization direction (+x direction) of the spontaneous polarization of first ferroelectric layer 5. Therefore, the first electric signal output from first electrode pair **2*a* is affected by the change in the spontaneous polarization of first ferroelectric layer 5 generated in the bright state. The electrical resistance of two-dimensional material layer 1 between first electrode 21 and second electrode 22 in the bright state changes from the electrical resistance of two-dimensional material layer 1 between first electrode 21 and second electrode 22 in the dark state. The first electric signal output from first electrode pair 2*a*** changes between the dark state and the bright state.

The electrical resistance of two-dimensional material layer 1 between first electrode 21 and second electrode 22 in the dark state is made equal to the electrical resistance of two-dimensional material layer 1 between third electrode 25 and fourth electrode 26 in the dark state. Signal detection circuit 40 outputs a differential signal between the first electric signal output from first electrode pair **2*a* and the second electric signal output from second electrode pair 2*b*. In this way, a signal output from signal detection circuit 40** in the dark state becomes zero.

On the other hand, in the bright state, the electrical resistance of two-dimensional material layer 1 between first electrode 21 and second electrode 22 changes, but the electrical resistance of two-dimensional material layer 1 between third electrode 25 and fourth electrode 26 in the dark state does not change. Signal detection circuit 40 outputs a differential signal between the first electric signal output from first electrode pair **2*a* and the second electric signal output from second electrode pair 2*b*. Therefore, an influence of a dark current can be removed from a signal output from signal detection circuit 40 in the bright state. OFF operation of electromagnetic wave detector 100** is improved.

First insulating film 3 is formed on first main surface **5*a* of first ferroelectric layer 5. First insulating film 3 is disposed between first ferroelectric layer 5 and two-dimensional material layer 1. First insulating film 3 absorbs an electromagnetic wave entering electromagnetic wave detector 100, and generates heat. Therefore, first insulating film 3 can enhance the change in the spontaneous polarization of first ferroelectric layer 5** in the bright state.

Back electrode 4 is formed on second main surface **5*b* of first ferroelectric layer 5. By applying a back gate voltage $V_{bg}$ to two-dimensional material layer 1 through back electrode 4, back gate voltage $V_{bg}$ can be efficiently applied to two-dimensional material layer 1. When electromagnetic wave detector 100 includes back electrode 4, the electromagnetic wave is preferably emitted on electromagnetic wave detector 100 from above in FIGS. 2 and 3**.

First operation circuit 30 is connected to first electrode pair **2*a*. First operation circuit 30 includes, for example, a first voltage source 31 that applies a bias voltage $V_{d1}$ between first electrode 21 and second electrode 22. First voltage source 31 applies bias voltage $V_{d1}$ to first elongated portion 11 of two-dimensional material layer 1**.

Second operation circuit 33 is connected to second electrode pair **2*b*. Second operation circuit 33 includes, for example, a second voltage source 34 that applies a bias voltage $V_{d2}$ between third electrode 25 and fourth electrode 26. Second voltage source 34 applies bias voltage $V_{d2}$ to second elongated portion 12 of two-dimensional material layer 1**.

Signal detection circuit 40 includes a first signal detector 41, a second signal detector 42, and a differentiator 44.

First signal detector 41 is connected to first electrode pair 2*a*. Specifically, first signal detector 41 is connected to one (in the present embodiment, first electrode 21) of first electrode 21 and second electrode 22 included in first electrode pair 2*a*. Another one of first electrode 21 and second electrode 22 (in the present embodiment, second electrode 22) is grounded, for example. First signal detector 41 is connected to first operation circuit 30. First signal detector 41 detects the first electric signal output from first electrode pair 2*a*. First signal detector 41 includes, for example, a first ammeter. The first ammeter detects a current $I_{d1}$ flowing through first elongated portion 11 between first electrode 21 and second electrode 22 when first operation circuit 30 applies bias voltage $V_{d1}$ between first electrode 21 and second electrode 22.

Second signal detector 42 is connected to second electrode pair 2*b*. Specifically, second signal detector 42 is connected to one (in the present embodiment, third electrode 25) of third electrode 25 and fourth electrode 26 included in second electrode pair 2*b*. Another one of third electrode 25 and fourth electrode 26 (in the present embodiment, fourth electrode 26) is grounded, for example. Second signal detector 42 is connected to second operation circuit 33. Second signal detector 42 detects the second electric signal output from second electrode pair 2*b*. Second signal detector 42 includes, for example, a second ammeter. The second ammeter detects a current $I_{d2}$ flowing through second elongated portion 12 between third electrode 25 and fourth electrode 26 when second operation circuit 33 applies bias voltage $V_{d2}$ between third electrode 25 and fourth electrode 26.

Differentiator 44 is connected to first signal detector 41 and second signal detector 42. Differentiator 44 outputs a differential signal between the first electric signal and the second electric signal. For example, the first electric signal is current $I_{d1}$ flowing through first elongated portion 11 between first electrode 21 and second electrode 22, the second electric signal is current $I_{d1}$ flowing through second elongated portion 12 between third electrode 25 and fourth electrode 26, and differentiator 44 outputs a differential signal between current $I_{d1}$ and current $I_{d2}$. Therefore, in the dark state, a signal output from signal detection circuit 40 can be made zero. An influence of a dark current can be removed from the signal output from signal detection circuit 40 in the bright state. OFF operation of electromagnetic wave detector 100 is improved.

Next, configurations of two-dimensional material layer 1, first electrode pair 2*a*, second electrode pair 2*b*, first insulating film 3, and first ferroelectric layer 5 will be described in detail.

<Configuration of Two-Dimensional Material Layer 1>

Two-dimensional material layer 1 is monolayer graphene, for example. The monolayer graphene is a single-atomic layer of a two-dimensional carbon crystal. Graphene has a plurality of carbon atoms located in each of a plurality of chains disposed in a hexagonal shape. Absorptivity of graphene is as low as 2.3%. Specifically, graphene has an absorptivity of 2.3% for white light. In the present embodiment, white light refers to light in which light beams having wavelengths of visible light are equally mixed. Two-dimensional material layer 1 may be multilayer graphene having a plurality of stacked graphene layers. The orientations of lattice vectors of hexagonal lattices of graphene in the multilayer graphene may or may not be matched. The orientations of lattice vectors of hexagonal lattices of graphene in the multilayer graphene may be completely matched. Two-dimensional material layer 1 may be graphene doped with a p type or n type impurity.

For example, a band gap is formed in two-dimensional material layer 1 when two or more graphene layers are stacked. That is, a size of the band gap can be adjusted by changing the number of stacked graphene layers. This can allow two-dimensional material layer 1 to have a wavelength selection effect of selecting an electromagnetic wave to be photoelectrically converted (detection wavelength). For example, an increased number of graphene layers in the multilayer graphene decreases the mobility of two-dimensional material layer 1. On the other hand, an increased number of graphene layers in the multilayer graphene suppresses the effect of carrier scattering from a base supporting the two-dimensional material layer, leading to reduced noise of electromagnetic wave detector 100. Therefore, when the multilayer graphene is used as two-dimensional material layer 1, absorption of the electromagnetic wave in two-dimensional material layer 1 increases, and the detection sensitivity of electromagnetic wave detector 100 for the electromagnetic wave is improved.

The multilayer graphene may also include a turbostratic structure portion. A method for producing the turbostratic structure portion may be appropriately determined. For example, monolayer graphene produced by a CVD method may be transferred multiple times to stack multilayer graphene, to thereby form the turbostratic structure portion. Alternatively, ethanol, methane, or the like may be disposed as a carbon source on graphene and the graphene may be grown by a CVD method, to thereby form the turbostratic structure portion.

More specifically, normal multilayer graphene that does not include the turbostratic structure portion is stacked in a state where lattices of a plurality of graphene layers are matched with each other. Such a stacked state of the plurality of graphene layers is called AB stacking.

On the other hand, multilayer graphene including the turbostratic structure portion is formed as follows. Graphene produced by the CVD method has a polycrystal. For this reason, in a case where graphene is further transferred onto graphene of a lower layer multiple times, or in a case where graphene is further stacked by the CVD method with the graphene of the lower layer as a core, a plurality of lattices of graphene are stacked in a state of being mismatched with each other. That is, the turbostratic structure portion is formed in the multilayer graphene. In the turbostratic structure portion, there is less interaction between adjacent graphene layers, and each graphene layer in the turbostratic structure portion has properties equivalent to those of the monolayer graphene. Then, when two-dimensional material layer 1 is affected by carrier scattering from the base, mobility of two-dimensional material layer 1 decreases. However, in the turbostratic structure portion, graphene in contact with the base is affected by carrier scattering, but graphene of an upper layer stacked on graphene in the turbostratic structure becomes less likely to be affected by carrier scattering from the base. In addition, graphene having the turbostratic structure has improved conductivity because there is less interaction between adjacent graphene layers. As described above, mobility of carriers is improved in graphene having the turbostratic structure, and electromagnetic wave detector 100 including graphene having the turbostratic structure has improved sensitivity for the electromagnetic wave.

In addition, nanoribbon-shaped graphene (graphene nanoribbon) may be used as two-dimensional material layer 1. Two-dimensional material layer 1 may have the graphene nanoribbon alone. Two-dimensional material layer 1 may have a structure in which a plurality of graphene nanoribbons are stacked. Two-dimensional material layer 1 may have a structure in which graphene nanoribbons are periodically arranged on a plane. When two-dimensional material layer 1 has a structure in which graphene nanoribbons are periodically arranged, plasmon resonance occurs in the graphene nanoribbons, leading to improved sensitivity of electromagnetic wave detector 100. The structure in which graphene nanoribbons are periodically arranged may be referred to as graphene metamaterial. In electromagnetic wave detector 100 using graphene metamaterial as two-dimensional material layer 1, plasmon resonance occurs, leading to improved sensitivity of electromagnetic wave detector 100.

An end portion of two-dimensional material layer 1 may be graphene nanoribbon. In this case, since graphene nanoribbon has a bandgap, a Schottky junction is formed in a junction region between the graphene nanoribbon and an electrode.

By two-dimensional material layer 1 coming into contact with first electrode pair 2*a*, carriers are doped into two-dimensional material layer 1 from first electrode pair 2*a*. For example, when two-dimensional material layer 1 is formed of graphene, and first electrode pair 2*a* is formed of gold (Au), the carrier is a hole. Due to a difference between a work function of graphene and a work function of gold (Au), a portion of two-dimensional material layer 1 in contact with first electrode pair 2*a* is doped with boles. When electromagnetic wave detector 100 is driven in an electron conduction state in a state where holes are doped in the relevant portion of two-dimensional material layer 1, mobility of electrons flowing through a channel is reduced due to the influence of the holes. This results in increased contact resistance between two-dimensional material layer 1 and first electrode pair 2*a*. In particular, when all regions of two-dimensional material layer 1 are formed of monolayer graphene, a large amount (doping amount) of carriers is injected into two-dimensional material layer 1 from first electrode pair 2*a*. This results in notable decrease in the mobility of electrons in electromagnetic wave detector 100. Therefore, when all regions of two-dimensional material layer 1 are formed of monolayer graphene, performance of electromagnetic wave detector 100 decreases.

In addition, an amount of carriers doped into the multilayer graphene from first electrode pair 2*a* is smaller than an amount of carriers doped into the monolayer graphene from first electrode pair 2*a*. Therefore, a junction between with first electrode pair 2*a*, which is easily doped with carriers, is formed of multilayer graphene, so that increase in contact resistance between two-dimensional material layer 1 and first electrode pair 2*a* can be suppressed. This can suppress the decrease in the mobility of electrons in electromagnetic wave detector 100, and performance of electromagnetic wave detector 100 can be improved.

<Configurations of First Electrode Pair 2*a* and Second Electrode Pair 2*b*>

First electrode pair 2*a* and second electrode pair 2*b* are formed of any conductive material. The material of first electrode pair 2*a* and second electrode pair 2*b* may include, for example, at least any of gold (Au), silver (Ag), copper (Cu), aluminum (Al), nickel (Ni), chromium (Cr), and palladium (Pd). An adhesion layer (not shown) may be provided between first electrode pair 2*a* and first insulating film 3 and between second electrode pair 2*b* and first insulating film 3. The adhesion layer enhances adhesion between first electrode pair 2*a* and first insulating film 3 and adhesion between second electrode pair 2*b* and first insulating film 3. A material of the adhesion layer includes a metallic material such as chromium (Cr) or titanium (Ti), for example.

<Configuration of First Insulating Film 3>

The material of first insulating film 3 is, for example, silicon oxide ($SiO_2$). The material of first insulating film 3 is not limited to silicon oxide, and may be, for example, tetraethyl orthosilicate ($Si(OC_2H_5)_4$), silicon nitride ($Si_3N_4$), hafnium oxide ($HfO_2$), aluminum oxide ($Al_2O_3$), nickel oxide (NiO), boron nitride (BN), or a siloxane-based polymeric material. For example, boron nitride (BN) has an atomic arrangement similar to graphene. Therefore, when boron nitride (BN) is in contact with two-dimensional material layer 1 formed of graphene, the decrease in electron mobility of two-dimensional material layer 1 is suppressed. Therefore, boron nitride (BN) is a material suitable for first insulating film 3 as a base film disposed below two-dimensional material layer 1.

The material of first insulating film 3 may be a Mott insulator such as $ReNiO_3$ (Re represents a rare earth element) or $TaS_2$. When the Mott insulator layer is irradiated with an electromagnetic wave, a phase transition occurs in the Mott insulator layer, and physical properties (for example, temperature) of the Mott insulator layer change. Therefore, the Mott insulator layer can enhance the change in the spontaneous polarization of first ferroelectric layer 5 at the time of irradiation with the electromagnetic wave.

A thickness of first insulating film 3 is not particularly limited as long as first electrode pair 2*a* and second electrode pair 2*b* are electrically insulated from first ferroelectric layer 5, and a tunnel current does not occur between first electrode pair 2*a* and first ferroelectric layer 5 and between second electrode pair 2*b* and first ferroelectric layer 5. The insulating layer may not be disposed below two-dimensional material layer 1.

<Configuration of First Ferroelectric Layer 5>

A material of first ferroelectric layer 5 may be any material as long as the material causes a change in the spontaneous polarization of first ferroelectric layer 5 when an electromagnetic wave having a detection wavelength enters first ferroelectric layer 5. The material of first ferroelectric layer 5 includes at least any of, for example, barium titanate ($BaTiO_3$), lithium niobate ($LiNbO_3$), lithium tantalate ($LiTaO_3$), strontium titanate ($SrTiO_3$), lead zirconate titanate (PZT), strontium bismuth tantalate (SBT), bismuth ferrite (BFO), zinc oxide (ZnO), hafnium oxide ($HfO_2$), and a polyvinylidene fluoride-based ferroelectric (PVDF, P(VDF-TrFE), P(VDF-TrFE-CTFE), and the like) which is an organic polymer. First ferroelectric layer 5 may be formed by laminating or mixing a plurality of different ferroelectric materials.

The material of first ferroelectric layer 5 is not limited to the above material as long as the material is a pyroelectric element exhibiting a pyroelectric effect. Specifically, the material of first ferroelectric layer 5 is only required to be a ferroelectric substance in which a change in the spontaneous polarization occurs in response to a change in thermal energy within first ferroelectric layer 5. In the pyroelectric effect, the electromagnetic wave simply acts as a heat source. Therefore, the pyroelectric effect basically has no wavelength dependency, and first ferroelectric layer 5 basically has no wavelength dependency. Therefore, first ferroelectric layer 5 has sensitivity for electromagnetic waves in wide bands.

The material of first ferroelectric layer 5 has the spontaneous polarization. When a temperature of first ferroelectric layer 5 increases due to irradiation with the electromagnetic wave, the spontaneous polarization of first ferroelectric layer 5 decreases. Therefore, an electric field applied from first ferroelectric layer 5 to two-dimensional material layer 1 decreases. A change in resistance occurs in two-dimensional material layer 1 due to the change in the spontaneous polarization of first ferroelectric layer 5. Therefore, electromagnetic wave detector 100 including two-dimensional material layer 1 and first ferroelectric layer 5 can detect the electromagnetic wave.

By configuring first ferroelectric layer 5 such that a rate of change in the spontaneous polarization in first ferroelectric layer 5 becomes as fast as possible, a response speed of electromagnetic wave detector 100 can be improved. Specifically, a thickness of first ferroelectric layer 5 is desirably as thin as possible within a range in which two-dimensional material layer 1 can be affected by the change in the spontaneous polarization of first ferroelectric layer 5 due to irradiation with the electromagnetic wave. Specifically, first ferroelectric layer 5 is desirably a ferroelectric thin film having a thickness of less than or equal to 10 μm.

A thickness of first ferroelectric layer 5 is desirably a thickness capable of giving a largest change in electric resistance to two-dimensional material layer 1, due to the change in the spontaneous polarization of first ferroelectric layer 5 when first ferroelectric layer 5 is irradiated with the electromagnetic wave.

A protective film (not shown) may be provided on first ferroelectric layer 5. The protective film may be provided so as to cover two-dimensional material layer 1, first electrode pair 2*a*, and second electrode pair 2*b*. Examples of a material of the protective film include an insulator such as an oxide or a nitride. Examples of a material of the protective film include silicon oxide ($SiO_2$), silicon nitride (SiN), hafnium oxide ($HfO_2$), aluminum oxide ($Al_2O_3$), and boron nitride (BN).

<Manufacturing Method for Electromagnetic Wave Detector 100>

An example of a manufacturing method for electromagnetic wave detector 100 of the present embodiment will be described.

An example of the manufacturing method for electromagnetic wave detector 100 of the present embodiment mainly includes a preparing step, a back electrode forming step, an insulating film forming step, an electrode forming step, and a two-dimensional material layer forming step.

First, the preparing step is performed. In the preparing step, a ferroelectric substrate is prepared as first ferroelectric layer 5. A material of the ferroelectric substrate is a material having sensitivity for a predetermined detection wavelength.

Subsequently, the back electrode forming step is performed. In the back electrode forming step, a protective film is formed on a front surface (excluding second main surface 5*b*) of first ferroelectric layer 5. The protective film is, for example, a resist. Back electrode 4 is formed on second main surface 5*b* of first ferroelectric layer 5 in a state where a surface of first ferroelectric layer 5 is protected by the protective film. Before back electrode 4 is formed, an adhesion layer (not shown) may be formed on second main surface 5*b* of first ferroelectric layer 5. The back electrode forming step may be performed after any step from the insulating film forming step to the two-dimensional material layer forming step, as long as the surface of first ferroelectric layer 5 is protected by the protective film. After back electrode 4 is formed, the protective film is removed from the surface of first ferroelectric layer 5.

Subsequently, the insulating film forming step is performed. In the insulating film forming step, first insulating film 3 is formed on first main surface 5*a* of first ferroelectric layer 5. A method for forming first insulating film 3 may be a chemical vapor deposition (CVD) method or a sputtering method. For example, first insulating film 3 may be formed by forming tetraethoxysilane or the like on first main surface 5*a* of first ferroelectric layer 5 by a plasma CVD method or the like.

Subsequently, the electrode forming step is performed. In the electrode forming step, first electrode pair 2*a* and second electrode pair 2*b* are formed on first insulating film 3. Before first electrode pair 2*a* and second electrode pair 2*b* are formed, an adhesion layer (not shown) may be formed in a region of first insulating film 3 where first electrode pair 2*a* and second electrode pair 2*b* are formed. The adhesion layer improves adhesion between first electrode pair 2*a* and first insulating film 3 and adhesion between second electrode pair 2*b* and first insulating film 3.

As a method for forming first electrode pair 2*a* and second electrode pair 2*b*, for example, the following process is used. First, a resist mask is formed on first insulating film 3. The resist mask is patterned by a photolithography method, an electron beam (EB) drawing method, or the like, and an opening is formed in a region of the resist mask where first electrode pair 2*a* and second electrode pair 2*b* are formed. Then, a conductive film such as a metal film to be first electrode pair 2*a* and second electrode pair 2*b* is formed on the resist mask by a vapor deposition method, a sputtering method, or the like. The conductive film is formed in the opening of the resist mask and on an upper surface of the resist mask. Thereafter, the resist mask is removed together with a part of the conductive film. The conductive film in the opening of the resist mask remains on first insulating film 3, and becomes first electrode pair 2*a* and second electrode pair 2*b* on first insulating film 3. The method for forming first electrode pair 2*a* and second electrode pair 2*b* described above is generally called a lift-off method.

As a method for forming first electrode pair 2*a* and second electrode pair 2*b*, another method may be used. For example, a conductive film such as a metal film to be first electrode pair 2*a* and second electrode pair 2*b* is formed on first insulating film 3. Then, a resist mask is formed on the conductive film. The resist mask is patterned by a photolithography method, an electron beam (EB) drawing method, or the like, and an opening of formed in the resist mask. The resist mask covers a region where first electrode pair 2*a* and second electrode pair 2*b* are formed, and the opening is formed in a region where first electrode pair 2*a* and second electrode pair 2*b* are not formed. Then, the conductive film is partially removed by wet etching or dry etching using the resist mask as an etching mask. The conductive film exposed from the resist mask is removed. The conductive film covered with the resist mask remains on first insulating film 3, to become first electrode pair 2*a* and second electrode pair 2*b*. Finally, the resist mask is removed. Thus, first electrode pair 2*a* and second electrode pair 2*b* may be formed.

Subsequently, the two-dimensional material layer forming step is performed. In the two-dimensional material layer forming step of the present embodiment, a two-dimensional material film is formed so that first electrode pair 2*a*, second electrode pair 2*b*, and first insulating film 3 are covered with two-dimensional material layer 1. A method for forming the two-dimensional material film is not particularly limited. The two-dimensional material film may be formed, for example, by epitaxial growth or by a screen printing method. In addition, the two-dimensional material film may be formed by transferring and attaching, to first insulating film 3, a two-dimensional material film formed in advance by a CVD method. The two-dimensional material film may be formed by transferring and attaching, to first insulating film 3, a film-shaped two-dimensional material film peeled off by mechanical peeling or the like.

Then, a resist mask is formed on the two-dimensional material film. The resist mask is patterned by a photolithography method, an electron beam (EB) drawing method, or the like. The resist mask covers a region of the two-dimensional material film where first electrode pair 2*a* and second electrode pair 2*b* are formed. A region of the two-dimensional material film where first electrode pair 2*a* and second electrode pair 2*b* are not formed is exposed from the resist mask. The two-dimensional material film is etched using the resist mask as an etching mask. The etching method of the two-dimensional material film is, for example, dry etching using oxygen plasma. Finally, the resist mask is removed. Thus, two-dimensional material layer 1 is formed.

Through the above steps, electromagnetic wave detector 100 of the present embodiment is manufactured.

In the example of the manufacturing method described above, two-dimensional material layer 1 is formed on first electrode pair 2*a* and second electrode pair 2*b*, but two-dimensional material layer 1 may be formed on first insulating film 3 or first ferroelectric layer 5, and then first electrode pair 2*a* and second electrode pair 2*b* may be formed on two-dimensional material layer 1. However, care must be taken to avoid damage to two-dimensional material layer 1 by the process of forming first electrode pair 2*a* and second electrode pair 2*b* during the formation of first electrode pair 2*a* and second electrode pair 2*b*. For example, after the region of two-dimensional material layer 1 where first electrode pair 2*a* and second electrode pair 2*b* are not formed is covered with the protective film, first electrode pair 2*a* and second electrode pair 2*b* are formed on two-dimensional material layer 1 exposed from the protective film. Thus, two-dimensional material layer 1 is prevented from being damaged by the process of forming first electrode pair 2*a* and second electrode pair 2*b*.

<Principle of Operation of Electromagnetic Wave Detector 100>

With reference to FIGS. 1 to 3, the principle of an operation of electromagnetic wave detector 100 of the present embodiment will be described.

In the dark state, first voltage source 31 included in first operation circuit 30 applies bias voltage $V_{d1}$ between first electrode 21 and second electrode 22. Second voltage source 34 included in second operation circuit 33 applies bias voltage $V_{d2}$ between third electrode 25 and fourth electrode 26. Current $I_{d1}$ flows through two-dimensional material layer 1 (first elongated portion 11) between first electrode 21 and second electrode 22. Current Laz flows through two-dimensional material layer 1 (second elongated portion 12) between third electrode 25 and fourth electrode 26. The first ammeter included in first signal detector 41 detects current $I_{d1}$ flowing through two-dimensional material layer 1 (first elongated portion 11) between first electrode 21 and second electrode 22. The second ammeter included in second signal detector 42 detects current La flowing through two-dimensional material layer 1 (second elongated portion 12) between third electrode 25 and fourth electrode 26. Bias voltage $V_{d1}$ and bias voltage $V_{d2}$ are adjusted such that current $I_{d1}$ and current $I_{d2}$ are equal to each other in the dark state.

Then, first ferroelectric layer 5 is irradiated with an electromagnetic wave. The pyroelectric effect of first ferroelectric layer 5 causes a change in the spontaneous polarization of first ferroelectric layer 5. The second direction in which first electrode 21 and second electrode 22 face each other is different from the first direction (y direction) perpendicular to the first polarization direction (+x direction) of the spontaneous polarization of first ferroelectric layer 5. Therefore, a change in the spontaneous polarization in first ferroelectric layer 5 generates a gradient of charge density in two-dimensional material layer 1 between first electrode 21 and second electrode 22, and gives an electric field change to two-dimensional material layer 1 between first electrode 21 and second electrode 22. Specifically, the change in the spontaneous polarization of first ferroelectric layer 5 occurs in the x direction, and a potential difference occurs between first electrode 21 and second electrode 22. As a result, two-dimensional material layer 1 is brought into a state in which a pn junction is formed in a pseudo manner, and the electrical resistance of two-dimensional material layer 1 between first electrode 21 and second electrode 22 changes. This is also referred to as optical gate effect. A change in electric resistance in two-dimensional material layer 1 between first electrode 21 and second electrode 22 causes a change in current La flowing through two-dimensional material layer 1 between first electrode 21 and second electrode 22. A current flowing through two-dimensional material layer 1 when first ferroelectric layer 5 is irradiated with an electromagnetic wave may be referred to as photocurrent.

On the other hand, the first direction in which third electrode 25 and fourth electrode 26 face each other is perpendicular to the first polarization direction (x direction) of the spontaneous polarization of first ferroelectric layer 5. Therefore, a polarization change of first ferroelectric layer 5 does not occur in the first direction. No potential difference occurs between third electrode 25 and fourth electrode 26, and no electric field change occurs in two-dimensional material layer 1 between third electrode 25 and fourth electrode 26. Current $I_{d2}$ flowing through two-dimensional material layer 1 between third electrode 25 and fourth electrode 26 does not change between the dark state and the bright state. That is, only current $I_{d1}$ changes at the time of electromagnetic wave irradiation. Therefore, by detecting a differential signal between current $I_{d1}$ and current $I_{d2}$ by using signal detection circuit 40, a dark current can be made zero, and the photocurrent can be extracted only at the time of electromagnetic wave irradiation. That is, the electromagnetic wave with which electromagnetic wave detector 100 is irradiated can be detected by detecting the differential signal between current $I_{d1}$ and current $I_{d2}$.

<Operation of Electromagnetic Wave Detector 100>

With reference to FIGS. 1 to 3, a specific operation of electromagnetic wave detector 100 of the present embodiment will be described. For example, a description is given to an operation of electromagnetic wave detector 100 in which graphene is used as two-dimensional material layer 1 and lithium niobate ($LiNbO_3$) is used as first ferroelectric layer 5.

As shown in FIG. 1, when a voltage is applied to first electrode pair 2*a* and second electrode pair 2*b*, a current flows through two-dimensional material layer 1.

When an electromagnetic wave having a detection wavelength enters first ferroelectric layer 5, a change in the spontaneous polarization occurs in first ferroelectric layer 5 due to a pyroelectric effect. Specifically, the spontaneous polarization changes in an orientation (+x direction) of the spontaneous polarization of first ferroelectric layer 5. Due to the change in the spontaneous polarization in first ferroelectric layer 5, a gradient of charge density occurs in two-dimensional material layer 1 between first electrode 21 and second electrode 22, and an electric field change occurs in two-dimensional material layer 1. As described above, graphene constituting two-dimensional material layer 1 has high mobility, and a large displacement current can be obtained for a slight electric field change. Therefore, a Fermi level of two-dimensional material layer 1 greatly changes due to the pyroelectric effect of first ferroelectric layer 5, and a pn junction is formed in a pseudo manner in a plane of two-dimensional material layer 1. As a result, a potential difference occurs between first electrode 21 and second electrode 22, and a current flows through two-dimensional material layer 1. As described above, in electromagnetic wave detector 100 according to the present embodiment, the generated current does not depend on quantum efficiency of a material to be absorbed. Therefore, the quantum efficiency of electromagnetic wave detector 100 exceeds 100%, and the sensitivity of electromagnetic wave detector 100 can be increased.

Further, when electromagnetic wave detector 100 is designed such that a rate of change in the spontaneous polarization of first ferroelectric layer 5 is as fast as possible, the time between the entry of the electromagnetic wave into electromagnetic wave detector 100 and the occurrence of the change in electric resistance in two-dimensional material layer 1 decreases. According to such an electromagnetic wave detector 100, delay of amplification due to the optical gate effect is eliminated, and high-speed response of electromagnetic wave detector 100 becomes possible.

(Modification)

Figure 4:
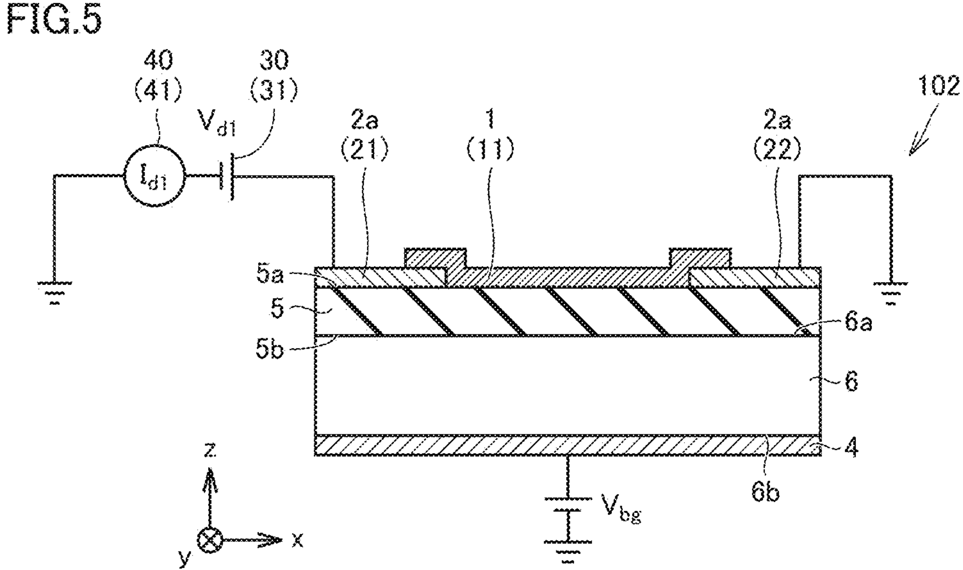
FIG. 4 is a schematic cross-sectional view showing an electromagnetic wave detector according to a first modification of the first embodiment.

As shown in FIG. 4, in an electromagnetic wave detector 101 according to a first modification of the present embodiment, first insulating film 3 is omitted, and first electrode pair 2*a* and second electrode pair 2*b* are formed on first ferroelectric layer 5.

In an electrode forming step in a manufacturing method for electromagnetic wave detector 101 of the first modification of the present embodiment, first electrode pair 2*a* and second electrode pair 2*b* are formed on first ferroelectric layer 5. Before first electrode pair 2*a* and second electrode pair 2*b* are formed, an adhesion layer (not shown) may be formed in a region of first main surface 5*a* of first ferroelectric layer 5 where first electrode pair 2*a* and second electrode pair 2*b* are formed. The adhesion layer improves adhesion between first electrode pair 2*a* and first ferroelectric layer 5 and adhesion between second electrode pair 2*b* and first ferroelectric layer 5.

As shown in FIG. 5, an electromagnetic wave detector 102 according to a second modification of the present embodiment is configured similarly to electromagnetic wave detector 101 according to the first modification of the present embodiment, but further includes a substrate 6. Substrate 6 is disposed between first ferroelectric layer 5 and back electrode 4. Substrate 6 includes a main surface 6*a* and a main surface 6*b* opposite to main surface 6*a*. First ferroelectric layer 5 is formed on main surface 6*a* of substrate 6. Second main surface 5*b* of first ferroelectric layer 5 faces main surface 6*a* of substrate 6. Back electrode 4 is formed on main surface 6*b*. In a case where substrate 6 is formed of a semiconductor material such as silicon, first operation circuit 30, second operation circuit 33, and signal detection circuit 40 may be formed on substrate 6.

In a preparing step in a manufacturing method for electromagnetic wave detector 102 of the second modification of the present embodiment, substrate 6 is prepared. In the manufacturing method for electromagnetic wave detector 102 of the second modification of the present embodiment, a ferroelectric layer forming step is performed following the preparing step. In the ferroelectric layer forming step, first ferroelectric layer 5 is formed on substrate 6. A method for forming first ferroelectric layer 5 is not particularly limited.

For example, when first ferroelectric layer 5 is formed of a ferroelectric polymer-based material, a ferroelectric polymer film is formed on main surface 6*a* of substrate 6 by a spin coating method or the like. Then, the ferroelectric polymer film is patterned by a photolithography method. In this way, first ferroelectric layer 5 is formed.

When a material of first ferroelectric layer 5 is a material different from the ferroelectric polymer-based material, first ferroelectric layer 5 is formed by sputtering, vapor deposition, a metal organic matter decomposition method (metal organic composition (MOD) coating method), an atomic layer deposition (ALD) method, or the like. Then, first ferroelectric layer 5 is patterned by a photolithography method. In this way, first ferroelectric layer 5 is formed. A lift-off method may be used for patterning first ferroelectric layer 5. In the lift-off method, a patterned resist mask is formed on main surface 6*a* of substrate 6. Then, first ferroelectric layer 5 is formed on the resist mask and main surface 6*a* of substrate 6 exposed from the resist mask. The resist mask is removed. In this way, first ferroelectric layer 5 is patterned.

First ferroelectric layer 5 may be formed by joining a ferroelectric substrate to substrate 6. For example, an oxide film such as $SiO_2$ is formed on substrate 6 and the ferroelectric substrate. The oxide film formed on substrate 6 and the oxide film formed on the ferroelectric substrate are made to face each other, and substrate 6 on which the oxide film is formed and the ferroelectric substrate on which the oxide film is formed are bonded to each other by thermocompression bonding or the like. First ferroelectric layer 5 including substrate 6 and the ferroelectric substrate joined to substrate 6 is obtained. After the ferroelectric substrate is joined to substrate 6, the ferroelectric substrate may be ground to thin the ferroelectric substrate, thereby obtaining first ferroelectric layer 5.

Figure 6A:
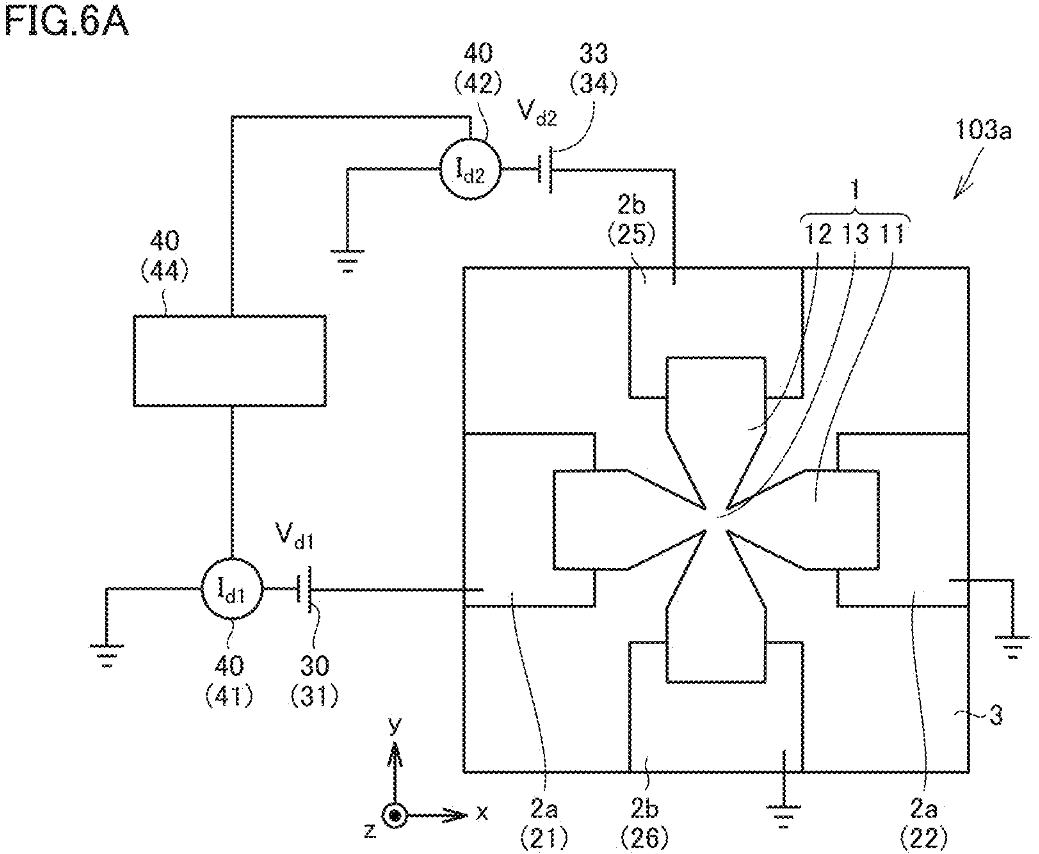
FIG. 6A is a schematic cross-sectional view showing an electromagnetic wave detector according to a third modification of the first embodiment.

As shown in FIG. 6A, in an electromagnetic wave detector 103*a* according to a third modification of the present embodiment, first elongated portion 11 has a shape tapered toward common portion 13 in the plan view of first main surface 5*a*. In the plan view of first main surface 5*a*, second elongated portion 12 has a shape tapered toward common portion 13. Therefore, current $I_{d1}$ flowing through first elongated portion 11 between first electrode 21 and second electrode 22 becomes less likely to flow into third electrode 25 and fourth electrode 26 in common portion 13. Current Jaz flowing through second elongated portion 12 between third electrode 25 and fourth electrode 26 becomes less likely to flow into first electrode 21 and second electrode 22 in common portion 13. In signal detection circuit 40, the differential signal between current $I_{d1}$ and current $I_{d2}$ can be detected more accurately and more easily. Thus, sensitivity of electromagnetic wave detector 103*a* is improved. OFF operation of electromagnetic wave detector 103*a* is further improved.

Figure 6B:
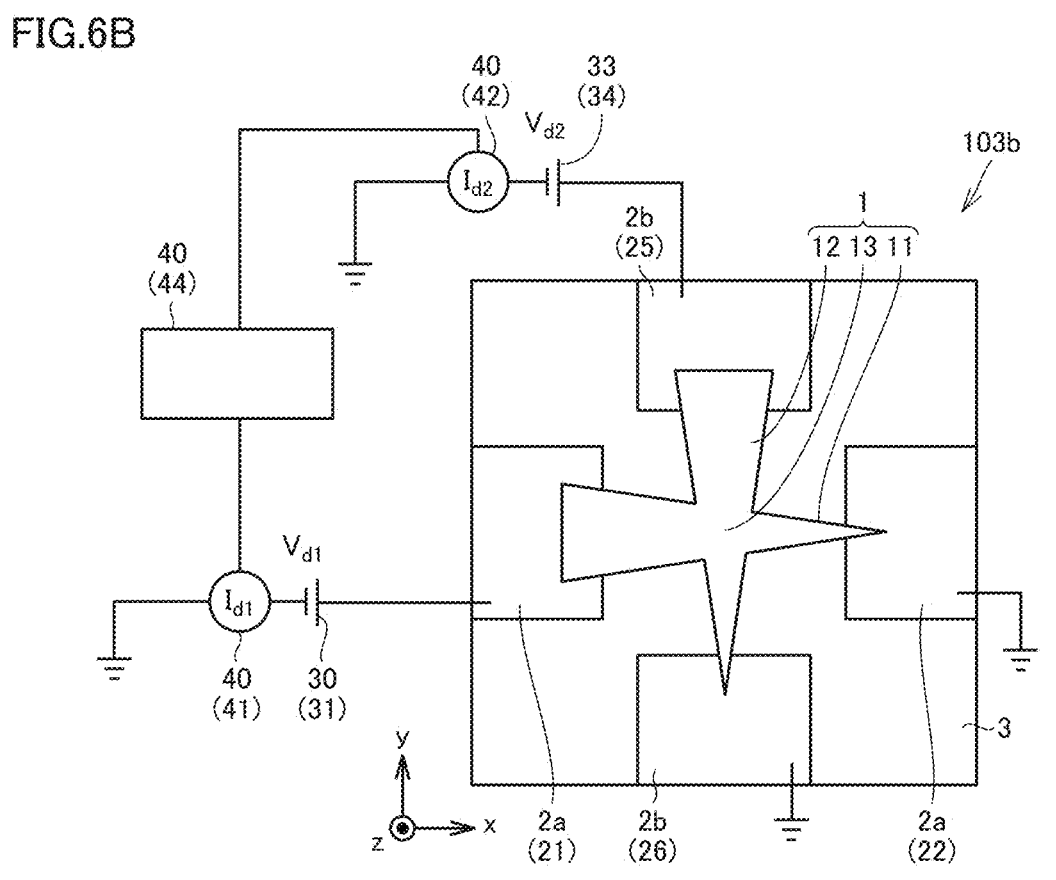

As shown in FIG. 6B, in an electromagnetic wave detector 103*b* according to a fourth modification of the present embodiment, first elongated portion 11 has a tapered shape that is tapered from first electrode 21 toward second electrode 22 in the plan view of first main surface 5*a*. Therefore, a contact area between first electrode 21 and first elongated portion 11 is different from a contact area between second electrode 22 and first elongated portion 11. Contact resistance between first electrode 21 and first elongated portion 11 is different from contact resistance between second electrode 22 and first elongated portion 11. In the second direction in which first electrode 21 and second electrode 22 face each other, a temperature gradient occurs in two-dimensional material layer 1. As a result, a temperature gradient occurs in first ferroelectric layer 5 in the second direction. When a photocurrent is generated at the time of irradiation with an electromagnetic wave, a polarization change of first ferroelectric layer 5 in the second direction is enhanced.

On the other hand, the first direction in which third electrode 25 and fourth electrode 26 face each other is perpendicular to the first polarization direction (+x direction) of the spontaneous polarization of first ferroelectric layer 5. A polarization change of first ferroelectric layer 5 does not occur in the first direction at the time of irradiation of the electromagnetic wave. Current La flowing through two-dimensional material layer 1 between third electrode 25 and fourth electrode 26 does not change between the time of irradiation with the electromagnetic wave (bright state) and the time of non-irradiation with the electromagnetic wave (dark state). Therefore, the differential signal between current $I_{d1}$ and current $I_{d2}$ increases. In signal detection circuit 40, the differential signal between current $I_{d1}$ and current $I_{d2}$ can be detected more accurately and more easily. Thus, sensitivity of electromagnetic wave detector 103*b* is improved. OFF operation of electromagnetic wave detector 103*b* is further improved.

Second elongated portion 12 preferably has the same shape as first elongated portion 11. For example, in the plan view of first main surface 5*a*, second elongated portion 12 has a tapered shape that is tapered from third electrode 25 toward fourth electrode 26. Therefore, current $I_{d2}$ at the time of non-irradiation of the electromagnetic wave is equal to current $I_{d2}$ at the time of non-irradiation of the electromagnetic wave. During non-irradiation (dark state) of the electromagnetic wave, a signal output from signal detection circuit 40 can be made zero. An influence of a dark current can be removed from the signal output from signal detection circuit 40 in the bright state. OFF operation of electromagnetic wave detector 100 is improved.

First elongated portion 11 is only required to cause the temperature gradient in two-dimensional material layer 1 in the second direction in which first electrode 21 and second electrode 22 face each other, and a shape of first elongated portion 11 is not limited to a triangle. For example, the temperature gradient may be generated in two-dimensional material layer 1 in the second direction by providing a hole in first elongated portion 11.

In a fifth modification of the present embodiment, first operation circuit 30 may include, for example, a first current source (not shown) that applies a bias current between first electrode 21 and second electrode 22. The first current source applies a bias current to first elongated portion 11 of two-dimensional material layer 1. Second operation circuit 33 may include, for example, a second current source (not shown) that applies a bias current between third electrode 25 and fourth electrode 26. The second current source applies a bias current to second elongated portion 12 of two-dimensional material layer 1. The first current source and the second current source are, for example, constant current sources. First signal detector 41 includes, for example, a first voltmeter. The first voltmeter detects a voltage generated in first electrode pair 2*a*, by first operation circuit 30 applying a bias current between first electrode 21 and second electrode 22. Second signal detector 42 includes, for example, a second voltmeter. The second voltmeter detects a voltage generated in second electrode pair 2*b*, by second operation circuit 33 applying a bias current between third electrode 25 and fourth electrode 26. Differentiator 44 outputs a differential signal between the voltage generated in first electrode pair 2*a* and the voltage generated in second electrode pair 2*b*.

In a sixth modification of the present embodiment, a configuration is similar to that of electromagnetic wave detector 100 of the present embodiment, but first operation circuit 30 and second operation circuit 33 may be omitted. Therefore, in electromagnetic wave detector 100, a change in a current flowing through two-dimensional material layer 1 between first electrode 21 and second electrode 22 occurs only at the time of electromagnetic wave irradiation. Therefore, the dark current can be made zero. Noise of electromagnetic wave detector 100 can be suppressed. However, in the sixth modification of the present embodiment, a current flowing through two-dimensional material layer 1 between first electrode 21 and second electrode 22 is smaller than a current flowing through two-dimensional material layer 1 between first electrode 21 and second electrode 22 in electromagnetic wave detector 100 of the present embodiment including first operation circuit 30 and second operation circuit 33. In the sixth modification of the present embodiment, the signal output from signal detection circuit 40 is smaller than that of electromagnetic wave detector 100 of the present embodiment.

In a seventh modification of the present embodiment, a configuration is similar to that of the fifth modification of the present embodiment, but first operation circuit 30 and second operation circuit 33 may be omitted. Therefore, in electromagnetic wave detector 100, a change in a voltage generated in first electrode pair 2*a* occurs only at the time of electromagnetic wave irradiation. Therefore, the dark current can be made zero. Noise of electromagnetic wave detector 100 can be suppressed. However, in the seventh modification of the present embodiment, a voltage generated in two-dimensional material layer 1 between first electrode 21 and second electrode 22 is smaller than a voltage generated in two-dimensional material layer 1 between first electrode 21 and second electrode 22 in the fifth modification of the present embodiment including first operation circuit 30 and second operation circuit 33. In the seventh modification of the present embodiment, the signal output from signal detection circuit 40 is smaller than that in the fifth modification of the present embodiment.

<Functions and Effects>

Functions and effects of the present embodiment will be described.

In electromagnetic wave detectors 100, 101, 102, 103*a*, and 103*b* according to the present embodiment, as shown in FIGS. 1 to 3, first electrode pair 2*a* and second electrode pair 2*b* are electrically connected to two-dimensional material layer 1 on first ferroelectric layer 5. Therefore, when the spontaneous polarization of first ferroelectric layer 5 changes due to the pyroelectric effect, the electrical resistance of two-dimensional material layer 1 between first electrode 21 and second electrode 22 may change. As a result, conductivity of two-dimensional material layer 1 is modulated by the optical gate effect described above, and the photocurrent can be amplified in two-dimensional material layer 1.

A current change amount in two-dimensional material layer 1 caused by the change in the spontaneous polarization of first ferroelectric layer 5 is larger than a current change amount in a normal semiconductor. In particular, in two-dimensional material layer 1, a large current change occurs for a slight potential change as compared with the normal semiconductor. For example, when monolayer graphene is used as two-dimensional material layer 1, a thickness of two-dimensional material layer 1 is equivalent to one atomic layer and is extremely thin. In addition, mobility of carriers (for example, electrons or holes) in the monolayer graphene is large. In this case, a current change amount in two-dimensional material layer 1 calculated from mobility of carriers in two-dimensional material layer 1, the thickness of two-dimensional material layer 1, and the like is about several hundred times to several thousand times a current change amount in the normal semiconductor.

Therefore, by utilizing the optical gate effect, extraction efficiency of a current from two-dimensional material layer 1 is greatly improved. Such an optical gate effect does not directly enhance quantum efficiency of a photoelectric conversion material as in the normal semiconductor, but increases a current change in two-dimensional material layer 1 due to electromagnetic wave irradiation. Therefore, the equivalent the quantum efficiency of electromagnetic wave detectors 100, 101, 102, 103*a*, and 103*b* calculated from a differential current due to electromagnetic wave irradiation can exceed 100%. Therefore, detection sensitivity of an electromagnetic wave by electromagnetic wave detectors 100, 101, 102, 103*a*, and 103*b* according to the present embodiment is higher than that of detection sensitivity of an electromagnetic wave by a conventional semiconductor electromagnetic wave detector and detection sensitivity of an electromagnetic wave by a graphene electromagnetic wave detector to which the optical gate effect is not applied.

In electromagnetic wave detectors 100, 101, 102, 103*a*, and 103*b* according to the present embodiment, current $I_{d1}$ and current $I_{d2}$ are made equal to each other in the dark state, and a difference between current $I_{d1}$ and current $I_{d2}$ is detected by signal detection circuit 40. Therefore, in electromagnetic wave detectors 100, 101, 102, 103*a*, and 103*b*, the dark current can be made zero, and the electric signal can be detected only at the time of electromagnetic wave irradiation. In an electromagnetic wave detector including graphene, since it is difficult to perform the OFF operation, the dark current increases, which causes noise. In the present embodiment, since the dark current can be made zero, noise can be reduced from a detection signal output from signal detection circuit 40 even if electromagnetic wave detectors 100, 101, 102, 103*a*, and 103*b* contain graphene.

Further, as two-dimensional material layer 1 (first elongated portion 11) between first electrode 21 and second electrode 22 and two-dimensional material layer 1 (second elongated portion 12) between third electrode 25 and fourth electrode 26, by using the same graphene layer, variations in electric resistance of two-dimensional material layer 1 depending on the quality of the graphene can be reduced. Even when different graphene layers are used between two-dimensional material layer 1 (first elongated portion 11) between first electrode 21 and second electrode 22 and two-dimensional material layer 1 (second elongated portion 12) between third electrode 25 and fourth electrode 26, damage to the graphene layer by the manufacturing process can be made the same between two-dimensional material layer 1 (first elongated portion 11) between first electrode 21 and second electrode 22 and two-dimensional material layer 1 (second elongated portion 12) between third electrode 25 and fourth electrode 26. Therefore, it is possible to reduce the signal output from signal detection circuit 40 in the dark state.

As described above, the quantum efficiency of electromagnetic wave detectors 100, 101, 102, 103*a*, and 103*b* according to the present embodiment exceeds 100%, and the sensitivity of electromagnetic wave detectors 100, 101, 102, 103*a*, and 103*b* for the electromagnetic wave can be improved. Furthermore, the OFF operation of electromagnetic wave detectors 100, 101, 102, 103*a*, and 103*b* is improved.

Second Embodiment

Figure 7:
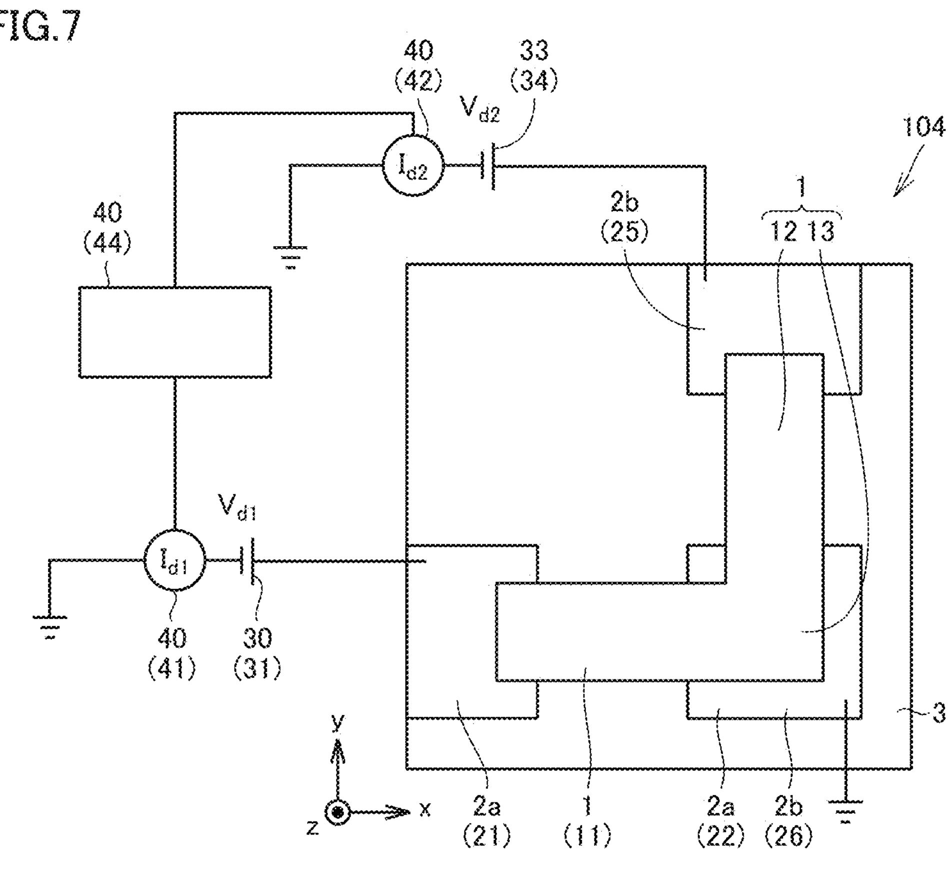
FIG. 7 is a schematic plan view of an electromagnetic wave detector according to a second embodiment.

With reference to FIG. 7, an electromagnetic wave detector 104 according to a second embodiment will be described. Electromagnetic wave detector 104 of the present embodiment has a similar configuration and a similar effect to those of electromagnetic wave detector 100 of the first embodiment, but is different from electromagnetic wave detector 100 of the first embodiment mainly in the following points.

In electromagnetic wave detector 104, fourth electrode 26 included in second electrode pair 2*b* is second electrode 22 included in first electrode pair 2*a*. First electrode pair 2*a* and second electrode pair 2*b* share one common electrode (second electrode 22, fourth electrode 26).

In the present embodiment, common portion 13 of first elongated portion 11 and second elongated portion 12 is one end of first elongated portion 11 close to second electrode 22 and one end of second elongated portion 12 close to fourth electrode 26. In the plan view of first main surface 5*a*, one end of first elongated portion 11 overlaps with one end of second elongated portion 12. In the plan view of first main surface 5*a*, a shape of two-dimensional material layer 1 is an L shape.

Two-dimensional material layer 1 (first elongated portion 11) between first electrode 21 and second electrode 22 may be formed of a material different from a material of two-dimensional material layer 1 (second elongated portion 12) between third electrode 25 and fourth electrode 26. Further, as long as one common electrode (second electrode 22, fourth electrode 26) shared by first electrode pair 2*a* and second electrode pair 2*b* is electrically connected to two-dimensional material layer 1 (first elongated portion 11) between first electrode 21 and second electrode 22 and two-dimensional material layer 1 (second elongated portion 12) between third electrode 25 and fourth electrode 26, two-dimensional material layer 1 (first elongated portion 11) between first electrode 21 and second electrode 22 may be separated from two-dimensional material layer 1 (second elongated portion 12) between third electrode 25 and fourth electrode 26.

<Functions and Effects>

Electromagnetic wave detector 104 according to the present embodiment can reduce the number of electrodes as compared with electromagnetic wave detector 100 according to the first embodiment. Therefore, electromagnetic wave detector 104 can realize a simpler configuration.

Third Embodiment

Figure 8:
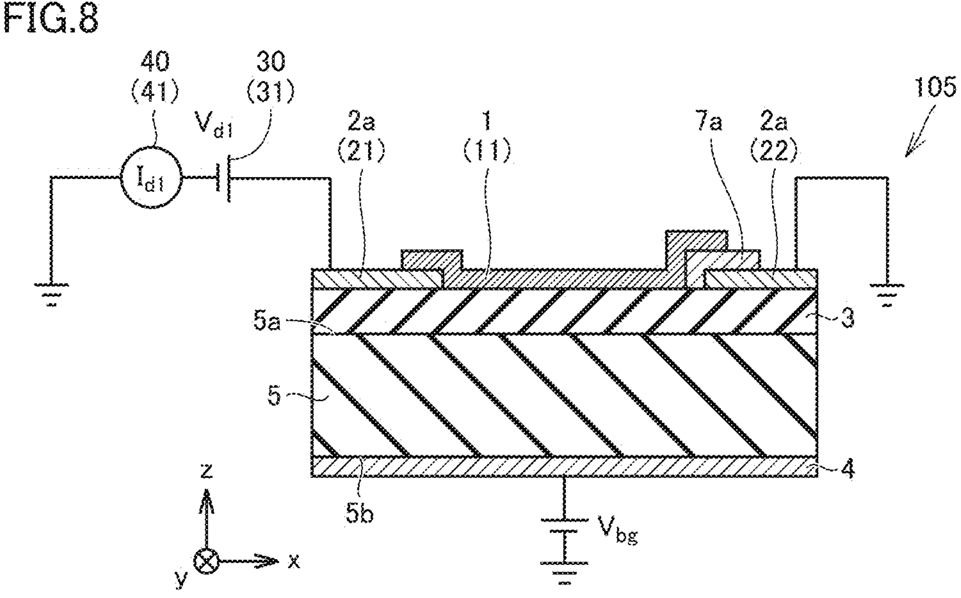
FIG. 8 is a schematic cross-sectional view of an electromagnetic wave detector according to a third embodiment.
Figures 9, 10:
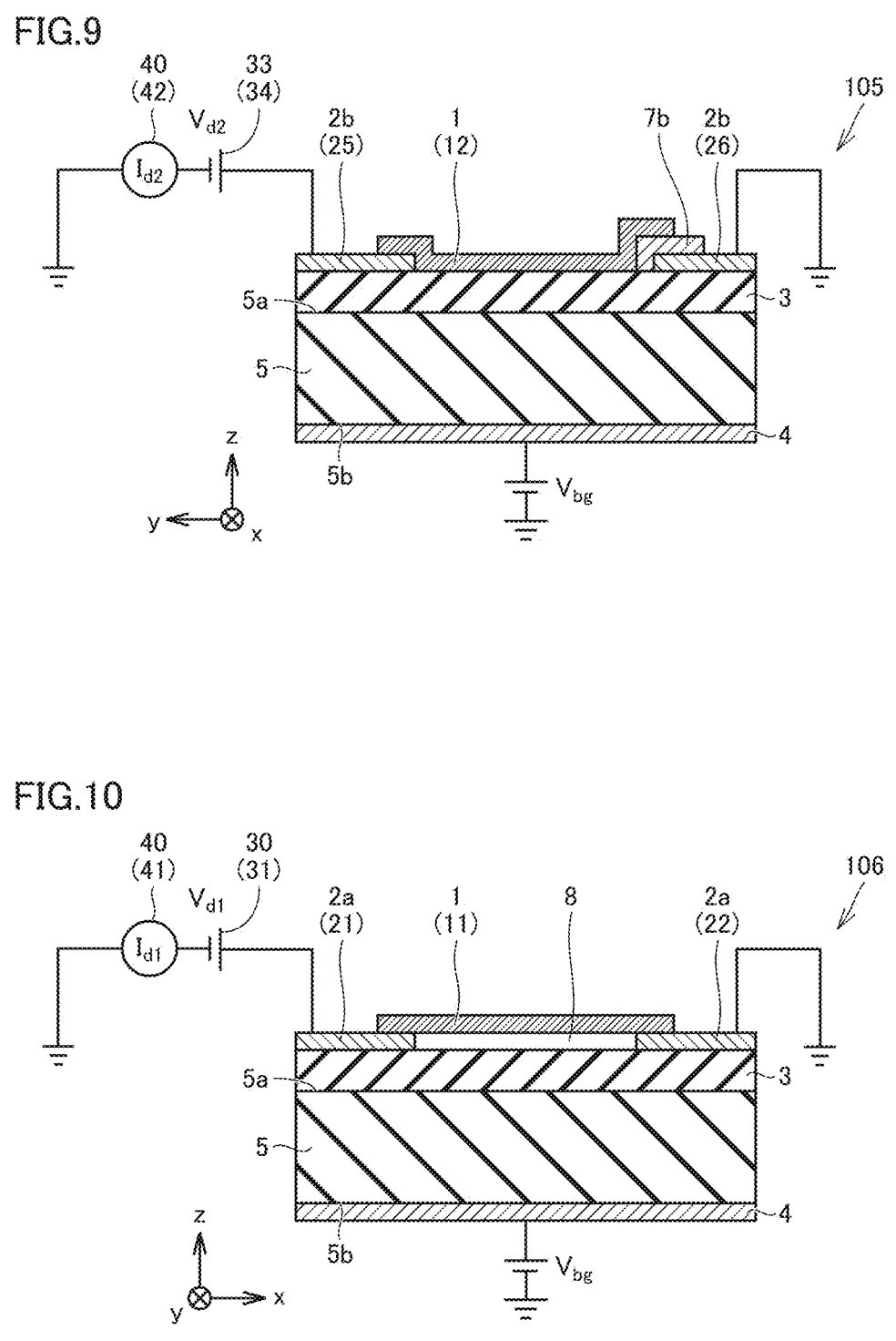

With reference to FIGS. 8 and 9, an electromagnetic wave detector 105 according to a third embodiment will be described. Electromagnetic wave detector 105 of the present embodiment has a similar configuration and a similar effect to those of electromagnetic wave detector 100 of the first embodiment, but is different from electromagnetic wave detector 100 of the first embodiment mainly in the following points.

Electromagnetic wave detector 105 of the present embodiment further includes a first semiconductor layer 7*a* and a second semiconductor layer 7*b*. First semiconductor layer 7*a* is disposed between two-dimensional material layer 1 (first elongated portion 11) and second electrode 22. Second semiconductor layer 7*b* is disposed between two-dimensional material layer 1 (second elongated portion 12) and fourth electrode 26. First semiconductor layer 7*a* preferably has the same structure as second semiconductor layer 7*b*. Electromagnetic wave detector 105 may include only one of first semiconductor layer 7*a* and second semiconductor layer 7*b*.

<Configurations of First Semiconductor Layer 7*a* and Second Semiconductor Layer 7*b*>

Materials of first semiconductor layer 7*a* and second semiconductor layer 7*b* are, for example, semiconductor materials such as silicon (Si). Specifically, first semiconductor layer 7*a* and second semiconductor layer 7*b* are silicon or the like doped with impurities. The materials of first semiconductor layer 7*a* and second semiconductor layer 7*b* may be, for example, germanium (Ge) or a compound semiconductor. Examples of the compound semiconductor include silicon carbide (SiC), a group III-V semiconductor (gallium nitride (GaN), gallium phosphide (GaP), indium gallium arsenide (InGaAs), indium arsenide (InAs), iridium indium antimonide (InSb), or the like), a group II-V semiconductor (mercury cadmium telluride (HgCdTe), lead selenium (PbSe), lead sulfur (PbS), and cadmium sulfur (CdS)), and the like. A semiconductor layer 7 may be formed of a material in which at least two of these semiconductor materials are combined.

First semiconductor layer 7*a* and second semiconductor layer 7*b* may have a multilayer structure. Semiconductor layer 7 may include a quantum well or a quantum dot. A material of semiconductor layer 7 may include a TypeII superlattice. First semiconductor layer 7*a* and second semiconductor layer 7*b* may be a pn junction photodiode, a pin photodiode, a Schottky photodiode, or an avalanche photodiode. First semiconductor layer 7*a* and second semiconductor layer 7*b* may be phototransistors.

First semiconductor layer 7*a* and second semiconductor layer 7*b* are desirably doped with impurities such that electrical resistivity of first semiconductor layer 7*a* and second semiconductor layer 7*b* becomes less than or equal to 100 Ω·cm. By doping first semiconductor layer 7*a* and second semiconductor layer 7*b* with impurities at a high concentration in this manner, mobility of carriers (holes or electrons) in first semiconductor layer 7*a* and second semiconductor layer 7*b* is improved. Therefore, a response speed of electromagnetic wave detector 105 is improved.

Thicknesses of first semiconductor layer 7*a* and second semiconductor layer 7*b* are desirably less than or equal to 10 μm. Since the thicknesses of first semiconductor layer 7*a* and second semiconductor layer 7*b* are reduced, deactivation of carriers (holes or electrons) in first semiconductor layer 7*a* and second semiconductor layer 7*b* is reduced.

In order to improve adhesion between second electrode 22 and first semiconductor layer 7*a*, an adhesion layer (not shown) may be provided between second electrode 22 and first semiconductor layer 7*a*. In order to improve adhesion between fourth electrode 26 and second semiconductor layer 7*b*, an adhesion layer (not shown) may be provided between fourth electrode 26 and second semiconductor layer 7*b*. A material of the adhesion layer includes a metallic material such as chromium (Cr) or titanium (Ti), for example.

<Functions and Effects>

In electromagnetic wave detector 105 according to the present embodiment, a Schottky junction is formed between first semiconductor layer 7*a* and two-dimensional material layer 1 (first elongated portion 11). A Schottky junction is formed between second semiconductor layer 7*b* and two-dimensional material layer 1 (second elongated portion 12). Bias voltage $V_{d1}$ of first voltage source 31 and bias voltage $V_{d2}$ of second voltage source 34 are adjusted to apply a reverse bias voltage to the Schottky junction. In this way, a current flowing through two-dimensional material layer 1 in the dark state can be made zero. That is, a dark current can be reduced, and OFF operation of electromagnetic wave detector 105 is improved.

When first ferroelectric layer 5 is irradiated with an electromagnetic wave, the spontaneous polarization of first ferroelectric layer 5 changes due to the pyroelectric effect, and a Fermi level of two-dimensional material layer 1 is modulated. Therefore, an energy barrier between two-dimensional material layer 1 and first semiconductor layer 7*a* is lowered. As a result, only when electromagnetic wave detector 105 is irradiated with the electromagnetic wave, a current flows through first semiconductor layer 7*a*, and current $I_{d1}$ is detected by the first ammeter.

Further, a change amount of current $I_{d1}$ when electromagnetic wave detector 105 is irradiated with the electromagnetic wave includes: a change amount of a current generated by a change in electric resistance of two-dimensional material layer 1 due to the change in the spontaneous polarization of first ferroelectric layer 5; and a change amount of a current generated by a change in the energy barrier between two-dimensional material layer 1 and first semiconductor layer 7*a*. That is, in electromagnetic wave detector 105 according to the present embodiment, in addition to the current generated by the optical gate effect described above due to entry of the electromagnetic wave, a photocurrent caused by the change in the energy barrier between two-dimensional material layer 1 and first semiconductor layer 7*a* can also be detected. A larger signal can be extracted from signal detection circuit 40.

Fourth Embodiment

With reference to FIG. 10, an electromagnetic wave detector 106 according to a fourth embodiment will be described. Electromagnetic wave detector 106 of the present embodiment has a similar configuration and a similar effect to those of electromagnetic wave detector 100 of the first embodiment, but is different from electromagnetic wave detector 100 of the first embodiment mainly in the following points.

In electromagnetic wave detector 106 according to the present embodiment, a gap 8 is provided between first insulating film 3 and two-dimensional material layer 1. Two-dimensional material layer 1 has a portion disposed away from first insulating film 3. Two-dimensional material layer 1 has a surface facing gap 8. Gap 8 is provided between first electrode 21 and second electrode 22 and between third electrode 25 and fourth electrode 26. A support column (not shown) supporting two-dimensional material layer 1 may be provided between two-dimensional material layer 1 and first insulating film 3. Therefore, gap 8 can be more reliably formed between two-dimensional material layer 1 and first insulating film 3.

Figure 11:
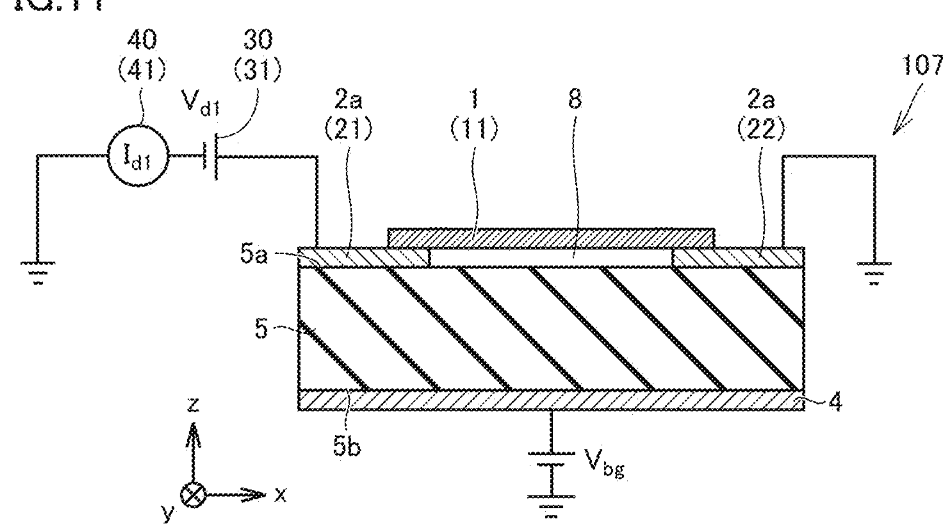
FIG. 11 is a schematic cross-sectional view of an electromagnetic wave detector according to a modification of the fourth embodiment.

Referring to FIG. 11, in an electromagnetic wave detector 107 according to a first modification of the present embodiment, first insulating film 3 is omitted similarly to electromagnetic wave detector 101 of the first modification of the first embodiment. Gap 8 is provided between first ferroelectric layer 5 and two-dimensional material layer 1. A support column (not shown) supporting two-dimensional material layer 1 may be provided between two-dimensional material layer 1 and first ferroelectric layer 5. Therefore, gap 8 can be more reliably formed between two-dimensional material layer 1 and first insulating film 3.

Two-dimensional material layer 1 preferably faces gap 8 as much as possible. A thickness of gap 8 is not particularly limited as long as gap 8 can suppress an influence of carrier scattering on a surface of first ferroelectric layer 5 or an influence of carrier scattering on a surface of first insulating film 3. However, in order for two-dimensional material layer 1 to receive an influence of an electric field from first ferroelectric layer 5 to the maximum, the thickness of gap 8 is preferably as thin as possible. As the thickness of gap 8 is thinner, the influence of the electric field from first ferroelectric layer 5 increases, and a change in electric resistance of two-dimensional material layer 1 increases.

<Functions and Effects>

In electromagnetic wave detectors 106 and 107 according to the present embodiment, gap 8 is provided between first insulating film 3 and two-dimensional material layer 1 (see FIG. 10) or between first ferroelectric layer 5 and two-dimensional material layer 1 (see FIG. 11). Therefore, it is possible to reduce the influence of carrier scattering that occurs when two-dimensional material layer 1 comes into contact with first insulating film 3 or first ferroelectric layer 5. As a result, decrease in mobility of carriers in two-dimensional material layer 1 can be suppressed. Therefore, sensitivity of electromagnetic wave detectors 106 and 107 can be improved.

Fifth Embodiment

Figure 12:
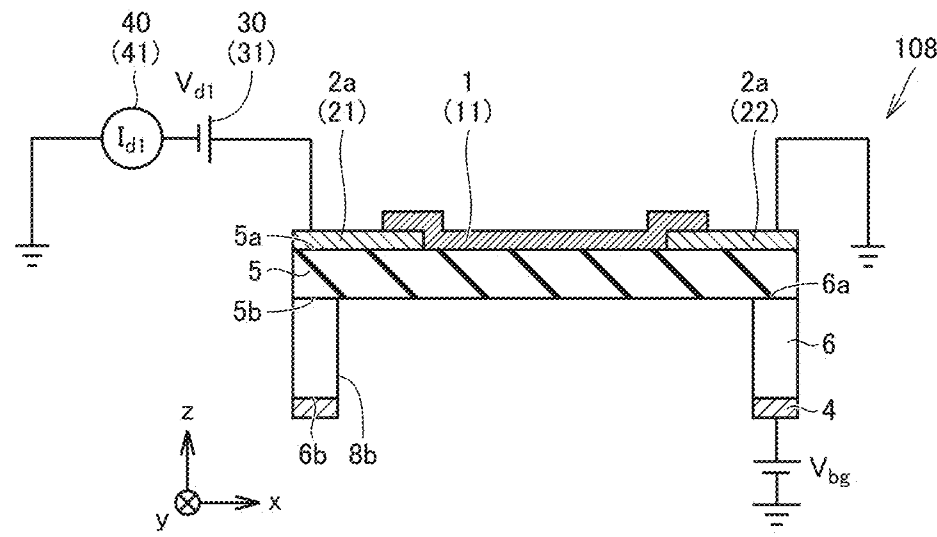
FIG. 12 is a schematic cross-sectional view of an electromagnetic wave detector according to a fifth embodiment.

With reference to FIG. 12, an electromagnetic wave detector 108 according to a fifth embodiment will be described. Electromagnetic wave detector 108 of the present embodiment has a similar configuration and a similar effect to those of electromagnetic wave detector 102 of the second modification of the first embodiment, but is different from electromagnetic wave detector 102 of the second modification of the first embodiment mainly in the following points.

In electromagnetic wave detector 108 according to the present embodiment, a hole **8*b* is provided in substrate 6. Hole 8*b* extends from main surface 6*a* to main surface 6*b*, and penetrates substrate 6 in a thickness direction (z direction) of substrate 6. At least a part of second main surface 5*b* of first ferroelectric layer 5 is exposed from substrate 6 in hole 8*b* and exposed to an ambient atmosphere of electromagnetic wave detector 108. In the plan view of first main surface 5*a*, hole 8*b* overlaps with two-dimensional material layer 1. Hole 8*b* is provided below two-dimensional material layer 1**.

Figure 13:
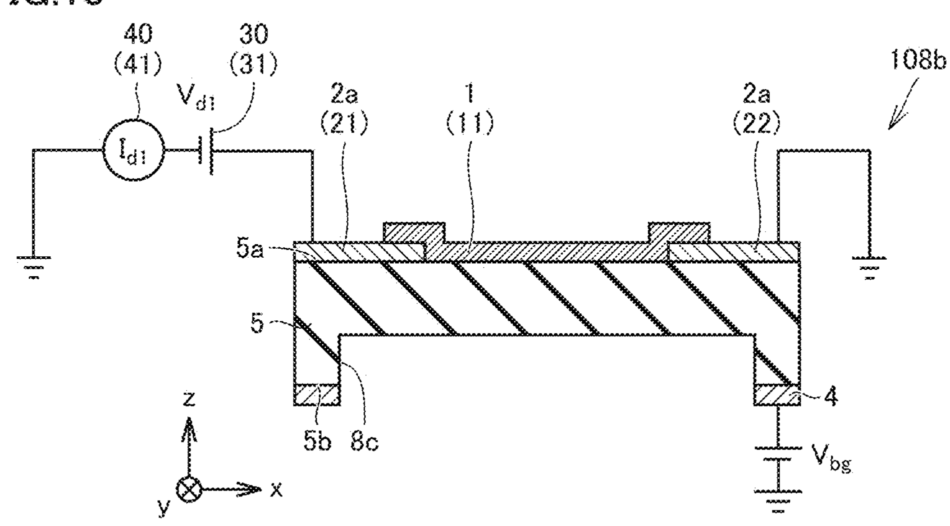
FIG. 13 is a schematic cross-sectional view of an electromagnetic wave detector according to a modification of the fifth embodiment.

Referring to FIG. 13, in an electromagnetic wave detector **108*b* according to a modification of the present embodiment, substrate 6 is omitted similarly to electromagnetic wave detector 101 of the first modification of the first embodiment. A recess 8*c* is provided in second main surface 5*b* of first ferroelectric layer 5. At least a part of second main surface 5*b* of first ferroelectric layer 5 is exposed from back electrode 4 in recess 8*c* and exposed to an ambient atmosphere of electromagnetic wave detector 108*b*. In the plan view of first main surface 5*a*, recess 8*c* overlaps with two-dimensional material layer 1. Recess 8*c* is provided below two-dimensional material layer 1**.

<Functions and Effects>

In electromagnetic wave detector 108, since bole **8*b* is provided in substrate 6, a contact area between first ferroelectric layer 5 and substrate 6 is reduced. Therefore, heat is less likely to be dissipated from first ferroelectric layer 5 to substrate 6. In electromagnetic wave detector 108*b*, since recess 8*c* is provided on second main surface 5*b* of first ferroelectric layer 5, a contact area between first ferroelectric layer 5 and back electrode 4 is reduced. Therefore, heat is less likely to be dissipated from first ferroelectric layer 5 to back electrode 4. According to electromagnetic wave detectors 108 and 108*b* of the present embodiment, heat insulation performance of first ferroelectric layer 5 is improved, and heat dissipation after electromagnetic wave irradiation can be suppressed. As a result, the change in the spontaneous polarization of first ferroelectric layer 5 can be increased. Therefore, sensitivity of electromagnetic wave detectors 108 and 108*b*** can be improved.

Sixth Embodiment

Figure 14:
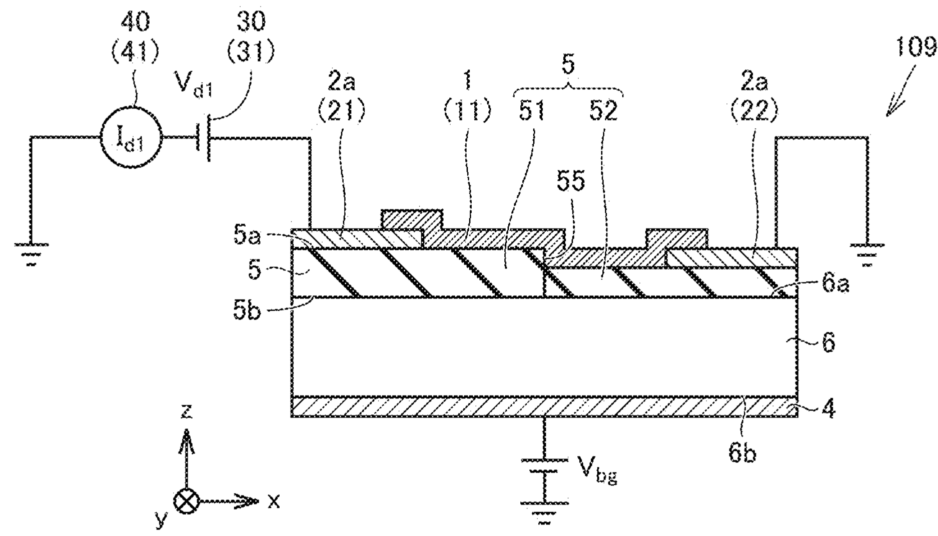
FIG. 14 is a schematic cross-sectional view of an electromagnetic wave detector according to a sixth embodiment.

An electromagnetic wave detector 109 according to a sixth embodiment will be described with reference to FIG. 14. Electromagnetic wave detector 109 of the present embodiment has a similar configuration and a similar effect to those of electromagnetic wave detector 102 of the second modification of the first embodiment, but is different from electromagnetic wave detector 102 of the second modification of the first embodiment mainly in the following points.

A thickness of first ferroelectric layer 5 varies between first electrode 21 and second electrode 22. A height of first main surface **5*a* varies between first electrode 21 and second electrode 22. Specifically, first ferroelectric layer 5 includes a first ferroelectric layer portion 51 and a second ferroelectric layer portion 52. In the plan view of first main surface 5*a*, first ferroelectric layer portion 51 is disposed on the first electrode 21 side, and second ferroelectric layer portion 52 is disposed on the second electrode 22 side. First ferroelectric layer portion 51 and second ferroelectric layer portion 52 are arranged in a second direction (for example, in the x direction) in which first electrode 21 and second electrode 22 face each other. A thickness of second ferroelectric layer portion 52 is different from a thickness of first ferroelectric layer portion 51. For example, second ferroelectric layer portion 52 is thinner than first ferroelectric layer portion 51. A step 55 is formed at a boundary between first ferroelectric layer portion 51 and second ferroelectric layer portion 52. Second main surface 5*b* of first ferroelectric layer 5 is flush over first ferroelectric layer portion 51 and second ferroelectric layer portion 52**.

First elongated portion 11 of two-dimensional material layer 1 is disposed on first ferroelectric layer portion 51 and second ferroelectric layer portion 52. Two-dimensional material layer 1 covers step SS.

First ferroelectric layer 5 is preferably configured such that the spontaneous polarization does not change between third electrode 25 and fourth electrode 26. Therefore, for example, in the plan view of first main surface **5*a*, first ferroelectric layer 5 between third electrode 25 and fourth electrode 26 may have a constant structure in a direction in which third electrode 25 and fourth electrode 26 are separated from each other, and may have a symmetrical structure in a polarization direction of the spontaneous polarization of the first ferroelectric layer. Further, as long as first ferroelectric layer 5 is configured so as not to cause a change in the spontaneous polarization between third electrode 25 and fourth electrode 26, the polarization direction of first ferroelectric layer portion S1 and second ferroelectric layer portion 52 may not be the x direction, and may be, for example, the z direction. Furthermore, between first electrode 21 and second electrode 22, first ferroelectric layer 5 may include three or more ferroelectric layer portions having different thicknesses. Between first electrode 21 and second electrode 22, the thickness of first ferroelectric layer 5 may continuously change, and first main surface 5***a* of first ferroelectric layer 5 may be inclined with respect to second main surface 5*b* of first ferroelectric layer 5.

<Functions and Effects>

In electromagnetic wave detector 109 according to the present embodiment, the thickness of first ferroelectric layer 5 varies between first electrode 21 and second electrode 22. When the thickness of first ferroelectric layer 5 varies, an amount of voltage change occurring in two-dimensional material layer 1 due to the pyroelectric effect of first ferroelectric layer 5 also changes. That is, an amount of voltage change occurring in two-dimensional material layer 1 on a portion (first ferroelectric layer portion 51) of first ferroelectric layer 5 having a larger thickness is different from an amount of voltage change occurring in two-dimensional material layer 1 on a portion (second ferroelectric layer portion 52) of first ferroelectric layer 5 having a smaller thickness. Therefore, a voltage applied to two-dimensional material layer 1 on the portion (first ferroelectric layer portion 51) of first ferroelectric layer 5 having a larger thickness is different from a voltage applied to two-dimensional material layer 1 on a portion (second ferroelectric layer portion 52) of first ferroelectric layer 5 having a smaller thickness. A pn junction is formed in a pseudo manner in two-dimensional material layer 1, and extraction efficiency of the current from two-dimensional material layer 1 is improved. In addition, an influence of the change in the spontaneous polarization of first ferroelectric layer 5 on two-dimensional material layer 1 increases at the time of electromagnetic wave irradiation. Therefore, detection sensitivity of electromagnetic wave detector 109 is improved.

Seventh Embodiment

Figure 15:
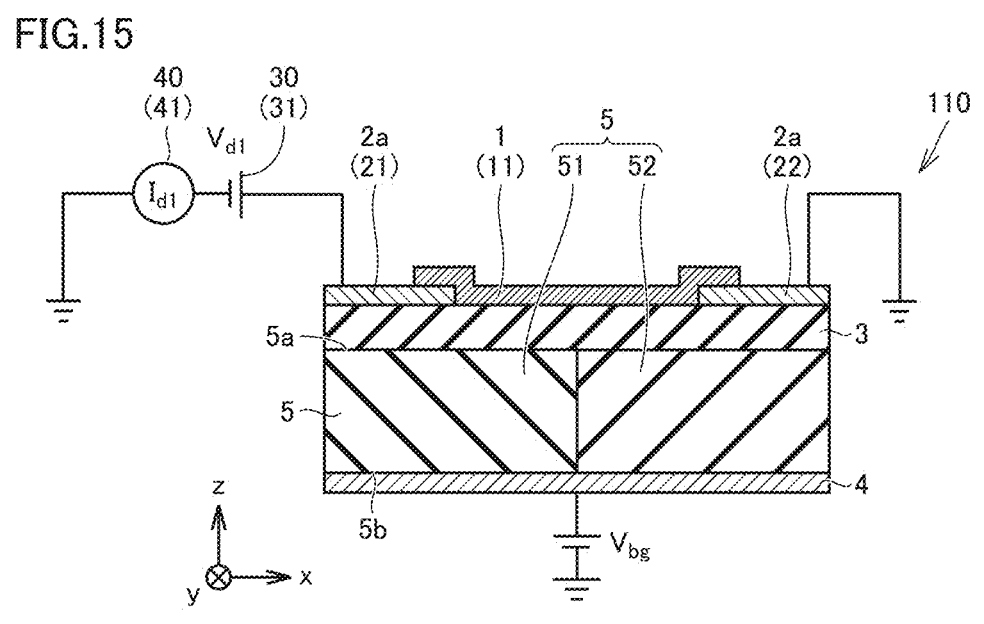

With reference to FIG. 15, an electromagnetic wave detector 110 according to a seventh embodiment will be described. Electromagnetic wave detector 110 of the present embodiment has a similar configuration and a similar effect to those of electromagnetic wave detector 100 of the first embodiment, but is different from electromagnetic wave detector 100 of the first embodiment mainly in the following points.

A dielectric constant of first ferroelectric layer 5 varies between first electrode 21 and second electrode 22. Specifically, first ferroelectric layer 5 includes first ferroelectric layer portion 51 and second ferroelectric layer portion 52. In the plan view of first main surface 5*a*, first ferroelectric layer portion 51 is disposed on the first electrode 21 side, and second ferroelectric layer portion 52 is disposed on the second electrode 22 side. First ferroelectric layer portion 51 and second ferroelectric layer portion 52 are arranged in a second direction (for example, in the x direction) in which first electrode 21 and second electrode 22 face each other. The dielectric constant of first ferroelectric layer portion 51 is different from the dielectric constant of second ferroelectric layer portion 52. For example, a ferroelectric material forming first ferroelectric layer portion 51 is different from a ferroelectric material forming second ferroelectric layer portion 52. An absorption wavelength range of first ferroelectric layer portion 51 may be different from an absorption wavelength range of second ferroelectric layer portion 52.

First elongated portion 11 of two-dimensional material layer 1 is disposed on first ferroelectric layer portion 51 and second ferroelectric layer portion 52.

First ferroelectric layer 5 is preferably configured such that the spontaneous polarization does not change between third electrode 25 and fourth electrode 26. First ferroelectric layer 5 may include three or more ferroelectric layer portions having polarizabilities different from each other. Further, as long as first ferroelectric layer 5 is configured so as not to cause a change in the spontaneous polarization between third electrode 25 and fourth electrode 26, the polarization direction of first ferroelectric layer portion 51 and second ferroelectric layer portion 52 may not be the x direction, and may be, for example, the z direction.

<Functions and Effects>

In electromagnetic wave detector 110 according to the present embodiment, the dielectric constant of first ferroelectric layer portion 51 is different from the dielectric constant of second ferroelectric layer portion 52. When the dielectric constant of the ferroelectric is different, an amount of voltage change occurring in two-dimensional material layer 1 due to the pyroelectric effect of the ferroelectric is also different. That is, an amount of voltage change occurring in two-dimensional material layer 1 on first ferroelectric layer portion 51 is different from an amount of voltage change occurring in two-dimensional material layer 1 on second ferroelectric layer portion 52. Therefore, a voltage applied to two-dimensional material layer 1 on first ferroelectric layer portion 51 is different from a voltage applied to two-dimensional material layer 1 on second ferroelectric layer portion 52, and a pn junction is formed in a pseudo manner in two-dimensional material layer 1. Extraction efficiency of a current from two-dimensional material layer 1 is improved. In addition, an influence of the change in the spontaneous polarization of first ferroelectric layer 5 on two-dimensional material layer 1 increases at the time of electromagnetic wave irradiation. Therefore, detection sensitivity of electromagnetic wave detector 110 is improved.

By making a difference between the absorption wavelength range between first ferroelectric layer portion 51 and the absorption wavelength range of second ferroelectric layer portion 52, electromagnetic wave detector 110 has sensitivity in a plurality of wavelength ranges. A detection band of the electromagnetic wave by electromagnetic wave detector 110 can be widened.

Eighth Embodiment

Figure 16:
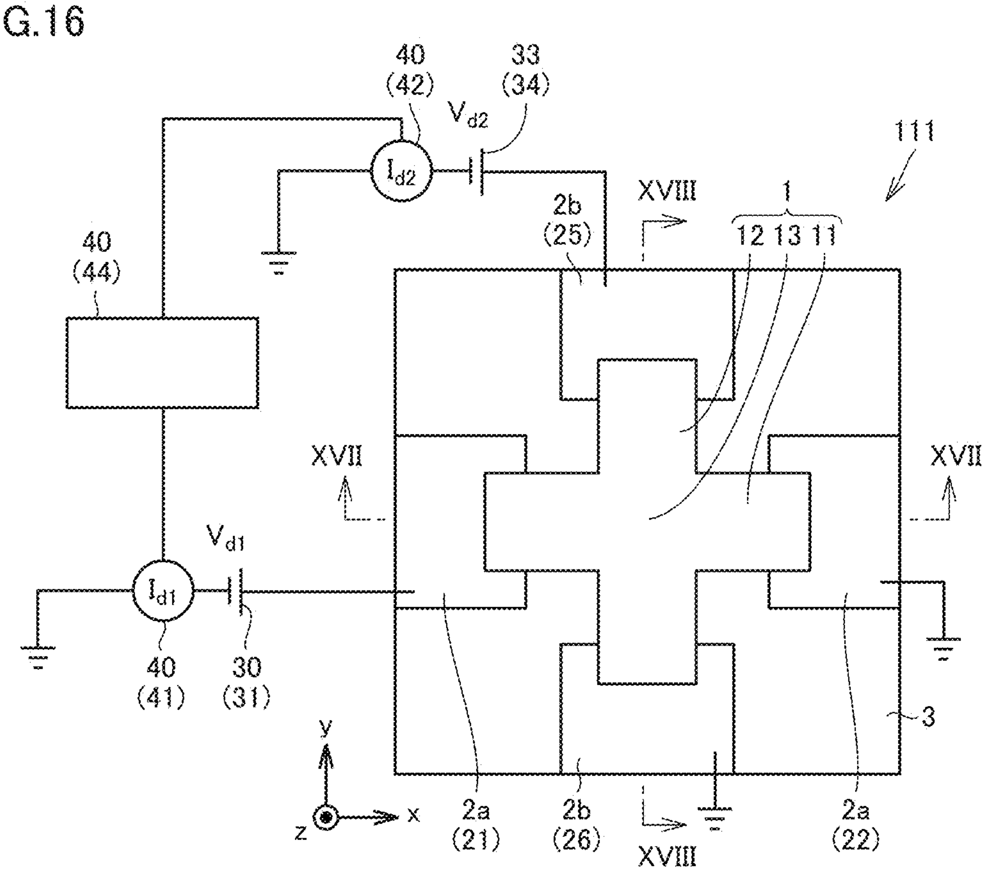
FIG. 16 is a schematic plan view of an electromagnetic wave detector according to an eighth embodiment.
Figure 17:
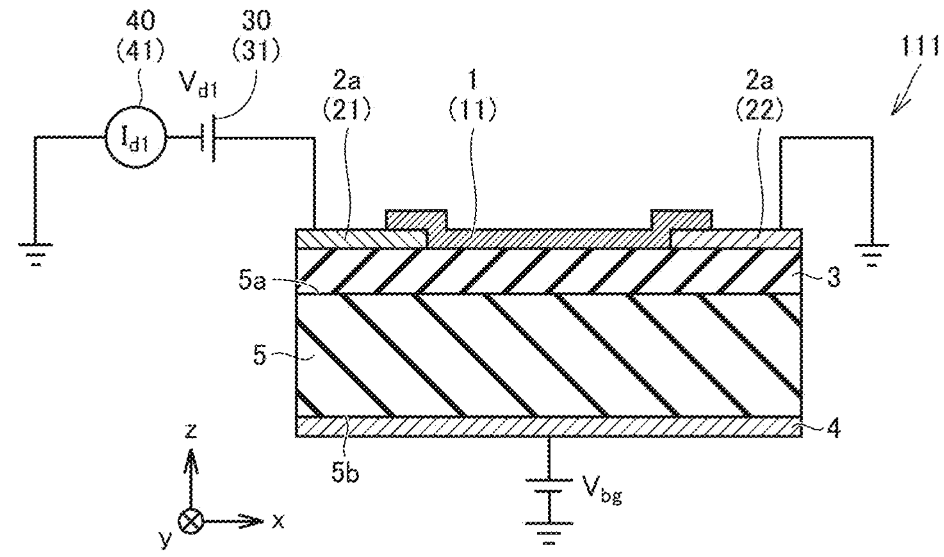
FIG. 17 is a schematic cross-sectional view of the electromagnetic wave detector according to the eighth embodiment taken along a sectional line XVII-XVII shown in FIG. 16.
Figure 18:
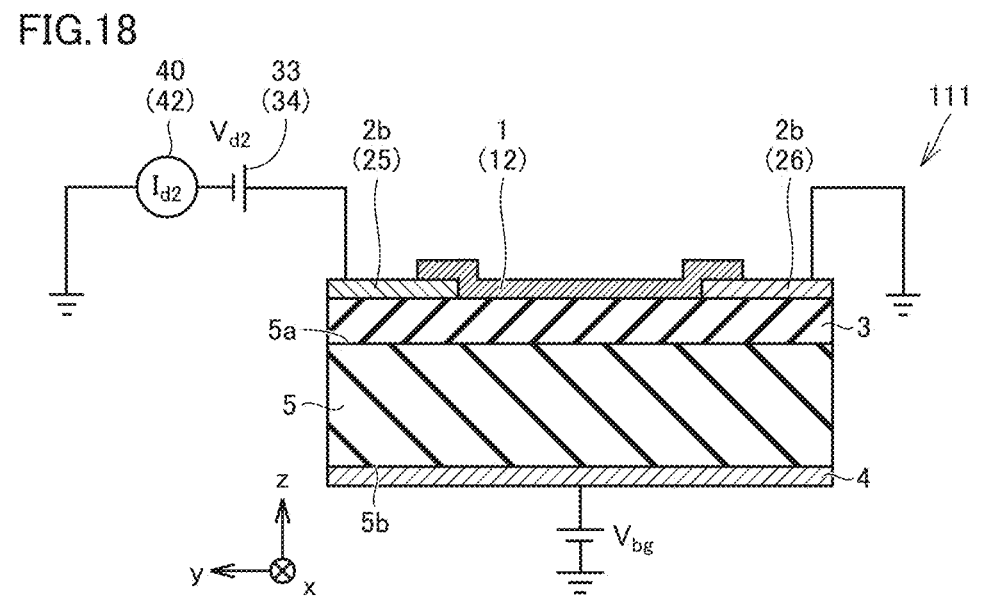
Figure 19:
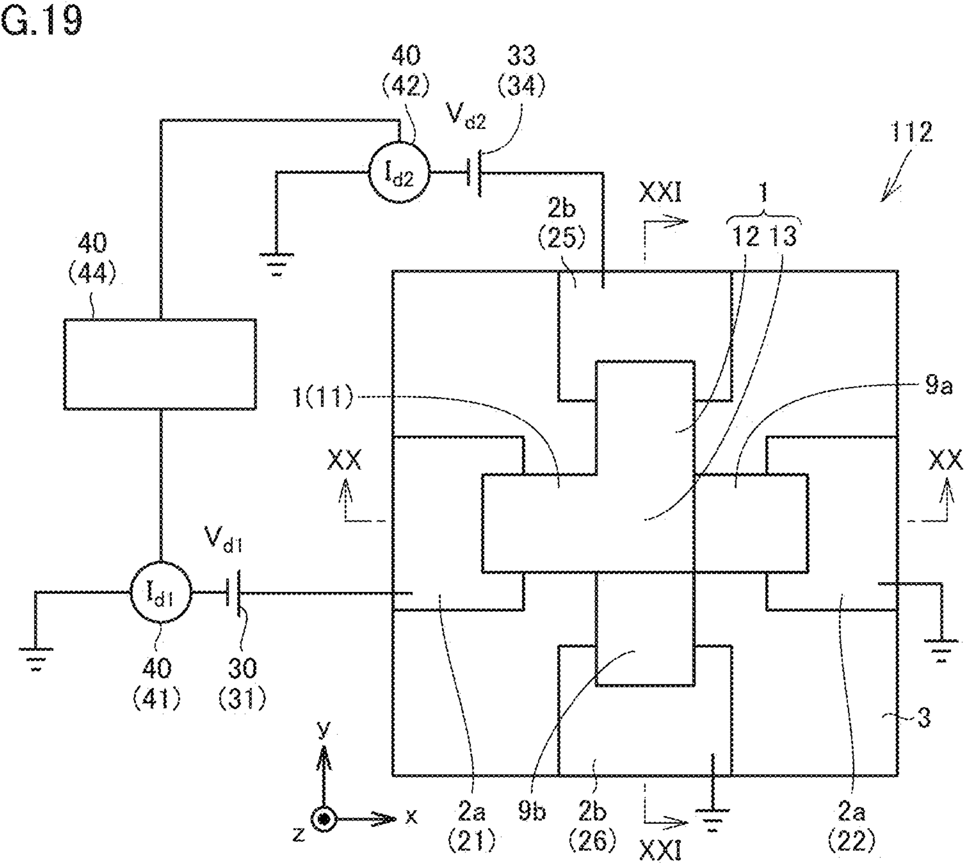
FIG. 19 is a schematic plan view of an electromagnetic wave detector according to a ninth embodiment.
Figure 20:
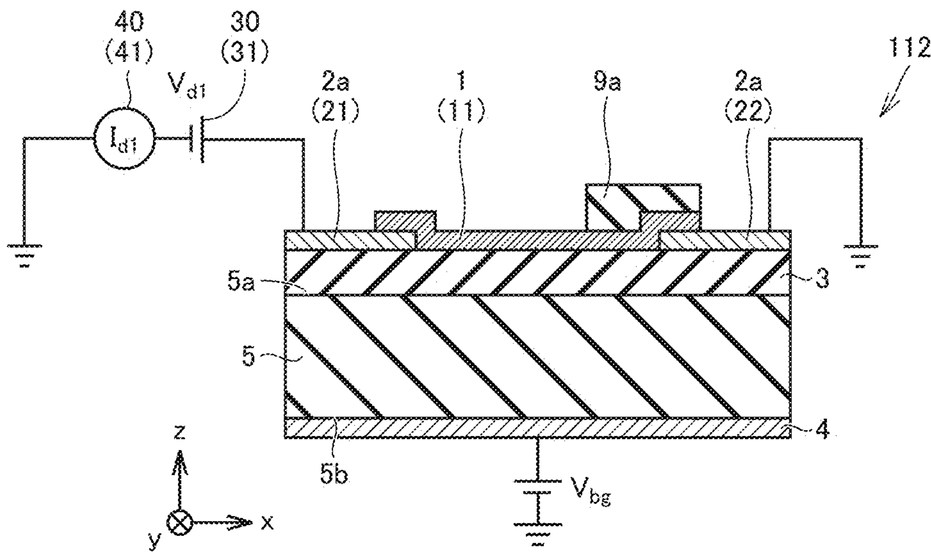
FIG. 20 is a schematic cross-sectional view of the electromagnetic wave detector according to the ninth embodiment taken along a sectional line XX-XX shown in FIG. 19.

With reference to FIGS. 16 to 18, an electromagnetic wave detector 111 according to an eighth embodiment will be described. Electromagnetic wave detector 111 of the present embodiment has a similar configuration and a similar effect to those of electromagnetic wave detector 100 of the first embodiment, but is different from electromagnetic wave detector 100 of the first embodiment mainly in the following points.

In electromagnetic wave detector 111 according to the present embodiment, first electrode 21 is formed of a metallic material different from that of second electrode 22. Third electrode 25 is formed of a metallic material different from that of fourth electrode 26. First electrode 21 may be formed of the same material as that of third electrode 25. Second electrode 22 may be formed of the same material as that of fourth electrode 26.

<Functions and Effects>

In electromagnetic wave detector 111 according to the present embodiment, first electrode 21 is formed of a metallic material different from that of second electrode 22. Third electrode 25 is formed of a metallic material different from that of fourth electrode 26.

When two-dimensional material layer 1 and metal come into contact with each other, due to a difference between a work function of the metal and a work function of a material forming two-dimensional material layer 1 (for example, graphene), carriers (holes or electrons) are doped from the metal into two-dimensional material layer 1. A Fermi level of two-dimensional material layer 1 changes, or contact resistance between two-dimensional material layer 1 and the metal changes.

Therefore, when first electrode 21 is formed of a metallic material different from that of second electrode 22, an energy gap of a first portion of two-dimensional material layer 1 in contact with first electrode 21 is to be different from an energy gap of a second portion of two-dimensional material layer 1 in contact with second electrode 22. When third electrode 25 is formed of a metallic material different from that of fourth electrode 26, an energy gap of a third portion of two-dimensional material layer 1 in contact with third electrode 25 is to be different from an energy gap of a fourth portion of two-dimensional material layer 1 in contact with fourth electrode 26, Two-dimensional material layer 1 is brought into a state in which a pn junction is formed in a pseudo manner. Therefore, extraction efficiency of an electric signal (for example, current) from first electrode pair 2*a* and extraction efficiency of an electric signal (for example, current) from second electrode pair 2*b* are improved. Sensitivity of electromagnetic wave detector 111 can be improved.

Ninth Embodiment

With reference to FIGS. 19 to 21A, an electromagnetic wave detector 112*a* according to a ninth embodiment will be described. Electromagnetic wave detector 112*a* of the present embodiment has a similar configuration and a similar effect to those of electromagnetic wave detector 100 of the first embodiment, but is different from electromagnetic wave detector 100 of the first embodiment mainly in the following points.

Electromagnetic wave detector 112*a* according to the present embodiment further includes a first contact layer 9*a* and a second contact layer 9*b*. First contact layer 9*a* and second contact layer 9*b* are in contact with two-dimensional material layer 1.

Specifically, first contact layer 9*a* is in contact with first elongated portion 11 of two-dimensional material layer 1. First contact layer 9*a* is disposed in a portion of first elongated portion 11 proximal to second electrode 22. First contact layer 9*a* is disposed closer to second electrode 22 than common portion 13 of first elongated portion 11 and second elongated portion 12, in first elongated portion 11. Second contact layer 9*b* is in contact with second elongated portion 12 of two-dimensional material layer 1. Second contact layer 9*b* is disposed in a portion of second elongated portion 12 proximal to fourth electrode 26. Second contact layer 9*b* is disposed closer to fourth electrode 26 than common portion 13 of first elongated portion 11 and the second elongated portion 12, in second elongated portion 12.

A relative position of first contact layer 9*a* with respect to first elongated portion 11 is preferably identical to a relative position of second contact layer 9*b* with respect to second elongated portion 12.

First contact layer 9*a* comes into contact with first elongated portion 11 of two-dimensional material layer 1 to supply carriers (holes or electrons) to first elongated portion 11. First elongated portion 11 is doped by first contact layer 9*a*. Second contact layer 9*b* comes into contact with second elongated portion 12 of two-dimensional material layer 1 to supply carriers (holes or electrons) to second elongated portion 12. Second elongated portion 12 is doped by second contact layer 9*b*.

Therefore, an energy gap of a first portion of two-dimensional material layer 1 in contact with first electrode 21 is to be different from an energy gap of a second portion of two-dimensional material layer 1 in contact with second electrode 22. An energy gap of a third portion of two-dimensional material layer 1 in contact with third electrode 25 is to be different from an energy gap of a fourth portion of two-dimensional material layer 1 in contact with fourth electrode 26. Two-dimensional material layer 1 is brought into a state in which a pn junction is formed in a pseudo manner. For this reason, extraction efficiency of an electric signal (for example, current) from first electrode pair 2*a* and extraction efficiency of an electric signal (for example, current) from second electrode pair 2*b* are improved. Sensitivity of electromagnetic wave detector 112*a* can be improved.

First contact layer 9*a* and second contact layer 9*b* need to have such a thickness that two-dimensional material layer 1 can be doped with carriers (holes or electrons). However, a thickness of first contact layer 9*a* and a thickness of second contact layer 9*b* are preferably thin, in order to prevent an electromagnetic wave from being absorbed by first contact layer 9*a* and second contact layer 9*b* and excessively attenuated electromagnetic waves from reaching two-dimensional material layer 1, first insulating film 3, and first ferroelectric layer 5, when two-dimensional material layer 1 is irradiated with an electromagnetic wave.

It is sufficient that first contact layer 9*a* and second contact layer 9*b* are configured to form a gradient of charge density in two-dimensional material layer 1. Each of first contact layer 9*a* and second contact layer 9*b* may include a plurality of contact portions. The plurality of contact portions may be stacked on each other on two-dimensional material layer 1 or may be disposed in parallel on two-dimensional material layer 1. The plurality of contact portions may be formed of the same material as each other or may be formed of different materials from each other.

Hereinafter, first contact layer 9*a* and second contact layer 9*b* will be described in detail.

Materials of first contact layer 9*a* and second contact layer 9*b* may be any material as long as the materials cause charge imbalance and polarization, and may be, for example, an organic substance, a metal, a semiconductor, an insulator, or a two-dimensional material, or a mixture of any of these materials.

When the materials of first contact layer 9*a* and second contact layer 9*b* are inorganic substances, two-dimensional material layer 1 is doped by first contact layer 9*a* and second contact layer 9*b* as follows. If work functions of first contact layer 9*a* and second contact layer 9*b* are larger than a work function of two-dimensional material layer 1, two-dimensional material layer 1 is doped p type by first contact layer 9*a* and second contact layer 9*b*. If work functions of first contact layer 9*a* and second contact layer 9*b* are smaller than a work function of two-dimensional material layer 1, two-dimensional material layer 1 is doped n type.

On the other hand, an organic substance does not have a clear work function. Therefore, when the materials of first contact layer 9*a* and second contact layer 9*b* are organic substances, a mode of doping of two-dimensional material layer 1 by first contact layer 9*a* and second contact layer 9*b* is determined on the basis of polar groups of the materials of first contact layer 9*a* and second contact layer 9*b*. The polar groups of the materials of first contact layer 9*a* and second contact layer 9*b* are determined by polarities of organic molecules constituting the materials of first contact layer 9*a* and second contact layer 9*b*.

The materials of first contact layer 9*a* and second contact layer 9*b* are, for example, positive photoresist. The positive photoresist is, for example, a composition containing a photosensitizer having a quinonediazide group and a novolak resin. When the materials of first contact layer 9*a* and second contact layer 9*b* are the positive photoresist, a region of two-dimensional material layer 1 where the positive photoresist is formed is a p type region. The positive photoresist is formed on two-dimensional material layer 1 by, for example, a photolithography step. This eliminates the need for a process of forming a mask in contact with two-dimensional material layer 1. Two-dimensional material layer 1 can be prevented from being damaged by the mask forming process, and the process can be simplified.

The materials of first contact layer 9*a* and second contact layer 9*b* may be, for example, a material having a polar group. More specifically, the materials of first contact layer 9*a* and second contact layer 9*b* may be, for example, a material having an electron-withdrawing group. The material having the electron-withdrawing group reduces an electron density of two-dimensional material layer 1. The material having the electron-withdrawing group is, for example, a material having a halogen, a nitrile group, a carboxyl group, a carbonyl group, or the like. The materials of first contact layer 9*a* and second contact layer 9*b* may be, for example, a material having an electron-donating group. The material having the electron-donating group increases an electron density of two-dimensional material layer 1. The material having the electron-donating group is, for example, a material having an alkyl group, a hydroxy group, an amino group, or the like.

The materials of first contact layer 9*a* and second contact layer 9*b* may be materials that cause polarity conversion when first contact layer 9*a* and second contact layer 9*b* are irradiated with an electromagnetic wave. In the present specification, the polarity conversion means a phenomenon in which a polar group is chemically changed. The polarity conversion means, for example, a phenomenon in which an electron-withdrawing group changes to an electron-donating group, a phenomenon in which an electron-donating group changes to an electron-withdrawing group, a phenomenon in which a polar group changes to a nonpolar group, or a phenomenon in which a nonpolar group changes to a polar group. An electromagnetic wave that causes polarity conversion may or may not have a detection wavelength. A material that causes polarity conversion is not particularly limited, and is, for example, a photoresist. When polarity conversion occurs in first contact layer 9*a* and second contact layer 9*b*, carriers (holes or electrons) generated during the polarity conversion are supplied to two-dimensional material layer 1. A portion of two-dimensional material layer 1 where first contact layer 9*a* and second contact layer 9*b* are in contact with each other is doped with carriers (holes or electrons).

As the materials of first contact layer 9*a* and second contact layer 9*b*, materials that cause polarity conversion by being irradiated with an electromagnetic wave having the detection wavelength may be selected. Therefore, only when first contact layer 9*a* and second contact layer 9*b* are irradiated with an electromagnetic wave having the detection wavelength, polarity conversion occurs in first contact layer 9*a* and second contact layer 9*b*. Only at the time of irradiation with the electromagnetic wave having the detection wavelength, two-dimensional material layer 1 can be doped with carriers to increase the photocurrent flowing through two-dimensional material layer 1.

As the materials of first contact layer 9*a* and second contact layer 9*b*, materials that cause polarity conversion by being irradiated with an electromagnetic wave having no detection wavelength may be selected. In this case, first contact layer 9*a* and second contact layer 9*b* may be removed after first contact layer 9*a* and second contact layer 9*b* are irradiated with the electromagnetic wave having no detection wavelength. Even after first contact layer 9*a* and second contact layer 9*b* are removed, a portion of two-dimensional material layer 1 that has been in contact with first contact layer 9*a* and second contact layer 9*b* remains in a state of being doped with carriers (holes or electrons), In addition, removal of first contact layer 9*a* and second contact layer 9*b* increases a region of two-dimensional material layer 1, a region of first insulating film 3, and a region of first ferroelectric layer 5 that are irradiated with the electromagnetic wave having the detection wavelength. Therefore, detection sensitivity of electromagnetic wave detector 112*a* can be improved.

The materials of first contact layer 9*a* and second contact layer 9*b* may be materials that cause an oxidation-reduction reaction when first contact layer 9*a* and second contact layer 9*b* are irradiated with an electromagnetic wave. As a result, carriers (holes or electrons) generated by the oxidation-reduction reaction are doped in two-dimensional material layer 1. The electromagnetic wave that causes the oxidation-reduction reaction may or may not have the detection wavelength.

The electromagnetic wave that causes the oxidation-reduction reaction in first contact layer 9*a* and second contact layer 9*b* may be an electromagnetic wave having the detection wavelength. Only at the time of irradiation with the electromagnetic wave having the detection wavelength, two-dimensional material layer 1 can be doped with carriers to increase the photocurrent flowing through two-dimensional material layer 1. The electromagnetic wave that causes the oxidation-reduction reaction in first contact layer 9*a* and second contact layer 9*b* may be an electromagnetic wave having no detection wavelength. In a case where the electromagnetic wave that causes the oxidation-reduction reaction in first contact layer 9*a* and second contact layer 9*b* is an electromagnetic wave having no detection wavelength, first contact layer 9*a* and second contact layer 9*b* may be removed after first contact layer 9*a* and second contact layer 9*b* are irradiated with the electromagnetic wave having no detection wavelength.

First contact layer 9*a* and second contact layer 9*b* may be formed of a material that supplies molecules or the like to two-dimensional material layer 1. For example, first contact layer 9*a* and second contact layer 9*b* are liquid layers or gas layers containing molecules, and two-dimensional material layer 1 may be immersed in the liquid layers or exposed to the gas layers. At a molecular level, carriers can be supplied to two-dimensional material layer 1 from the liquid layer or the gas layer.

<Functions and Effects>

In electromagnetic wave detector 112*a* according to the present embodiment, first contact layer 9*a* and second contact layer 9*b* are in contact with two-dimensional material layer 1 to supply carriers (holes or electrons) to two-dimensional material layer 1. A portion of two-dimensional material layer 1 in contact with first contact layer 9*a* and a portion of two-dimensional material layer 1 in contact with second contact layer 9*b* are doped n type or p type. Therefore, an energy gap of a first portion of two-dimensional material layer 1 in contact with first electrode 21 is to be different from an energy gap of a second portion of two-dimensional material layer 1 in contact with second electrode 22. An energy gap of a third portion of two-dimensional material layer 1 in contact with third electrode 25 is to be different from an energy gap of a fourth portion of two-dimensional material layer 1 in contact with fourth electrode 26. Extraction efficiency of an electric signal (for example, current) from first electrode pair 2*a* and extraction efficiency of an electric signal (for example, current) from second electrode pair 2*b* are improved. Sensitivity of electromagnetic wave detector 112*a* can be improved.

Tenth Embodiment

Figure 21A:
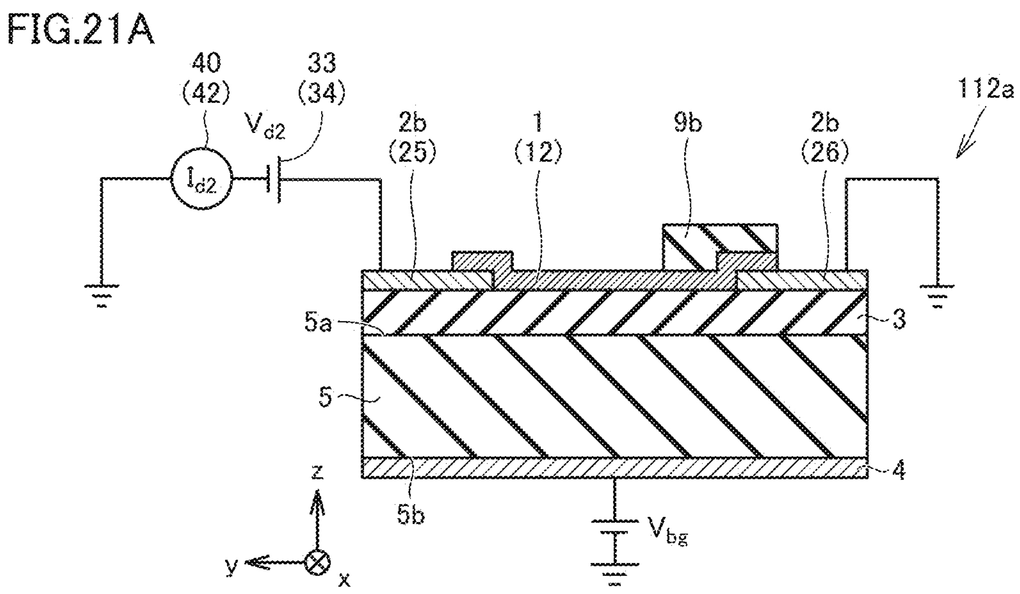
FIG. 21A is a schematic cross-sectional view of the electromagnetic wave detector according to the ninth embodiment taken along a sectional line XXI-XXI shown in FIG. 19.
Figure 21B:
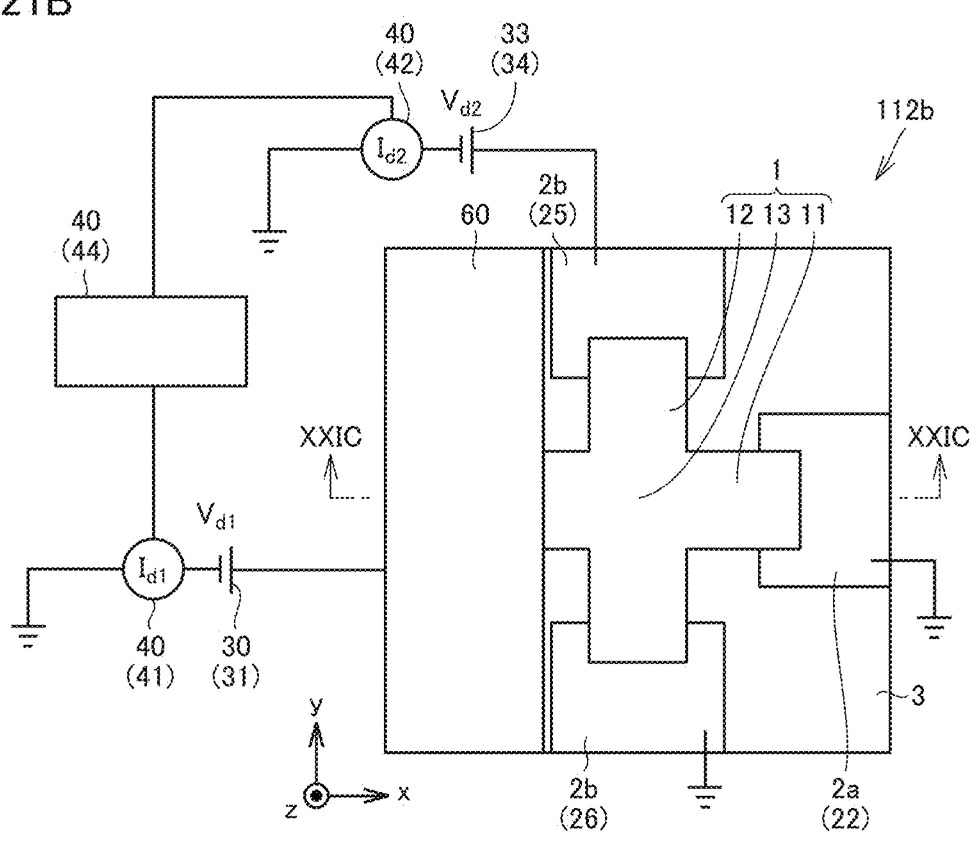
FIG. 21B is a schematic plan view of an electromagnetic wave detector according to a tenth embodiment.
Figure 21C:
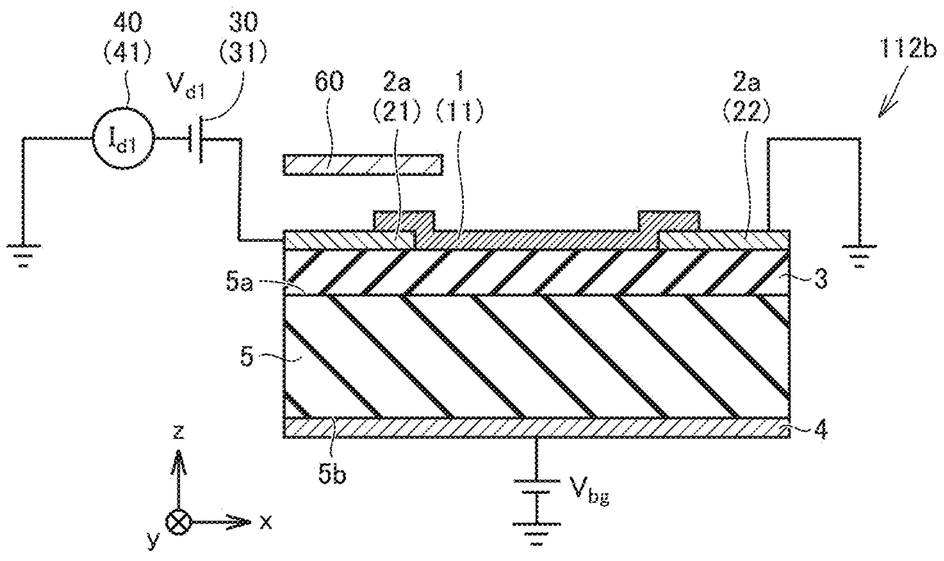
FIG. 21C is a schematic cross-sectional view of the electromagnetic wave detector according to the tenth embodiment taken along a sectional line XXIC-XXIC shown in FIG. 21B.

With reference to FIGS. 21B and 21C, a configuration of an electromagnetic wave detector 112*b* according to a tenth embodiment will be described. Electromagnetic wave detector 112*b* of the present embodiment has a similar configuration and a similar effect to those of electromagnetic wave detector 100 of the first embodiment, but is different from electromagnetic wave detector 100 of the first embodiment mainly in the following points.

Electromagnetic wave detector 112*b* further includes an electromagnetic wave shielding member 60. Electromagnetic wave shielding member 60 shields an electromagnetic wave to prevent the electromagnetic wave from entering a part of first ferroelectric layer 5. Therefore, a gradient of polarizability is generated in first ferroelectric layer 5 in the first polarization direction (+x direction) of the spontaneous polarization of first ferroelectric layer 5. Electromagnetic wave shielding member 60 is formed of a material that shields an electromagnetic wave having an absorption wavelength of first ferroelectric layer 5. Electromagnetic wave shielding member 60 is formed of, for example, a black body, a metal such as aluminum (Al) or gold (Au), or a material subjected to alumite processing.

In the present embodiment, the electromagnetic wave enters electromagnetic wave detector 112*b* from the first electrode pair 2*a* side with respect to first ferroelectric layer 5, so that electromagnetic wave shielding member 60 is disposed on a side (above first electrode 21) opposite to the first ferroelectric layer 5 side with respect to first electrode 21. Electromagnetic wave shielding member 60 is disposed away from two-dimensional material layer 1. Therefore, electromagnetic wave shielding member 60 does not deteriorate mobility of two-dimensional material layer 1.

In the plan view of first main surface 5*a*, electromagnetic wave shielding member 60 covers only one side of first ferroelectric layer 5 with respect to a center of first ferroelectric layer 5 in the first polarization direction (+x direction) of the spontaneous polarization of first ferroelectric layer 5. Therefore, electromagnetic wave shielding member 60 shields only one side of first ferroelectric layer 5 from the electromagnetic wave. The one side may be the first electrode 21 side or the second electrode 22 side as shown in FIGS. 21B and 21C.

In a case where the electromagnetic wave enters electromagnetic wave detector 112*b* from the back electrode 4 side with respect to first ferroelectric layer 5, electromagnetic wave shielding member 60 is disposed on a side (below back electrode 4) opposite to the first ferroelectric layer 5 side with respect to back electrode 4. Electromagnetic wave shielding member 60 may be in contact with two-dimensional material layer 1 as long as the mobility of two-dimensional material layer 1 is not deteriorated.

In a case where the electromagnetic wave enters electromagnetic wave detector 112*b* from the first electrode pair 2*a* side with respect to first ferroelectric layer 5, and first electrode pair 2*a* is opaque to the electromagnetic wave, one of first electrode 21 and second electrode 22 may be enlarged, and the enlarged portion of the one of first electrode 21 and second electrode 22 may function as an electromagnetic wave shielding member for an electromagnetic wave, instead of providing electromagnetic wave shielding member 60. In a case where the electromagnetic wave enters electromagnetic wave detector 112*b* from back electrode 4 side with respect to first ferroelectric layer 5, and back electrode 4 is opaque to the electromagnetic wave, back electrode 4 may function as an electromagnetic wave shielding member for an electromagnetic wave, instead of providing electromagnetic wave shielding member 60.

Electromagnetic wave shielding member 60 is disposed, for example, such that two-dimensional material layer 1 is not shielded from the electromagnetic wave. Electromagnetic wave shielding member 60 may be disposed such that two-dimensional material layer 1 is completely shielded from the electromagnetic wave.

<Functions and Effects>

In the plan view of first main surface 5*a*, electromagnetic wave shielding member 60 covers only one side of first ferroelectric layer 5 with respect to a center of first ferroelectric layer 5 in the first polarization direction (+x direction) of the spontaneous polarization of first ferroelectric layer 5. Therefore, one side of first ferroelectric layer 5 is not irradiated with the electromagnetic wave due to electromagnetic wave shielding member 60, but the other side of first ferroelectric layer 5 is irradiated with the electromagnetic wave. In the first polarization direction (+x direction) of the spontaneous polarization of first ferroelectric layer 5, the polarizability of first ferroelectric layer 5 changes. Specifically, while the polarizability of first ferroelectric layer 5 does not change on one side of first ferroelectric layer 5, the polarizability of first ferroelectric layer 5 changes on the other side of first ferroelectric layer 5. As a result, a polarization change occurs in first ferroelectric layer 5 in the first polarization direction (+x direction) of the spontaneous polarization of first ferroelectric layer 5. As a result, a charge density gradient is formed in two-dimensional material layer 1, and electric resistance of two-dimensional material layer 1 changes between first electrode 21 and second electrode 22. As a result, a photocurrent extracted from first electrode pair 2*a* is improved. Therefore, the sensitivity of electromagnetic wave detector 112*b* can be improved.

Eleventh Embodiment

Figures 22, 23:
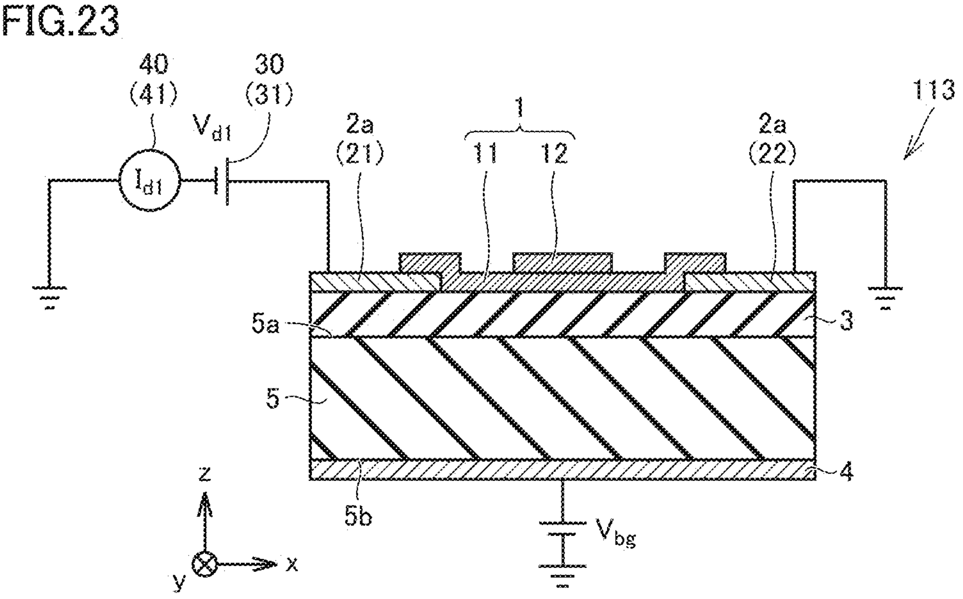
FIG. 22 is a schematic plan view of an electromagnetic wave detector according to an eleventh embodiment.
FIG. 23 is a schematic cross-sectional view of the electromagnetic wave detector according to the eleventh embodiment taken along a sectional line XXIII-XXIII shown in FIG. 22.

With reference to FIGS. 22 and 23, a configuration of an electromagnetic wave detector 113 according to an eleventh embodiment will be described. Electromagnetic wave detector 113 of the present embodiment has a similar configuration and a similar effect to those of electromagnetic wave detector 100 of the first embodiment, but is different from electromagnetic wave detector 100 of the first embodiment mainly in the following points.

In electromagnetic wave detector 113 according to the present embodiment, first elongated portion 11 and second elongated portion 12 are separate layers and are stacked on each other. Second elongated portion 12 is stacked on first elongated portion 11. Second elongated portion 12 is disposed on a side opposite to first ferroelectric layer 5 with respect to first elongated portion 11. First elongated portion 11 is disposed between second elongated portion 12 and first ferroelectric layer 5.

Two-dimensional material layer 1 is formed by the following method, for example. A two-dimensional material film is transferred onto first insulating film 3, first electrode pair 2*a*, and second electrode pair 2*b*. The two-dimensional material film is patterned by a photolithography step and an etching step, to form first elongated portion 11. Then, second elongated portion 12 is also formed in a step similar to that of first elongated portion 11. A protective film (not shown) may be formed on first elongated portion 11 after formation of first elongated portion 11 and before formation of second elongated portion 12, to prevent damage to first elongated portion 11 during patterning of the second elongated portion 12.

<Functions and Effects>

In electromagnetic wave detector 113 according to the present embodiment, first elongated portion 11 and second elongated portion 12 are stacked on each other. Second elongated portion 12 is disposed on a side opposite to first ferroelectric layer 5 with respect to first elongated portion 11.

Electrical resistance between two-dimensional material layers adjacent to each other is much greater than in-plane electrical resistance of two-dimensional material layer 1. Therefore, in electromagnetic wave detector 113 according to the present embodiment, as compared with electromagnetic wave detector 100 according to the first embodiment, a path of current $I_{d1}$ flowing in first elongated portion 11 between first electrode 21 and second electrode 22 is separated from a path of current $I_{d2}$ flowing in second elongated portion 12 between third electrode 25 and fourth electrode 26. Current $I_{d1}$ flowing through first elongated portion 11 between first electrode 21 and second electrode 22 becomes further less likely to flow into third electrode 25 and fourth electrode 26. Current $I_{d2}$ flowing through second elongated portion 12 between third electrode 25 and fourth electrode 26 becomes further less likely to flow into first electrode 21 and second electrode 22. In addition, second elongated portion 12 is further less likely to be affected by the change in the spontaneous polarization of first ferroelectric layer 5 at the time of irradiation of an electromagnetic wave. A change in current $I_{d1}$ between the time of irradiation and time of non-irradiation of the electromagnetic wave increases, and a change in current $I_{d2}$ between the time of irradiation and the time of non-irradiation of the electromagnetic wave decreases.

Therefore, in signal detection circuit 40, a differential signal between current $L_{d1}$ and current $I_{d2}$ can be detected more accurately and more easily. Sensitivity of electromagnetic wave detector 113 is improved. OFF operation of electromagnetic wave detector 113 is further improved.

Each of first elongated portion 11 and second elongated portion 12 is a multilayer body of a plurality of graphene layers, and a moire superlattice, a magic angle, or a random stacking may be formed by adjusting a rotation angle of a lattice in each of the plurality of graphene layers.

By using the moire superlattice for first elongated portion 11 and second elongated portion 12, a band gap according to a stacking angle of the plurality of graphene layers can be formed. Therefore, the sensitivity of electromagnetic wave detector 113 for any wavelength can be enhanced.

By stacking adjacent graphene layers among the plurality of graphene layers so as to be shifted by a magic angle (rotation angle of the lattice of about 1.1 degrees), superconductivity developed in first elongated portion 11 and second elongated portion 12 can be controlled with a small voltage change. Therefore, a dark current of electromagnetic wave detector 113 can be reduced.

When the plurality of graphene layers have lattice mismatch and are randomly stacked, interaction between the plurality of graphene layers is reduced, and each of the plurality of graphene layers behaves equivalently to a monolayer graphene. Therefore, decrease in mobility and the like caused by stacking a plurality of graphene layers can be suppressed. Sensitivity of electromagnetic wave detector 113 is improved.

Twelfth Embodiment

Figure 24:
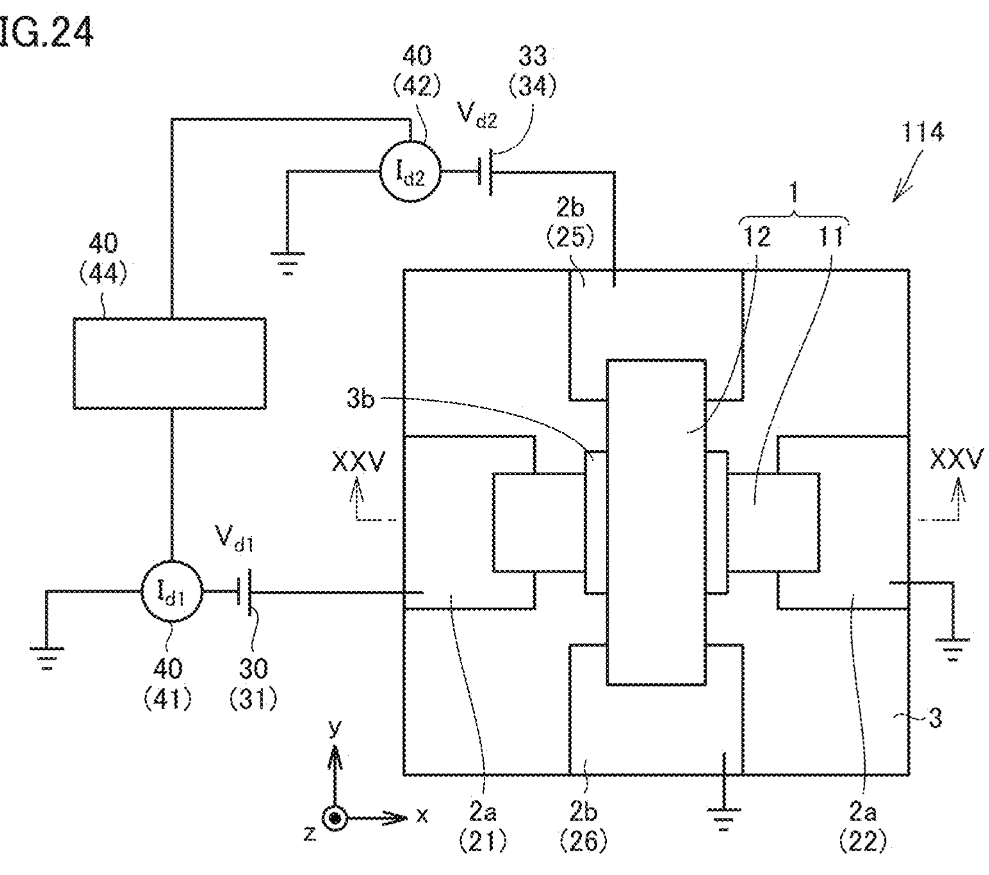
FIG. 24 is a schematic plan view of an electromagnetic wave detector according to a twelfth embodiment.
Figure 25:
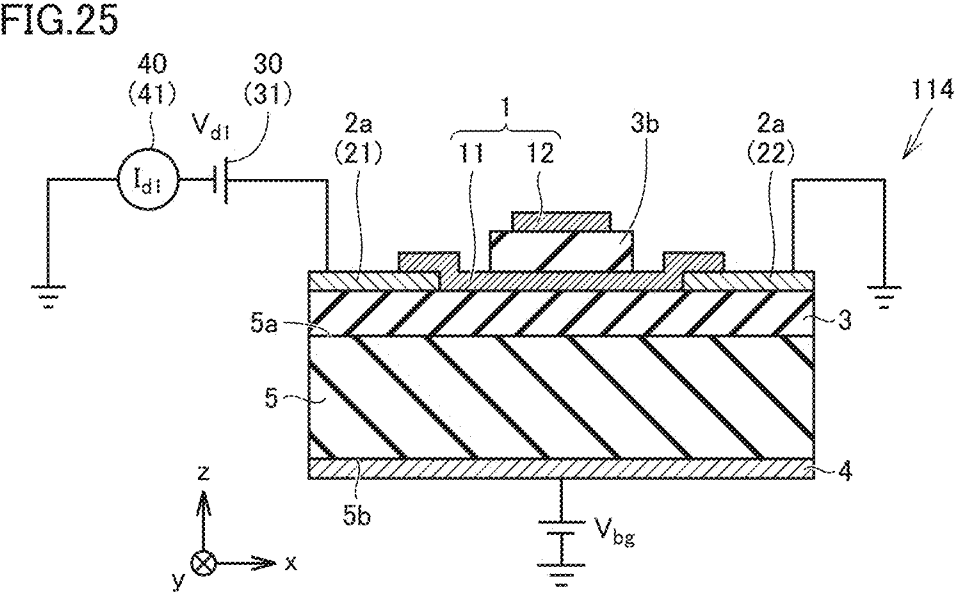
FIG. 25 is a schematic cross-sectional view of the electromagnetic wave detector according to the twelfth embodiment taken along a sectional line XXV-XXV shown in FIG. 24.

With reference to FIGS. 24 and 25, an electromagnetic wave detector 114 according to a twelfth embodiment will be described. Electromagnetic wave detector 114 of the present embodiment has a similar configuration and a similar effect to those of electromagnetic wave detector 113 of the eleventh embodiment, but is different from electromagnetic wave detector 113 of the eleventh embodiment mainly in the following points.

Electromagnetic wave detector 114 according to the present embodiment further includes a second insulating film 3*b*. Second insulating film 3*b* is disposed between first elongated portion 11 and second elongated portion 12. Second insulating film 3*b* electrically insulates second elongated portion 12 from first elongated portion 11. Second insulating film 3*b* is formed after formation of first elongated portion 11 and before formation of second elongated portion 12.

<Functions and Effects>

Electromagnetic wave detector 114 according to the present embodiment further includes second insulating film 3*b*. Second insulating film 3*b* is disposed between first elongated portion 11 and second elongated portion 12.

Therefore, in electromagnetic wave detector 114 according to the present embodiment, as compared with electromagnetic wave detector 113 according to the eleventh embodiment, a path of current $I_{d1}$ flowing in first elongated portion 11 between first electrode 21 and second electrode 22 is further separated from a path of current $I_{d2}$ flowing in second elongated portion 12 between third electrode 25 and fourth electrode 26. Current $I_1$ flowing through first elongated portion 11 between first electrode 21 and second electrode 22 is prevented from flowing into third electrode 25 and fourth electrode 26. Current $I_{d2}$ flowing through second elongated portion 12 between third electrode 25 and fourth electrode 26 is prevented from flowing into first electrode 21 and second electrode 22. In addition, second elongated portion 12 is further less likely to be affected by the change in the spontaneous polarization of first ferroelectric layer 5 at the time of irradiation of an electromagnetic wave. A change in current $I_{d1}$ between the time of irradiation and time of non-irradiation of the electromagnetic wave increases, and a change in current $I_{d2}$ between the time of irradiation and the time of non-irradiation of the electromagnetic wave decreases.

Therefore, in signal detection circuit 40, a differential signal between current $I_{d1}$ and current $I_{d2}$ can be detected more accurately and more easily. Sensitivity of electromagnetic wave detector 114 is improved. OFF operation of electromagnetic wave detector 114 is further improved.

Thirteenth Embodiment

Figure 26:
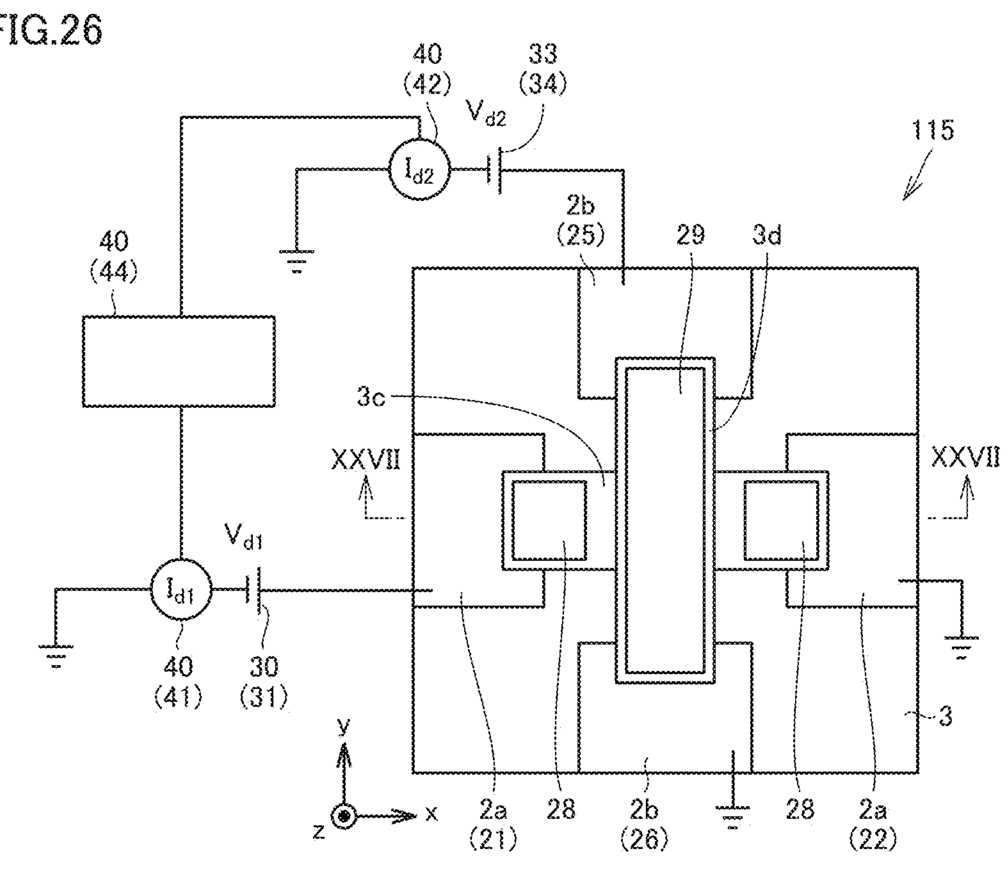
FIG. 26 is a schematic plan view of an electromagnetic wave detector according to a thirteenth embodiment.
Figure 27:
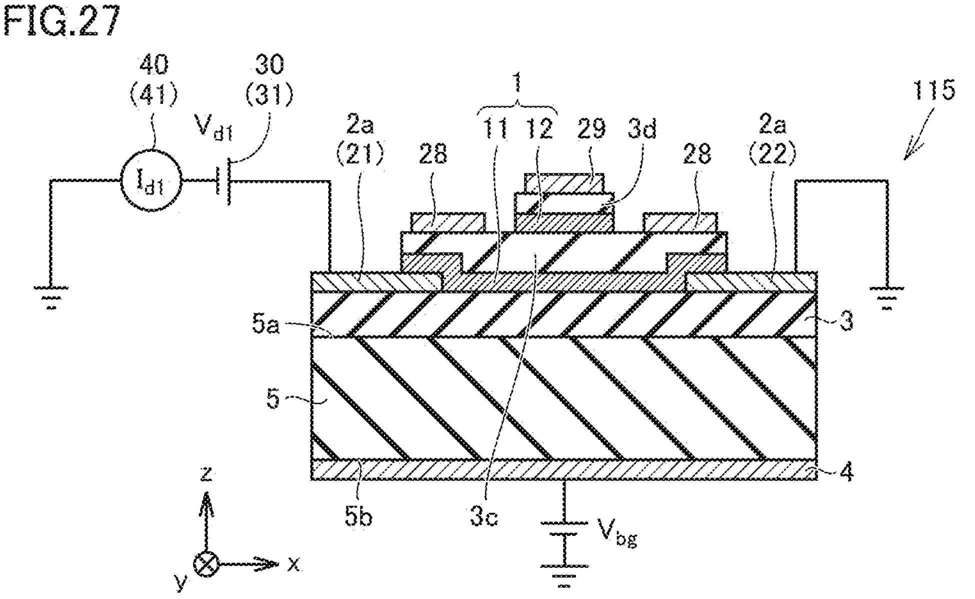
FIG. 27 is a schematic cross-sectional view of the electromagnetic wave detector according to the thirteenth embodiment taken along a sectional line XXVII-XXVII shown in FIG. 26.

With reference to FIGS. 26 and 27, an electromagnetic wave detector 115 according to a thirteenth embodiment will be described. Electromagnetic wave detector 115 of the present embodiment has a similar configuration and a similar effect to those of electromagnetic wave detector 114 of the twelfth embodiment, but is different from electromagnetic wave detector 114 of the twelfth embodiment mainly in the following points.

Electromagnetic wave detector 115 according to the present embodiment further includes gate insulating films 3*c* and 3*d* and gate electrodes 28 and 29.

Gate insulating film 3*c* is disposed on first elongated portion 11. Gate insulating film 3*c* is in contact with first elongated portion 11. Gate insulating film 3*c* may be disposed between first elongated portion 11 and second elongated portion 12, and may electrically insulate first elongated portion 11 from second elongated portion 12. In the plan view of first main surface 5*a*, gate insulating film 3*c* includes a portion exposed from second elongated portion 12.

Gate electrode 28 is disposed on gate insulating film 3*c*. Specifically, gate electrode 28 is disposed on a portion of gate insulating film 3*c* exposed from second elongated portion 12. In the plan view of first main surface 5*a*, at least a part of gate electrode 28 overlaps with a portion of two-dimensional material layer 1 between first electrode 21 and second electrode 22. First electrode 21 is, for example, a drain electrode, and second electrode 22 is, for example, a source electrode.

Gate insulating film 3*d* is disposed on second elongated portion 12. Specifically, gate insulating film 3*d* is disposed on a surface opposite to a surface facing first ferroelectric layer 5. Gate insulating film 3*d* is in contact with second elongated portion 12.

Gate electrode 29 is disposed on gate insulating film 3*d*. In the plan view of first main surface 5*a*, at least a part of gate electrode 29 overlaps with a portion of two-dimensional material layer 1 between third electrode 25 and fourth electrode 26. Third electrode 25 is, for example, a drain electrode, and fourth electrode 26 is, for example, a source electrode.

(Modification)

Shapes and numbers of gate insulating film 3*c* and gate electrode 28 are not particularly limited. Shapes and numbers of gate insulating film 3*d* and gate electrode 29 are not particularly limited. Gate insulating films 3*c* and 3*d* and gate electrodes 28 and 29 may be provided on two-dimensional material layer 1 of the first embodiment.

Electromagnetic wave detector 115 may include one of gate insulating films 3*c* and 3*d* and one of gate electrodes 28 and 29, and another one of gate insulating films 3*c* and 3*d* and another one of gate electrodes 28 and 29 may be omitted. That is, electromagnetic wave detector 115 includes gate insulating film 3*c* and gate electrode 28 provided on two-dimensional material layer 1, but may not include gate insulating film 3*d* and gate electrode 29. Electromagnetic wave detector 115 includes gate insulating film 3*d* and gate electrode 29 provided on two-dimensional material layer 1, but may not include gate insulating film 3*c* and gate electrode 28.

<Functions and Effects>

According to electromagnetic wave detector 115 according to the present embodiment, a gate voltage can be applied from gate electrodes 28 and 29 to two-dimensional material layer 1. Therefore, electric resistance and mobility of two-dimensional material layer 1 can be controlled. It becomes easy to adjust at least one of current $I_{d1}$ or current $I_{d2}$ in the dark state. Therefore, in signal detection circuit 40, a differential signal between current $I_{d1}$ and current $I_{d2}$ can be easily detected. Performance of electromagnetic wave detector 115 can be improved.

Fourteenth Embodiment

Figure 28:
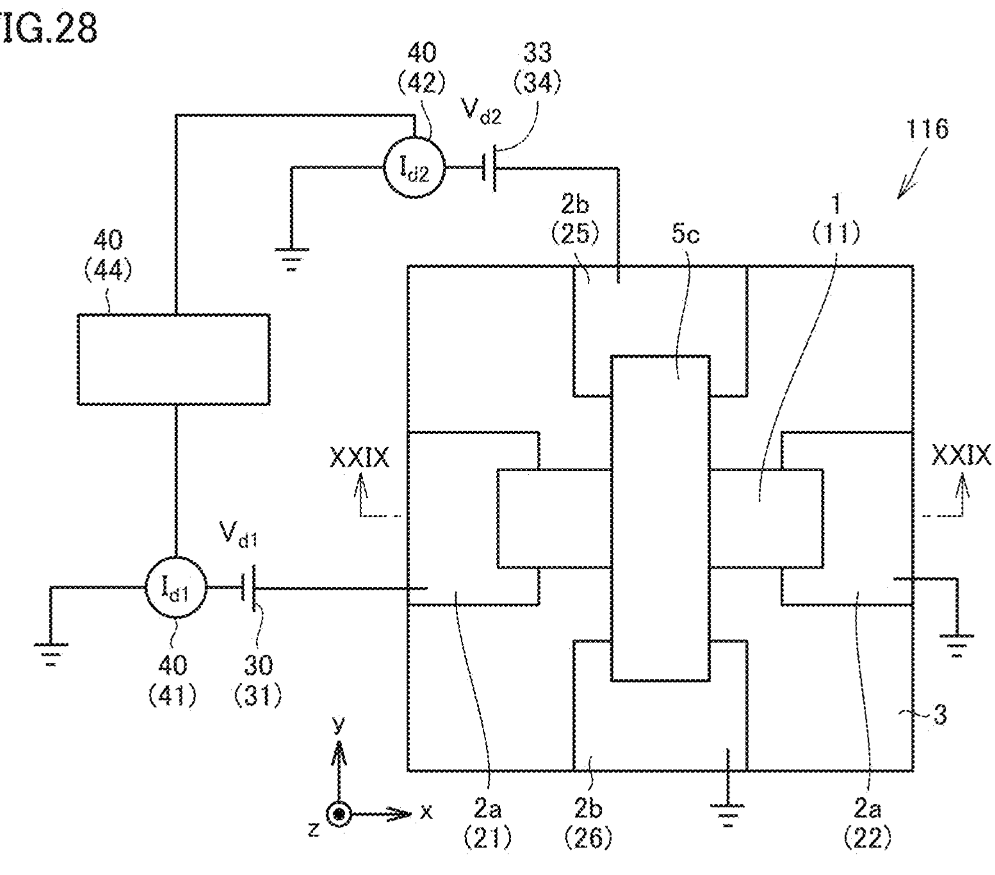
FIG. 28 is a schematic plan view of an electromagnetic wave detector according to a fourteenth embodiment.
Figure 29:
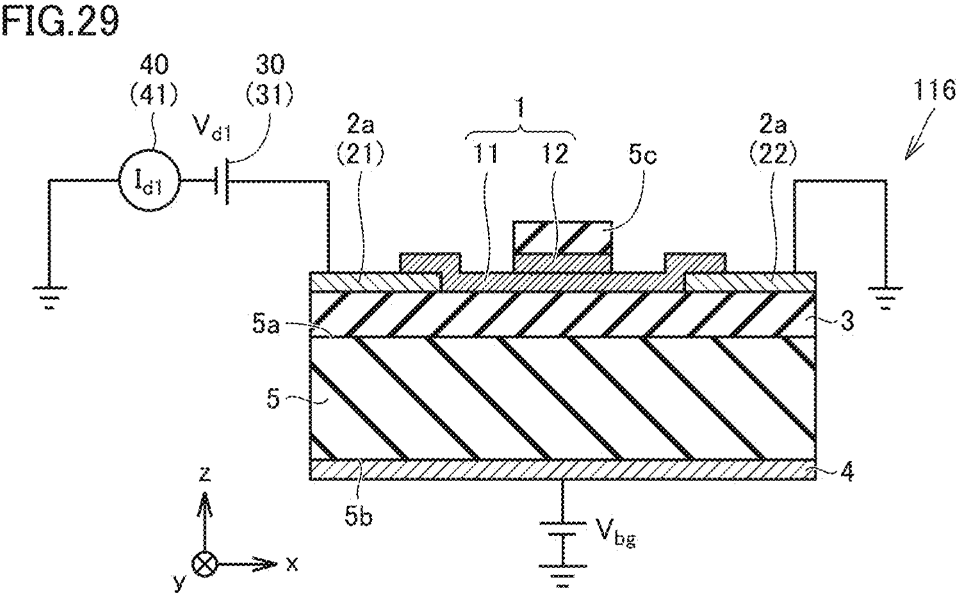
FIG. 29 is a schematic cross-sectional view of the electromagnetic wave detector according to the fourteenth embodiment taken along a sectional line XXIX-XXIX shown in FIG. 28.

With reference to FIGS. 28 and 29, an electromagnetic wave detector 116 according to a fourteenth embodiment will be described. Electromagnetic wave detector 116 of the present embodiment has a similar configuration and a similar effect to those of electromagnetic wave detector 113 of the eleventh embodiment, but is different from electromagnetic wave detector 113 of the eleventh embodiment mainly in the following points.

Electromagnetic wave detector 116 according to the present embodiment further includes a second ferroelectric layer 5*c* having spontaneous polarization. Second ferroelectric layer 5*c* is formed on second elongated portion 12. Second ferroelectric layer 5*c* is disposed on a side opposite to first ferroelectric layer 5 with respect to second elongated portion 12. Second ferroelectric layer 5*e* is disposed on a side opposite to first ferroelectric layer 5 with respect to first elongated portion 11. A second polarization direction of the spontaneous polarization of second ferroelectric layer 5*c* is parallel to a first direction (y direction) perpendicular to a first polarization direction (+x direction) of the spontaneous polarization of first ferroelectric layer 5. The second polarization direction of the spontaneous polarization of second ferroelectric layer 5*c* is parallel to the first direction (y direction) in which third electrode 25 and fourth electrode 26 face each other or a longitudinal direction (y direction) of second elongated portion 12. In the plan view of first main surface 5*a*, second ferroelectric layer 5*c* preferably covers two-dimensional material layer 1 between third electrode 25 and fourth electrode 26.

(Modification)

Second ferroelectric layer 5*c* may be provided on second elongated portion 12 of two-dimensional material layer 1 of the first embodiment. As long as second elongated portion 12 is electrically connected to second electrode pair 2*b*, second ferroelectric layer 5*c* may be provided below second elongated portion 12 (for example, between first elongated portion 11 and second elongated portion 12).

<Functions and Effects>

When electromagnetic wave detector 116 according to the present embodiment is irradiated with an electromagnetic wave, the spontaneous polarization of first ferroelectric layer 5 and the spontaneous polarization of second ferroelectric layer 5*c* change. The first polarization direction of the spontaneous polarization of first ferroelectric layer 5 is parallel to the second direction (x direction) in which first electrode 21 and second electrode 22 face each other, so that first elongated portion 11 between first electrode 21 and second electrode 22 is affected by the change in the spontaneous polarization of first ferroelectric layer 5. The second polarization direction of the spontaneous polarization of second ferroelectric layer 5*c* is parallel to the first direction (y direction) in which third electrode 25 and fourth electrode 26 face each other, so that second elongated portion 12 between third electrode 25 and fourth electrode 26 is affected by the change in the spontaneous polarization of second ferroelectric layer 5*c*.

Therefore, when electromagnetic wave detector 116 is irradiated with the electromagnetic wave, not only current $I_{d1}$ flowing in first elongated portion 11 between first electrode 21 and second electrode 22 but also current $I_{d2}$ flowing in second elongated portion 12 between third electrode 25 and fourth electrode 26 changes. By detecting current $I_{d1}$ and current $I_{d2}$ such that the change in current $I_{d1}$ and the change in current $I_{d2}$ are reversed, a differential signal between current $I_{d1}$ and current $I_{d2}$ detected by signal detection circuit 40 increases. Detecting current $I_{d1}$ and current $I_{d2}$ such that the change in current $I_{d1}$ and the change in current $I_{d2}$ are reversed can be realized, for example, by adjusting at least one of the first polarization direction of the spontaneous polarization of first ferroelectric layer 5, the second polarization direction of the spontaneous polarization of second ferroelectric layer 5*c*, bias voltage $V_{d1}$, or bias voltage $V_{d2}$. Therefore, sensitivity of electromagnetic wave detector 116 is improved. OFF operation of electromagnetic wave detector 116 is further improved.

Fifteenth Embodiment

Figure 30:
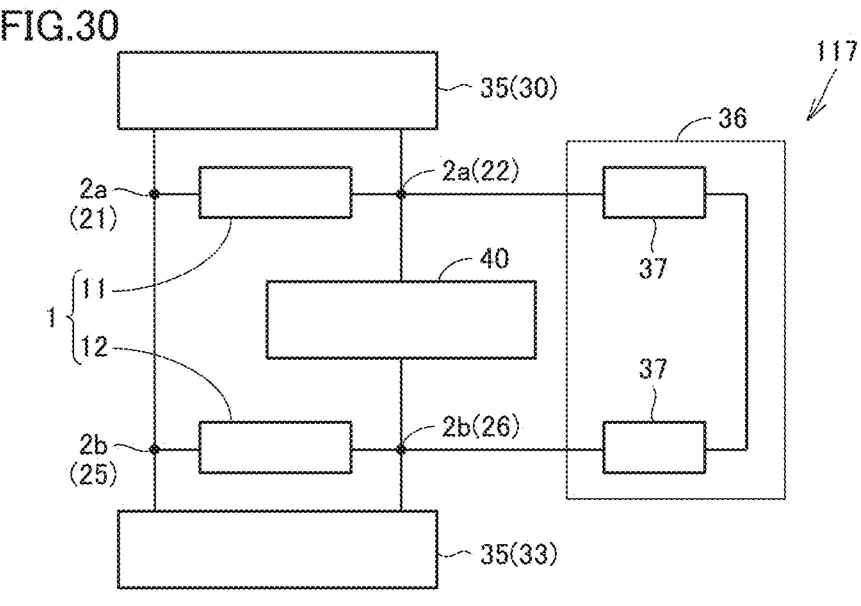
FIG. 30 is a circuit diagram of an electromagnetic wave detector according to a fifteenth embodiment.

With reference to FIG. 30, an electromagnetic wave detector 117 according to a fifteenth embodiment will be described. Electromagnetic wave detector 117 of the present embodiment has a similar configuration and a similar effect to those of electromagnetic wave detector 100 of the first embodiment, but is different from electromagnetic wave detector 100 of the first embodiment mainly in the following points.

Electromagnetic wave detector 117 according to the present embodiment includes an operation circuit 35 and a balance circuit 36.

Operation circuit 35 is connected to at least one of first electrode pair 2*a* or second electrode pair 2*b*. In the present embodiment, operation circuit 35 is connected to both first electrode pair 2*a* and second electrode pair 2*b*. Specifically, operation circuit 35 includes first operation circuit 30 connected to first electrode pair 2*a*, and second operation circuit 33 connected to second electrode pair 2*b*. First operation circuit 30 of the present embodiment is configured similarly to first operation circuit 30 of the first embodiment. Second operation circuit 33 of the present embodiment is configured similarly to second operation circuit 33 of the first embodiment.

Balance circuit 36 is connected to first electrode pair 2*a* and second electrode pair 2*b*. Specifically, balance circuit 36 is connected to one of first electrode 21 and second electrode 22 and one of third electrode 25 and fourth electrode 26. In the present embodiment, balance circuit 36 is connected to second electrode 22 and fourth electrode 26. Thus, balance circuit 36 is electrically connected to two-dimensional material layer 1. Specifically, balance circuit 36 is electrically connected to first elongated portion 11 and second elongated portion 12. Balance circuit 36 includes a plurality of electrical resistance elements. The plurality of electrical resistance elements may be fixed resistors or variable resistors. Balance circuit 36, first elongated portion 11 between first electrode 21 and second electrode 22, and second elongated portion 12 between third electrode 25 and fourth electrode 26 form a bridge circuit.

In the present embodiment, signal detection circuit 40 is connected to second electrode 22 and fourth electrode 26. Signal detection circuit 40 of the present embodiment is configured similarly to signal detection circuit 40 of the first embodiment. For example, signal detection circuit 40 includes first signal detector 41 (see FIG. 1) and second signal detector 42 (see FIG. 1). First signal detector 41 and second signal detector 42 may be an ammeter or a voltmeter.

Operation circuit 35 and balance circuit 36 can adjust a first electric signal output from first electrode pair 2*a* and a second electric signal output from second electrode pair 2*b*.

For example, a case where first operation circuit 30 and second operation circuit 33 are voltage sources is as follows. By adjusting bias voltage $V_{d1}$ (see FIGS. 1 and 2) applied from first operation circuit 30 to first elongated portion 11, current $I_{d1}$ (see FIGS. 1 and 2) as the first electric signal detected by first signal detector 41 (see FIG. 1) can be adjusted. By adjusting bias voltage $V_{d2}$ (see FIGS. 1 and 3) applied from second operation circuit 33 to second elongated portion 12, current $I_{d2}$ (see FIGS. 1 and 3) as the second electric signal detected by second signal detector 42 (see FIG. 1) can be adjusted. Since balance circuit 36 is electrically connected to first elongated portion 11 and second elongated portion 12, current $I_{d1}$ as the first electric signal and current $I_{d2}$ as the second electric signal can be adjusted.

A case where first operation circuit 30 and second operation circuit 33 are current sources is as follows. By adjusting a bias current flowing from first operation circuit 30 to first elongated portion 11, a voltage between first electrode 21 and second electrode 22 as the first electric signal detected by first signal detector 41 (see FIG. 1) can be adjusted. By adjusting a bias current flowing from second operation circuit 33 to second elongated portion 12, a voltage between third electrode 25 and fourth electrode 26 as the second electric signal detected by second signal detector 42 (see FIG. 1) can be adjusted. Since balance circuit 36 is electrically connected to first elongated portion 11 and second elongated portion 12, a voltage between first electrode 21 and second electrode 22 as the first electric signal and a voltage between third electrode 25 and fourth electrode 26 as the second electric signal can be adjusted.

In a case where electromagnetic wave detector 117 is not irradiated with an electromagnetic wave (dark state), operation circuit 35 and balance circuit 36 are adjusted such that electrical resistance of first elongated portion 11 between first electrode 21 and second electrode 22 and electrical resistance of second elongated portion 12 between third electrode 25 and fourth electrode 26 are equal to each other. Therefore, in a case where first signal detector 41 and second signal detector 42 are ammeters, in the dark state, current $I_{d1}$ flowing in first elongated portion 11 between first electrode 21 and second electrode 22 is equal to current $I_{d2}$ flowing in second elongated portion 12 between third electrode 25 and fourth electrode 26. In a case where first signal detector 41 and second signal detector 42 are voltmeters, in the dark state, a voltage of first elongated portion 11 between first electrode 21 and second electrode 22 is equal to a voltage of second elongated portion 12 between third electrode 25 and fourth electrode 26. Therefore, an electric signal output from signal detection circuit 40 becomes zero.

(Modification)

If electrical resistance of first elongated portion 11 between first electrode 21 and second electrode 22 and electrical resistance of second elongated portion 12 between third electrode 25 and fourth electrode 26 are equal to each other, electromagnetic wave detector 117 may include only one of operation circuit 35 and balance circuit 36, and may not include another one of operation circuit 35 and balance circuit 36. That is, it is sufficient that at least one of operation circuit 35 or balance circuit 36 is adjusted such that the electric resistance of first elongated portion 11 between first electrode 21 and second electrode 22 and the electric resistance of second elongated portion 12 between third electrode 25 and fourth electrode 26 are equal to each other in the dark state.

<Functions and Effects>

In electromagnetic wave detector 117 according to the present embodiment, the first electric signal output from first electrode pair 2*a* and the second electric signal output from second electrode pair 2*b* can be adjusted by at least one of operation circuit 35 or balance circuit 36. Therefore, the electric resistance of first elongated portion 11 between first electrode 21 and second electrode 22 and the electric resistance of second elongated portion 12 between third electrode 25 and fourth electrode 26 can be made equal to each other by at least one of operation circuit 35 or balance circuit 36. A dark current can be reduced. Further, signal detection circuit 40 enables detection of a differential signal between the first electric signal (for example, current $I_{d1}$ flowing in first elongated portion 11 between first electrode 21 and second electrode 22) output from first electrode pair 2*a* and the second electric signal (for example, current $I_{d2}$ flowing in second elongated portion 12 between third electrode 25 and fourth electrode 26) output from second electrode pair 2*b*, in the bright state. OFF operation of electromagnetic wave detector 117 is improved.

Sixteenth Embodiment

Figure 31:
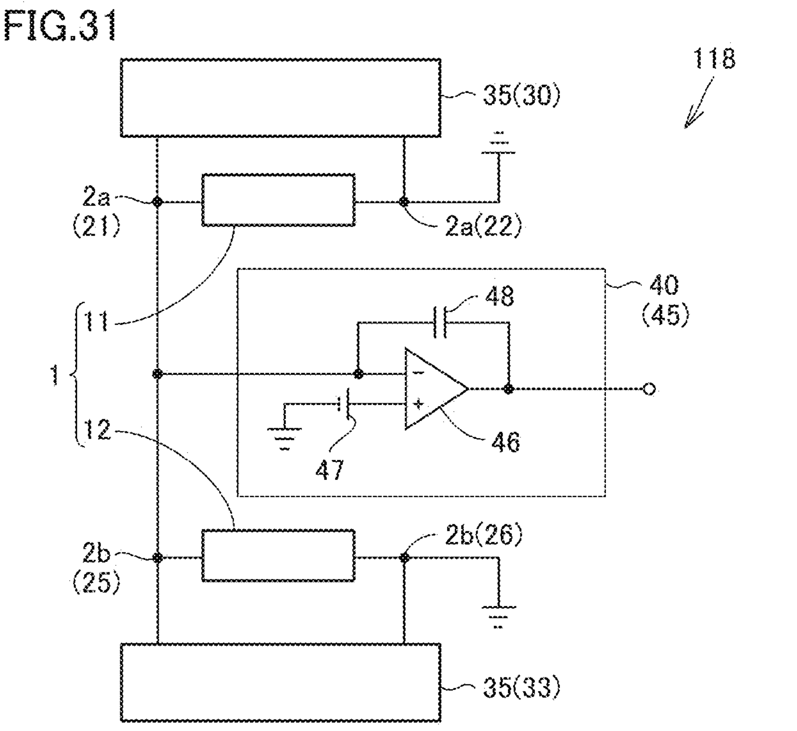
FIG. 31 is a circuit diagram showing an electromagnetic wave detector according to a sixteenth embodiment.

With reference to FIG. 31, an electromagnetic wave detector 118 according to a sixteenth embodiment will be described. Electromagnetic wave detector 118 of the sixteenth embodiment has a similar configuration and a similar effect to those of electromagnetic wave detector 100 of the first embodiment, but is different from electromagnetic wave detector 100 of the first embodiment mainly in the following points.

In electromagnetic wave detector 118 according to the present embodiment, signal detection circuit 40 includes a differential amplifier circuit 45. Differential amplifier circuit 45 is connected to one (in the present embodiment, first electrode 21) of first electrode 21 and second electrode 22 included in first electrode pair 2*a*. Signal detection circuit 40 is connected to one (in the present embodiment, third electrode 25) of third electrode 25 and fourth electrode 26 included in second electrode pair 2*b*.

Differential amplifier circuit 45 may include an operational amplifier 46. Specifically, differential amplifier circuit 45 may be an integration circuit including operational amplifier 46, a power supply 47, and a capacitor 48. A negative terminal of operational amplifier 46 is connected to one (in the present embodiment, first electrode 21) of first electrode 21 and second electrode 22 and one (in the present embodiment, third electrode 25) of third electrode 25 and fourth electrode 26. Power supply 47 is connected to a positive terminal of operational amplifier 46 and a ground potential. Capacitor 48 is connected in parallel to operational amplifier 46. Specifically, capacitor 48 is connected to a negative terminal of operational amplifier 46 and an output terminal of operational amplifier 46.

<Functions and Effects>

Since electromagnetic wave detector 118 according to the present embodiment includes differential amplifier circuit 45, a balance circuit (see FIG. 30) is unnecessary. Therefore, electromagnetic wave detector 118 can be downsized. In addition, since differential amplifier circuit 45 includes operational amplifier 46, an average value of differential signals between the first electric signal and the second electric signal can be obtained. Therefore, an S/N ratio of a differential signal output from signal detection circuit 40 is improved. Performance of electromagnetic wave detector 118 is improved.

Seventeenth Embodiment

Figure 32:
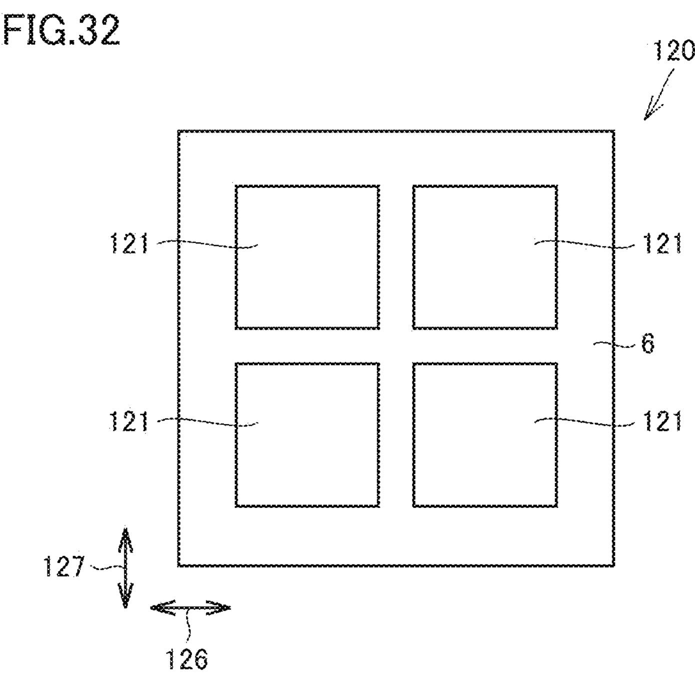
FIG. 32 is a schematic plan view of an electromagnetic wave detector array according to a seventeenth embodiment.

With reference to FIG. 32, an electromagnetic wave detector array 120 according to a seventeenth embodiment will be described.

Electromagnetic wave detector array 120 includes a plurality of electromagnetic wave detectors 121. The plurality of electromagnetic wave detectors 121 are any of electromagnetic wave detectors 100 to 118 of the first to sixteenth embodiments and modifications thereof. The plurality of electromagnetic wave detectors 121 have configurations same as each other. Therefore, electromagnetic wave detector array 120 has improved detection sensitivity for an electromagnetic wave.

The plurality of electromagnetic wave detectors 121 are arranged along at least any of a third direction 126 and a fourth direction 127 different from third direction 126. Fourth direction 127 is, for example, perpendicular to third direction 126. In the present embodiment, the plurality of electromagnetic wave detectors 121 are arranged along third direction 126 and fourth direction 127, and are disposed in a 2×2 array. The number of electromagnetic wave detectors 121 included in electromagnetic wave detector array 120 is not limited to four. For example, the number of electromagnetic wave detectors 121 included in electromagnetic wave detector array 120 is nine, and the plurality of electromagnetic wave detectors 121 may be disposed in a 3×3 array. The plurality of electromagnetic wave detectors 121 may be arranged periodically or aperiodically. The plurality of electromagnetic wave detectors 121 may be disposed on substrate 6.

Figure 33:
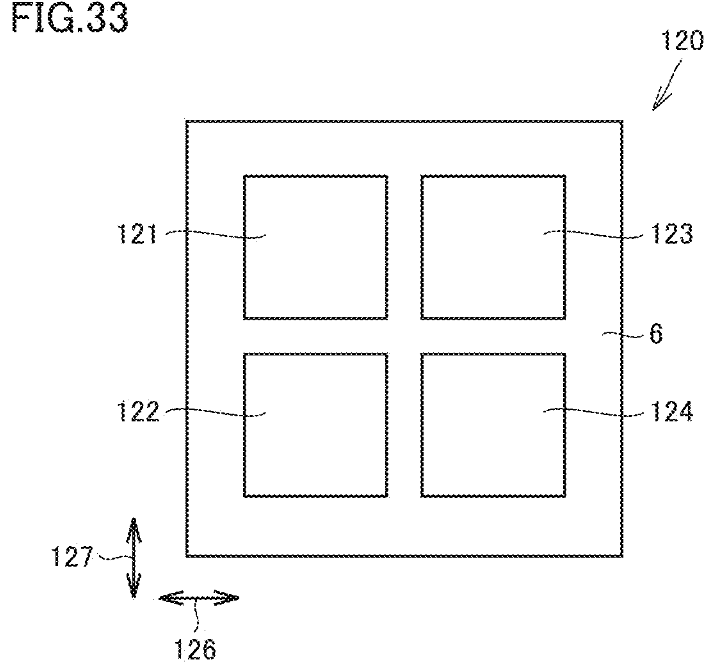
FIG. 33 is a schematic plan view showing an electromagnetic wave detector array according to a modification of the seventeenth embodiment.

Referring to FIG. 33, electromagnetic wave detector array 120 according to a modification of the present embodiment includes a plurality of electromagnetic wave detectors 121, 122, 123, and 124. The plurality of electromagnetic wave detectors 121, 122, 123, and 124 are any of electromagnetic wave detectors 100 to 118 of the first to sixteenth embodiments. The plurality of electromagnetic wave detectors 121, 122, 123, and 124 have configurations different from each other.

The plurality of electromagnetic wave detectors 121, 122, 123, and 124 may have, for example, detection wavelengths different from each other. For example, in a case where first ferroelectric layer 5 (see FIGS. 2 and 3) or first semiconductor layer 7*a* (see FIG. 8) and second semiconductor layer 7*b* (see FIG. 9) have sensitivity for an electromagnetic wave (that is, absorb an electromagnetic wave), the plurality of electromagnetic wave detectors 121, 122, 123, and 124 can have detection wavelengths different from each other, by making a difference in a material of first ferroelectric layer 5 or materials of first semiconductor layer 7*a* and second semiconductor layer 7*b* between the plurality of electromagnetic wave detectors 121, 122, 123, and 124.

Therefore, electromagnetic wave detector array 120 can detect a plurality of electromagnetic waves having mutually different wavelengths. Electromagnetic wave detector array 120 can detect electromagnetic waves in a wider wavelength range. Electromagnetic wave detector array 120 can identify a wavelength of an electromagnetic wave in any wavelength region such as ultraviolet light, infrared light, a terahertz wave, or a radio wave. For example, in a case where a detection wavelength of some of the plurality of electromagnetic wave detectors 121, 122, 123, and 124 is visible light and a detection wavelength of the rest of the plurality of electromagnetic wave detectors 121, 122, 123, and 124 is infrared light, electromagnetic wave detector 100 may be used as a visible light image camera during daytime, and may be used as an infrared image during nighttime.

The plurality of electromagnetic wave detectors 121, 122, 123, and 124 may have, for example, polarization sensitivities different from each other. For example, electromagnetic wave detector 121 may have sensitivity for an electromagnetic wave having a polarization angle of 0°, electromagnetic wave detector 122 may have sensitivity for an electromagnetic wave having a polarization angle of 45°, electromagnetic wave detector 123 may have sensitivity for an electromagnetic wave having a polarization angle of 90°, and electromagnetic wave detector 124 may have sensitivity for an electromagnetic wave having a polarization angle of 135°. For example, when two-dimensional material layers 1 of the plurality of electromagnetic wave detectors 121, 122, 123, and 124 have a structure in which graphene nanoribbons are periodically arranged, the plurality of electromagnetic wave detectors 121, 122, 123, and 124 may have different polarization sensitivities by changing an orientation of the periodic array of graphene nanoribbons between the plurality of electromagnetic wave detectors 121, 122, 123, and 124.

Figure 34:
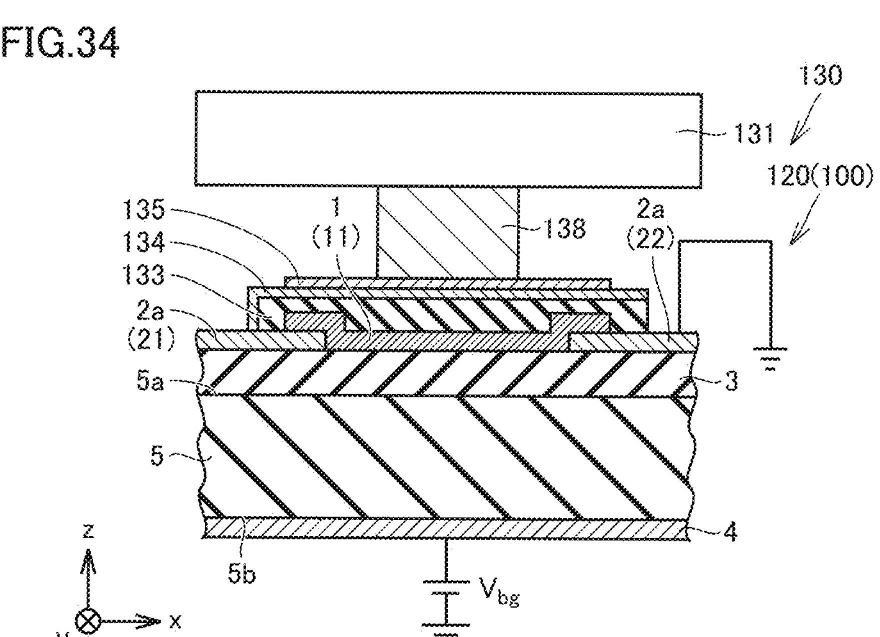
FIG. 34 is a schematic partially enlarged view of an image sensor according to the seventeenth embodiment.
Figure 35:
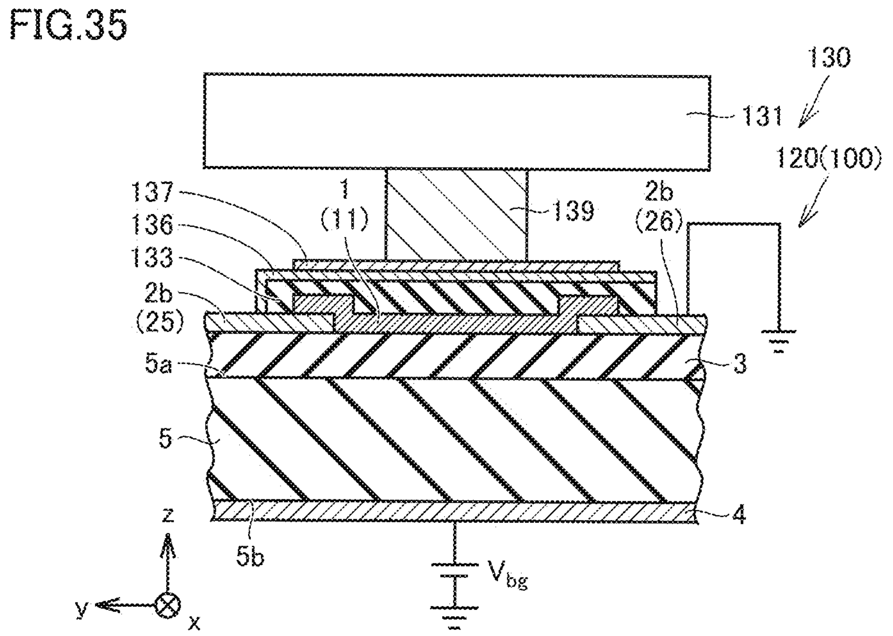
FIG. 35 is a schematic partially enlarged view of the image sensor according to the seventeenth embodiment.

Referring to FIGS. 34 and 35, electromagnetic wave detector array 120 of the present embodiment can be used as an image sensor 130.

For example, electromagnetic wave detector array 120 including a plurality of electromagnetic wave detectors 121, 122, 123, and 124 having mutually different detection wavelengths can be used as an image sensor capable of detecting a plurality of electromagnetic waves having mutually different wavelengths. This makes it possible to detect a plurality of electromagnetic waves having mutually different wavelengths, without using a color filter conventionally required for a complementary MOS (CMOS) sensor or the like. In addition, it is possible to obtain a colored image in which a difference in wavelength of the electromagnetic wave is indicated as a difference in color.

For example, electromagnetic wave detector array 120 including the plurality of electromagnetic wave detectors 121, 122, 123, and 124 having different polarization sensitivities can be used as a polarization identification image sensor. For example, by disposing a plurality of electromagnetic wave detector arrays 120 including: electromagnetic wave detector 121 having sensitivity for an electromagnetic wave having a polarization angle of 0°; electromagnetic wave detector 122 having sensitivity for an electromagnetic wave having a polarization angle of 90°; electromagnetic wave detector 123 having sensitivity for an electromagnetic wave having a polarization angle of 45°; and electromagnetic wave detector 124 having sensitivity for an electromagnetic wave having a polarization angle of 135°, the polarization identification imaging sensor may be configured. The polarization identification image sensor enables, for example, identification of an artifact and a natural object, identification of a material, identification of a plurality of objects having the same temperature in an infrared wavelength region, identification of a boundary between a plurality of objects, or improvement of equivalent resolution.

As shown in FIGS. 34 and 35, image sensor 130 may further include a readout circuit 131 in addition to electromagnetic wave detector array 120 of the present disclosure. Readout circuit 131 is electrically connected to electromagnetic wave detector array 120. Readout circuit 131 is of a capacitive transimpedance amplifier (CTIA) type or the like, but is not limited to this type and may be of any other type.

The electromagnetic wave detector (for example, electromagnetic wave detector 100) included in image sensor 130 further includes an insulating layer 133, extraction electrodes 134 and 136, and pads 135 and 137. Insulating layer 133 covers two-dimensional material layer 1, Extraction electrode 134 is electrically connected to first electrode 21, and is extracted onto insulating layer 133. Pad 135 is disposed on extraction electrode 134 and insulating layer 133. Extraction electrode 136 is electrically connected to third electrode 25, and is extracted onto insulating layer 133. Pad 137 is disposed on extraction electrode 136 and insulating layer 133. Two-dimensional material layer 1 is electrically insulated from extraction electrodes 134 and 136. A material constituting pads 135 and 137 is a conductive material such as aluminum silicon, nickel, or gold.

Pad 135 is electrically connected to readout circuit 131 via a bump 138. Pad 137 is electrically connected to readout circuit 131 via a bump 139. In other words, readout circuit 131 is so-called hybrid joined to an electromagnetic wave detector (for example, electromagnetic wave detector 100) included in image sensor 130. A material constituting bumps 138 and 139 is a conductive material such as indium.

Electromagnetic wave detector array 120 may be used as a sensor other than image sensor 130. Electromagnetic wave detector array 120 can be used as, for example, a position detection sensor that detects a position of an object.

In the first to seventeenth embodiments and modifications thereof, it is sufficient that any of first insulating film 3 (see FIGS. 1 to 3 and the like), first semiconductor layer 7*a* (see FIG. 8), second semiconductor layer 7*b* (see FIG. 9), first contact layer 9*a* (see FIGS. 19 and 20), and second contact layer 9*b* (see FIGS. 19 and 21A) is formed of a material whose characteristic is changed by being irradiated with an electromagnetic wave to cause a change in potential to two-dimensional material layer 1. Such a material is, for example, a quantum dot, a ferroelectric material, a liquid crystal material, fullerene, a rare earth oxide, a semiconductor material, a pn junction material, a metal-semiconductor junction material, or a metal-insulator-semiconductor junction material. For example, in a case where first contact layer 9*a* and second contact layer 9*b* are formed of a material whose characteristic is changed by being irradiated with an electromagnetic wave to cause a change in potential to two-dimensional material layer 1, first contact layer 9*a* and second contact layer 9*b* do not need to be in direct contact with two-dimensional material layer 1, and may be disposed above or below two-dimensional material layer 1 with first insulating film 3 or the like interposed therebetween, for example.

It should be understood that the first to seventeenth embodiments and modifications thereof disclosed herein are illustrative and non-restrictive in every respect. As long as there is no contradiction, at least two of the first to seventeenth embodiments and modifications thereof disclosed herein may be combined. The scope of the present disclosure is defined by the terms of the claims rather than the description above, and is intended to include any modifications within the scope and meaning equivalent to the terms of the claims.

REFERENCE SIGNS LIST

1; two-dimensional material layer, 2*a*: first electrode pair, 2*b*; second electrode pair, 3: first insulating film, 3*b*: second insulating film, 3*c*, 3*d*: gate insulating film, 4: back electrode, 5: first ferroelectric layer, 5*a*: first main surface, 5*b*: second main surface, 5*c*: second ferroelectric layer, 6: substrate, 6*a*, 6*b*: main surface, 7: semiconductor layer, 7*a*: first semiconductor layer, 7*b*: second semiconductor layer, 8: gap, 8*b*: hole, 8*c*: recess, 9*a*: first contact layer, 9*b*: second contact layer, 11: first elongated portion, 12: second elongated portion, 13: common portion, 21: first electrode, 22: second electrode, 25; third electrode, 26: fourth electrode, 28, 29: gate electrode, 30: first operation circuit, 31: first voltage source, 33: second operation circuit, 34: second voltage source, 35: operation circuit, 36: balance circuit, 40: signal detection circuit, 41: first signal detector, 42: second signal detector, 44: differentiator, 45: differential amplifier circuit, 46: operational amplifier, 47: power supply, 48: capacitor, 51: first ferroelectric layer portion, 52: second ferroelectric layer portion, 55: step, 60: electromagnetic wave shielding member, 100, 101, 102, 103*a*, 103*b*, 104, 105, 106, 107, 108, 108*b*, 109, 110, 111, 112*a*, 1126, 113, 114, 115, 116, 117, 118, 121, 122, 123, 124: electromagnetic wave detector, 120: electromagnetic wave detector array, 126: third direction, 127: fourth direction, 130: image sensor, 131: readout circuit, 133: insulating layer, 134, 136: extraction electrode, 135, 137: pad, 138, 139: bump.

The invention claimed is:

1. An electromagnetic wave detector comprising:

a first ferroelectric layer including a first main surface and having spontaneous polarization;

a two-dimensional material layer disposed on the first main surface of the first ferroelectric layer;

a first electrode pair including a first electrode and a second electrode; and a second electrode pair including a third electrode and a fourth electrode, wherein the first electrode pair is electrically connected to the two-dimensional material layer, the second electrode pair is electrically connected to the two-dimensional material layer, in a plan view of the first main surface, the third electrode and the fourth electrode are disposed to face each other in a first direction perpendicular to a first polarization direction of the spontaneous polarization of the first ferroelectric layer, and in the plan view of the first main surface, the first electrode and the second electrode are disposed to face each other in a second direction different from the first direction.

2. The electromagnetic wave detector according to claim 1, wherein the second direction is parallel to the first polarization direction in the plan view of the first main surface.

3. The electromagnetic wave detector according to claim 1, wherein the two-dimensional material layer includes a first elongated portion and a second elongated portion, a first longitudinal direction of the first elongated portion is different from a second longitudinal direction of the second elongated portion, and a part of the first elongated portion overlaps with a part of the second elongated portion in the plan view of the first main surface.

4. The electromagnetic wave detector according to claim 3, wherein, in the plan view of the first main surface, a shape of the first elongated portion between the first electrode and the second electrode is identical to a shape of the second elongated portion between the third electrode and the fourth electrode.

5. The electromagnetic wave detector according to claim 3, wherein the two-dimensional material layer is formed of a two-dimensional material layer of a single monolayer, in the plan view of the first main surface, the first elongated portion has a shape tapered toward a common portion of the first elongated portion and the second elongated portion, and in the plan view of the first main surface, the second elongated portion has a shape tapered toward the common portion.

6. The electromagnetic wave detector according to claim 3, wherein the first elongated portion and the second elongated portion are stacked on each other, and the second elongated portion is disposed on a side opposite to the first ferroelectric layer with respect to the first elongated portion.

7. The electromagnetic wave detector according to claim 6, further comprising a second insulating film disposed between the first elongated portion and the second elongated portion.

8. The electromagnetic wave detector according to claim 3 further comprising:

a first contact layer in contact with the first elongated portion; and a second contact layer in contact with the second elongated portion, wherein the first contact layer is disposed in a portion of the first elongated portion, the portion being proximal to the second electrode, and the second contact layer is disposed in a portion of the second elongated portion, the portion being proximal to the fourth electrode.

9. The electromagnetic wave detector according to claim 3, further comprising an electromagnetic wave shielding member, wherein in the plan view of the first main surface, the electromagnetic wave shielding member covers only one side of the first ferroelectric layer with respect to a center of the first ferroelectric layer in the first polarization direction of the spontaneous polarization of the first ferroelectric layer.

10. The electromagnetic wave detector according to claim 3, further comprising a second ferroelectric layer having spontaneous polarization, wherein the second ferroelectric layer is formed on the second elongated portion, and a second polarization direction of the spontaneous polarization of the second ferroelectric layer is parallel to the first direction.

11. The electromagnetic wave detector according to claim 1, wherein the two-dimensional material layer is formed of a two-dimensional material layer of a single monolayer.

12. The electromagnetic wave detector according to claim 1, wherein the first ferroelectric layer is a ferroelectric thin film having a thickness of less than or equal to 10 μm.

13. The electromagnetic wave detector according to claim 1, further comprising a back electrode, wherein the first ferroelectric layer includes a second main surface opposite to the first main surface, and the back electrode is formed on the second main surface.

14. The electromagnetic wave detector according to claim 1, further comprising a first insulating film, wherein the first insulating film is formed on the first main surface of the first ferroelectric layer, and is disposed between the first ferroelectric layer and the two-dimensional material layer.

15. The electromagnetic wave detector according to claim 14, wherein a gap is provided between the first insulating film and the two-dimensional material layer.

16. The electromagnetic wave detector according to claim 1, wherein a gap is provided between the first ferroelectric layer and the two-dimensional material layer.

17. The electromagnetic wave detector according to claim 1, wherein the fourth electrode and the second electrode are formed as a common electrode.

18. The electromagnetic wave detector according to claim 1, further comprising a substrate, wherein the first ferroelectric layer includes a second main surface opposite to the first main surface, the first ferroelectric layer is formed on the substrate, and the second main surface of the first ferroelectric layer faces the substrate.

19. The electromagnetic wave detector according to claim 18, wherein a hole is provided in the substrate, and at least a part of the second main surface of the first ferroelectric layer is exposed to an ambient atmosphere of the electromagnetic wave detector in the hole.

20. The electromagnetic wave detector according to claim 1, further comprising at least one of a first semiconductor layer or a second semiconductor layer, wherein the first semiconductor layer is disposed between the two-dimensional material layer and the second electrode, and the second semiconductor layer is disposed between the two-dimensional material layer and the fourth electrode.

21. The electromagnetic wave detector according to claim 1, wherein the first ferroelectric layer includes a second main surface opposite to the first main surface, a recess is provided in the second main surface of the first ferroelectric layer, and at least a part of the second main surface of the first ferroelectric layer is exposed to an ambient atmosphere of the electromagnetic wave detector in the recess.

22. The electromagnetic wave detector according to claim 1, wherein a thickness of the first ferroelectric layer varies between the first electrode and the second electrode.

23. The electromagnetic wave detector according to claim 1, wherein the first ferroelectric layer includes a first ferroelectric layer portion and a second ferroelectric layer portion, the first ferroelectric layer portion and the second ferroelectric layer portion are arranged in the second direction in which the first electrode and the second electrode face each other, and a dielectric constant of the first ferroelectric layer portion is different from a dielectric constant of the second ferroelectric layer portion.

24. The electromagnetic wave detector according to claim 1, wherein the first ferroelectric layer includes a first ferroelectric layer portion and a second ferroelectric layer portion, the first ferroelectric layer portion and the second ferroelectric layer portion are arranged in the second direction in which the first electrode and the second electrode face each other, and an absorption wavelength range of the first ferroelectric layer portion is different from an absorption wavelength range of the second ferroelectric layer portion.

25. The electromagnetic wave detector according to claim 1, wherein the first electrode is formed of a metallic material different from a metallic material of the second electrode, and the third electrode is formed of a metallic material different from a metallic material of the fourth electrode.

26. The electromagnetic wave detector according to claim 1, further comprising:

a gate insulating film disposed on the two-dimensional material layer; and a gate electrode formed on the gate insulating film.

27. The electromagnetic wave detector according to claim 1, wherein the two-dimensional material layer is formed of any material selected from a group consisting of graphene, multilayer graphene, turbostratic multilayer graphene, transition metal dichalcogenide, black phosphorus, silicene, graphene nanoribbon, and borophene.

28. The electromagnetic wave detector according to claim 1, further comprising a signal detection circuit including a first signal detector, a second signal detector, and a differentiator, wherein the first signal detector is connected to the first electrode pair, and detects a first electric signal output from the first electrode pair, the second signal detector is connected to the second electrode pair, and detects a second electric signal output from the second electrode pair, and the differentiator is connected to the first signal detector and the second signal detector, and outputs a differential signal between the first electric signal and the second electric signal.

29. The electromagnetic wave detector according to claim 28, further comprising at least one of an operation circuit or a balance circuit, wherein the operation circuit includes a first operation circuit connected to the first electrode pair and a second operation circuit connected to the second electrode pair, the balance circuit is connected to the first electrode pair and the second electrode pair, and the at least one of the operation circuit or the balance circuit is adjusted such that an electric resistance value of the two-dimensional material layer between the first electrode and the second electrode and an electric resistance value of the two-dimensional material layer between the third electrode and the fourth electrode are equal to each other when the electromagnetic wave detector is not irradiated with an electromagnetic wave.

30. The electromagnetic wave detector according to claim 29, wherein the balance circuit includes a plurality of electrical resistance elements, and the balance circuit, the two-dimensional material layer between the first electrode and the second electrode, and the two-dimensional material layer between the third electrode and the fourth electrode form a bridge circuit.

31. The electromagnetic wave detector according to claim 1, further comprising a signal detection circuit, wherein the signal detection circuit includes a differential amplifier circuit connected to the first electrode pair and the second electrode pair.

32. An electromagnetic wave detector array comprising a plurality of the electromagnetic wave detectors according to claim 1, wherein the plurality of electromagnetic wave detectors are arranged along at least any of a third direction or a fourth direction different from the third direction.

33. An image sensor comprising:

the electromagnetic wave detector array according to claim 32; and a readout circuit that is hybrid-joined to the electromagnetic wave detector array.

* * * * *